United States Patent
Tanaka et al.

(10) Patent No.: US 6,667,135 B2
(45) Date of Patent: Dec. 23, 2003

(54) METHOD OF MANUFACTURING A PHOTOMASK

(75) Inventors: Toshihiko Tanaka, Tokyo (JP); Norio Hasegawa, Hinode (JP); Tsuneo Terasawa, Ome (JP)

(73) Assignee: Renesas Technology Corporation, Tokyo (JP)

( * ) Notice: Subject to any disclaimer, the term of this patent is extended or adjusted under 35 U.S.C. 154(b) by 158 days.

(21) Appl. No.: 09/953,962

(22) Filed: Sep. 18, 2001

(65) Prior Publication Data

US 2002/0022185 A1 Feb. 21, 2002

Related U.S. Application Data

(63) Continuation of application No. 09/924,769, filed on Aug. 9, 2001.

(30) Foreign Application Priority Data

Aug. 15, 2000 (JP) ...................................... 2000-246506

(51) Int. Cl.$^7$ ................................................. G03F 9/00
(52) U.S. Cl. .......................................................... 430/5
(58) Field of Search ............................... 430/5, 322, 324, 430/323; 428/433

(56) References Cited

U.S. PATENT DOCUMENTS

| | | | | |
|---|---|---|---|---|
| 5,824,439 A | * | 10/1998 | Lee | 430/5 |
| 6,013,399 A | * | 1/2000 | Nguyen | 430/5 |
| 6,280,821 B1 | * | 8/2001 | Kadunce et al. | 428/157 |
| 2002/0076660 A1 | * | 6/2002 | Toyota et al. | 430/330 |

* cited by examiner

Primary Examiner—S. Rosasco

(57) ABSTRACT

After a shade pattern constituted by a resist film formed on a photomask is stripped, a new shade pattern constituted by a resist film is formed on the photomask to reclaim a photomask.

8 Claims, 38 Drawing Sheets

1: mask blanks
3a: shade pattern
4a: shade pattern
M1a: photo mask

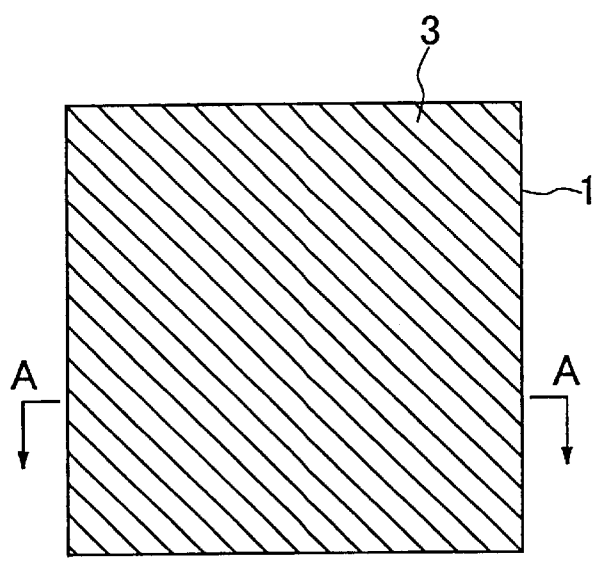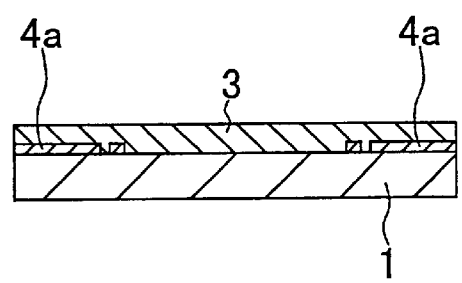

METHOD OF MANUFACTURING A PHOTOMASK

This application is a Continuation of nonprovisional application Ser. No. 09/924,769 filed Aug. 9, 2001.

FIELD OF THE INVENTION

The present invention relates to a method of manufacturing a photomask, a method of manufacturing photomask blanks, and a technique for reclaiming a photomask and, more particularly, to a technique which is effectively applied to a photolithography technique used in manufacturing a semiconductor device, a super conductive device, a micro machine, an electronic device, and the like.

BACKGROUND OF THE INVENTION

For example, in manufacturing a semiconductor device, as a method of transferring a micropattern onto a semiconductor wafer, a photolithography technique is used. In the photolithography technique, a projection aligner is popularly used. A pattern of a photomask (to be referred to as a mask hereinafter) set in the projection aligner is transferred onto a semiconductor wafer (to be referred to as a wafer hereinafter) to form a device pattern.

A normal mask used in the photolithography technique is produced by processing a shade material such as chromium (Cr) formed on a transparent quartz substrate. More specifically, the normal mask is constituted such that a shade film made of chromium or the like is formed on a quartz substrate to have a desired shape.

SUMMARY OF THE INVENTION

In recent years, competition in development for semiconductor devices advances, and a large number of masks are required to accelerate a device debug operation. The necessity of producing masks at a low cost becomes high. Although a very high cost is required for pattern delineation, defect inspection for patterns, and the like in manufacturing masks, a cost which is not negligible is required for mask blanks (to be referred to as blanks hereinafter). For example, in an i-line having a wavelength of 365 nm, the cost of delineation or defect inspection is low because an object pattern size is large. In this case, the cost of blanks accounts for about 20% of the total cost of producing the mask. In a mask for a KrF excimer laser having a wavelength of 248 nm, since the degree of flatness of a quartz glass (transparent quartz substrate) influences pattern delineation accuracy, the degrees of flatness are classified into grades. In high-quality blanks, the degree of flatness at a submicron level is required. Since the degree of flatness is obtained by polishing, the yield of blanks having a high degree of flatness is small because a selection method is used. For this reason, the cost of blanks having a high degree of flatness is high. In a mask for an ArF excimer laser having a wavelength of 193 nm or a mask for an $F_2$ excimer laser having a wavelength of 157 nm, the costs of the blanks increase because manufacturing methods are different from each other from viewpoints of prevention of a color center or a reduction in defect density. For this reason, in manufacturing masks, the cost of blanks cannot be neglected, and the cost must be reduced.

Therefore, masks may be reclaimed to reduce the cost of blanks. More specifically, a wasted mask or a mask which does not pass inspection after a shade pattern made of chromium or the like is formed are subjected to a reclaiming process. A mask reclaiming process examined by the present inventors is as follows, for example. That is, a shade pattern on a major surface of mask blanks made of quartz glass or the like is removed by wet etching or the like. In this case, a slight step is formed on the major surface (surface on which the shade pattern is formed) of the mask blanks. Glass polishing is performed to remove this step. This polishing grinds the step on the major surface to form a surface having a high degree of flatness. Thereafter, particles generated in this step are removed by cleaning, and particle check is performed to reclaim blanks.

However, in the above mask technique, the present inventors found the following problems.

More specifically, when a normal mask is to be reclaimed, the following problems are posed. That is, (1) the polishing step at a high cost is required, (2) the number of times of reclamation is limited because the mask blanks is thinned by polishing as reclamation is repeated (i.e., blanks are thinned), and (3) the degree of flatness is measured again, and the mask is classified by levels because the degree of flatness of the mask blanks is changed by the polishing step. The reclamation of masks does not remarkably advantageous with respect to quality and cost.

The present inventors performed a technical examination from a viewpoint of a mask on the basis of the result of the invention. As a result, as another engagement to reduce the cost of a mask, for example, a so-called resist mask method for forming a shade film by a resist film is disclosed in Japanese Patent Laid-Open Publication No. 5-2189307.

It is an object of the present invention to provide a technique which can reclaim a mask.

It is another object of the present invention to provide a technique which can reclaim a mask while keeping the quality of the mask.

The above objects, other objects, and novel characteristic features of the present invention will be apparent from the description and accompanying drawings of this specification.

The outline of a typical one of the inventions disclosed in this application will be simply described below.

More specifically, according to one aspect of the present invention, a shade pattern constituted by a resist film formed on a mask is stripped, and a new shade pattern constituted by a resist film is formed on the mask to reclaim a mask.

According to another aspect of the present invention, a shade pattern constituted by a resist film formed in an integrated circuit pattern region of a mask on which a shade pattern made of a metal is formed in a peripheral region is strip, and a new shade pattern constituted by a resist film is formed again in the integrated circuit pattern region of the mask on which the shade pattern made of a metal is formed in the peripheral region to reclaim a mask.

According to still another aspect of the present invention, a shade pattern constituted by a resist film and formed in a peripheral circuit pattern region of a mask having a shade pattern formed in an integrated circuit pattern and made of a metal and a shade pattern formed in a peripheral region and made of a metal is stripped, and a new shade pattern constituted by a resist film is formed again in the integrated circuit pattern region of the mask having the shade pattern formed in the integrated circuit pattern region and made of the metal and the shade pattern formed in the peripheral region and made of the metal to reclaim a mask.

According to still another aspect of the present invention, the step of forming a shade pattern constituted by a resist film on a mask and the step of stripping the shade pattern constituted by the resist film are repeated.

Still other aspects of the present invention are as follows:

(1). A method of photomask blanks comprising the steps of:
  (a) patterning and forming a first shade portion constituted by a resist film on a mask substrate to manufacture a photomask;
  (b) performing an exposure process by using the photomask to transfer a desired pattern onto a substrate to be processed; and
  (c) stripping the first shade portion constituted by the resist film on the photomask to reclaim photomask blanks constituted by the mask substrate.

(2). A method of manufacturing photomask blanks according to the above (1), further comprising the step of:
  forming a mask information pattern on the mask substrate.

(3). A method of manufacturing photomask blanks according to the above (2), wherein
  the mask information pattern is formed by one or both of a trench formed in the mask substrate and a shade pattern made of a metal formed on the mask substrate.

(4). A method of manufacturing a photomask comprising the steps of:
  (a) preparing a mask substrate having a shade portion made of a metal in a peripheral region around an integrating circuit pattern region;
  (b) patterning and forming a first shade portion constituted by a resist film in the integrating circuit pattern region to manufacture a photomask on a mask substrate having the shade portion made of the metal;
  (c) performing an exposure process by using the photomask to transfer a desired pattern onto a substrate to be processed; and
  (d) stripping the first shade portion constituted by the resist film on the photomask to remanufacture photomask blanks constituted by the mask substrate having the metal shade portion.

(5). A method of manufacturing photomask blanks according to the above (4), wherein
  in the previous step of stripping the first shade portion constituted by the resist film, a protective film is formed on the shade portion made of the metal.

(6). A method of manufacturing photomask blanks according to the above (4) or (5), wherein
  the shade film made of the metal comprises a refractory metal, a nitride of a refractory metal, a silicide of a refractory metal, or a laminate film comprising thereof.

(7). A method of manufacturing photomask blanks according to the above (4), (5), or (6), further comprising the step of:
  forming a mask information pattern on the mask substrate.

(8). A method of manufacturing photomask blanks according to the above (7), wherein
  the mask information pattern is formed by one or both of a trench formed in the mask substrate and a light-transmitting pattern formed by partially removing the second shade portion made of the metal.

(9). A method of reclaiming a photomask comprising the steps of:
  (a) patterning and forming a first shade portion constituted by a resist film on a mask substrate to manufacture a photomask;
  (b) performing an exposure process by using the photomask to transfer a desired pattern onto a substrate to be processed;
  (c) stripping the first shade portion constituted by the resist film; and
  (d) patterning and forming a second shade portion constituted by a resist film on the mask substrate from which the first shade portion constituted by the resist film is stripped to reclaim the photomask.

(10). A method of reclaiming a photomask comprising the steps of:
  (a) preparing a mask substrate having a shade portion made of a metal in a peripheral region around an integrating circuit pattern region;
  (b) patterning and forming a first shade portion constituted by a resist film in the integrating circuit pattern region to manufacture a photomask on a mask substrate having the shade portion made of the metal;
  (c) performing an exposure process by using the photomask to transfer a desired pattern onto a substrate to be processed;
  (d) stripping the first shade portion constituted by the resist film on the photomask to remanufacture a mask substrate having the metal shade portion; and
  (e) patterning and forming a second shade portion constituted by a resist film in the integrated circuit pattern on the mask substrate having the shade portion made of the metal to reclaim a photomask.

(11). A method of reclaiming a photomask comprising the steps of:
  (a) preparing a mask substrate having a first shade portion made of a metal formed in an integrated circuit pattern and a second shade portion made of a metal formed in a peripheral region around the integrating circuit pattern region;
  (b) patterning and forming a first shade portion constituted by a resist film in the integrating circuit pattern region to manufacture a photomask on a mask substrate having the first and second shade portions made of the metals;
  (c) performing an exposure process by using the photomask to transfer a desired pattern onto a substrate to be processed;
  (d) stripping the first shade portion constituted by the resist film on the photomask to remanufacture a mask substrate having the first and second metal shade portions; and
  (e) patterning and forming a second shade portion constituted by a resist film in the integrated circuit pattern on the mask substrate having the shade portion made of the metal to reclaim a photomask.

(12). A method of reclaiming a photomask according to the above (10) or (11), wherein
  in the previous step of stripping the first shade portion constituted by the resist film, a protective film is formed on the shade portion made of the metal.

(13). A method of reclaiming photomask blanks according to the above (10) or (11), wherein
  the shade portion made of the metal comprises a refractory metal, a nitride of a refractory metal, a silicide of a refractory metal, or a laminate film comprising thereof.

(14). A method of reclaiming a photomask according to any one of the above (9) to (13), further comprising the step of:
  forming a mask information pattern on the mask substrate.

(15). A method of reclaiming a photomask comprising the steps of:
  (a) causing a mask user which uses a photomask to place an order with a blanks supplier for supplying photomask blanks for photomask blanks;
  (b) causing the mask user to manufacture a photomask having a shade pattern constituted by a resist film in an integrated circuit pattern region by the delivered photomask blanks;
  (c) causing the mask user to perform an exposure process by using the photomask; and
  (d) causing the mask user to strip the shade pattern constituted by the resist film from the photomask subjected to the exposure process and to sell the photomask blanks from which the resist is stripped to the blanks supplier so as to reclaim the photomask blanks as photomask blanks which can be used again.

(16). A method of reclaiming a photomask comprising the steps of:
  (a) causing a mask user which uses a photomask to place an order with a blanks supplier for supplying photomask blanks for photomask blanks;
  (b) causing the mask user to manufacture a photomask having a shade pattern constituted by a resist film in an integrated circuit pattern region by the delivered photomask blanks;
  (c) causing the mask user to perform an exposure process by using the photomask; and
  (d) causing the mask user to sell the photomask subjected to the exposure process to the blanks supplier so as to reclaim the photomask as a photomask which can be used again.

(17). A method of reclaiming a photomask comprising the steps of:
  (a) causing a photomask maker to place an order with a blanks supplier for supplying photomask blanks for photomask blanks;
  (b) causing the photomask maker to manufacture a photomask having a shade pattern constituted by a resist film in an integrated circuit pattern region by the delivered photomask blanks;
  (c) causing the photomask maker to sell the photomask to a device maker for manufacturing a predetermined device;
  (d) causing a photomask maker to receive a photomask subjected to an exposure process from the device maker; and
  (e) causing a photomask maker to strip the shade pattern constituted by the resist film of the photomask subjected to the exposure process and received from the device maker and to sell the photomask blanks obtained in this manner to the blanks supplier so as to reclaim the photomask blanks as photomask blanks which can be used again.

(18). A method of reclaiming a photomask comprising the steps of:
  (a) causing a photomask maker to place an order with a blanks supplier for supplying photomask blanks for photomask blanks;
  (b) causing the photomask maker to manufacture a photomask having a shade pattern constituted by a resist film in an integrated circuit pattern region by the delivered photomask blanks;
  (c) causing the photomask maker to sell the photomask to a device maker for manufacturing a predetermined device;
  (d) causing a photomask maker to receive a photomask subjected to an exposure process from the device maker; and
  (e) causing a photomask maker to sell the photomask subjected to the exposure process and received by the device maker so as to reclaim the photomask as a photomask which can be used again.

(19). A method of reclaiming a photomask comprising the steps of:
  (a) causing a blanks supplier for supplying photomask blanks to sell photomask blanks for manufacturing a photomask having a shade pattern constituted by a resist film to a photomask user which uses a photomask; and
  (b) causing the blanks supplier to recover the photomask subjected to an exposure process from the photomask user, to strip the shade pattern constituted by the resist film, and to reclaim the photomask blanks.

(20). A method of reclaiming a photomask comprising the steps of:
  (a) causing a blanks supplier for supplying photomask blanks to sell photomask blanks for manufacturing a photomask having a shade pattern constituted by a resist film to a photomask maker which manufactures a photomask; and
  (b) causing the blanks supplier to recover the photomask subjected to an exposure process from a photomask user, to strip the shade pattern constituted by the resist film, and to reclaim the photomask blanks.

(21). A method of reclaiming a photomask comprising the steps of:
  (a) causing a blanks supplier for supplying photomask blanks to sell photomask blanks for manufacturing a photomask having a shade pattern constituted by a resist film to a photomask maker which manufactures a photomask; and
  (b) causing the blanks supplier to recover the photomask from which the shade pattern constituted by the resist film is stripped from a photomask user and to perform cleaning for removing a particle and a process of checking a particle and a scratch to reclaim the photomask blanks.

(22). A method of reclaiming a photomask comprising the steps of:
  (a) causing a blanks supplier for supplying photomask blanks to sell photomask blanks for manufacturing a photomask having a shade pattern constituted by a resist film to a photomask maker which manufactures a photomask; and
  (b) causing the blanks supplier to recover the photomask subjected to an exposure process from the photomask maker, to strip the shade pattern constituted by the resist film, and to reclaim the photomask blanks.

(23). A method of reclaiming a photomask according to any one of the above (19) to (22), wherein the blanks supplier manages the quality of the photomask blanks on the basis of a blanks information pattern formed in the photomask blanks.

(24). A method of reclaiming a photomask according to the above (19), wherein the blanks supplier changes the transaction price of photomask blanks recovered from the mask user by the blanks supplier according to the number of photomask blanks shipped to the mask user.

(25). A method of reclaiming a photomask according to the above (19), wherein
the blanks supplier changes the price of photomask blanks according to a ratio of the number of photomask blanks recovered from the mask user by the blanks supplier to the number of photomask blanks shipped to the mask user.

(26). A method of reclaiming a photomask according to the above (22), wherein
the blanks supplier changes the transaction price of photomask blanks recovered from the mask maker by the blanks supplier according to the number of photomask blanks shipped to the mask maker.

(27). A method of reclaiming a photomask according to the above (22), wherein
the blanks supplier changes the price of photomask blanks according to a ratio of the number of photomask blanks recovered from the mask maker by the blanks supplier to the number of photomask blanks shipped to the mask maker.

(28). A method of reclaiming a photomask according to any one of the above (19) to (27), wherein
the price of photomask blanks recovered or shipped by the blanks supplier is changed according to a quality level described in the photomask blanks.

BRIEF DESCRIPTIONS OF THE DRAWINGS

FIG. 5B is a sectional view along an A—A line in FIG. 5a.

FIG. 11A is a plan view in a step in manufacturing a photomask in FIG. 1A subsequent to the step in FIG. 8A, and FIG. 1B is a sectional view along an A—A line in FIG. 11A.

DESCRIPTION OF THE PREFERRED EMBODIMENTS

Figure 1A:
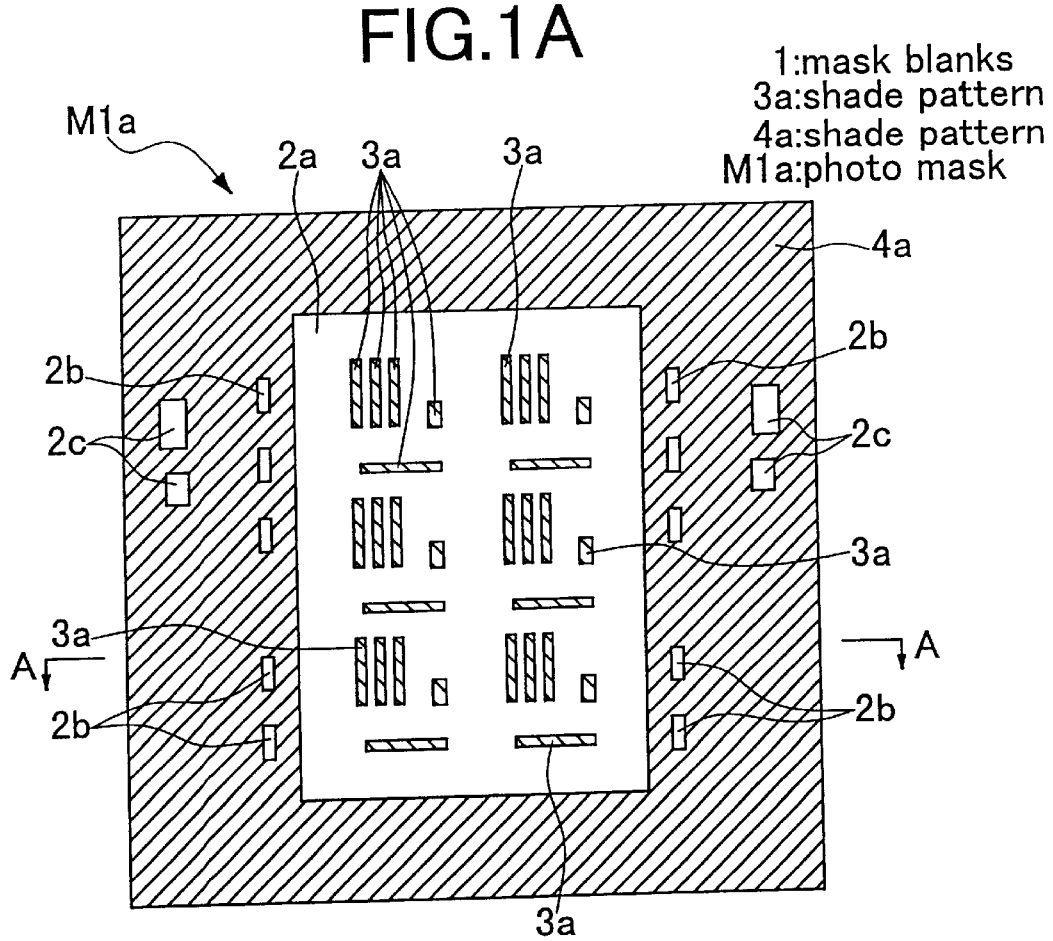
FIG. 1A is a plan view of a photomask according to an embodiment of the present invention.

Before the present invention is described in detail, the meanings of terms will be described below.

1. A mask (optical mask): is obtained by forming a pattern for shielding light or a pattern for changing a phase of light on mask blanks. The mask also includes a reticle on which a pattern having a size which is several times as large as an actual size is formed. The first major surface of the mask is a pattern surface on which the pattern for shielding light or the pattern for changing the phase of light is formed, and the second major surface is a surface opposite to the first major surface.

2. Pattern surfaces of a mask are classified into the following regions. A region "integrated circuit pattern region" in which an integrated circuit pattern to be transferred is arranged, and a region "peripheral region" around the "integrated circuit pattern region".

3. Although it is not especially limited, in this specification, for the sake of convenience, masks are classified into the following three masks from the viewpoint of the manufacturing steps of the masks. That is, the three masks includes mask blanks (to be referred to as blanks hereinafter), a metal mask, and a resist mask. The blanks indicate a mask at the initial stage at which a mask is not completed as a mask on which a desired pattern is to be transferred, and represents a mask on which a pattern is not formed in the integrated circuit pattern region and which has a basic configuration required for manufacturing a mask and high affinity (compatibility). The metal mask indicates a mask which is not completed as a mask and which is at a stage at which a pattern made of a metal is formed in the integrated circuit pattern region. The resist mask indicates a mask which is completed as a mask and which is at a stage at which a pattern constituted by a resist film is formed in the integrated circuit pattern region. On the mask, all patterns for transferring desired patterns may be constituted by resist films, or some patterns may be constituted by metals and resist films.

4. A normal mask (binary mask): indicates a general mask obtained by forming a shade pattern made of a metal, a transparent pattern, and a mask pattern on a mask substrate. Unlike the metal mask, the binary mask is completed as a mask on which a desired pattern can be transferred onto a substrate to be processed.

5. A wafer indicates a silicon monocrystalline substrate (generally having an almost flat disk-like shape), a sapphire substrate, a glass substrate, an insulation, semi insulation, or semiconductor substrate, and a composite substrate thereof. In addition, in a semiconductor integrated circuit device in this application, like a silicon wafer or a sapphire substrate, a wafer is formed on not only a semiconductor or insulating substrate. Unless there is a special notice that the following is refused, wafers include a wafer formed on another insulating substrate such as glass as in a TFT (Thin-Film-Transistor), an STN (Super-Twisted-Nematic) liquid crystal, and the like.

6. A device surface indicates a major surface of a wafer, and indicates a surface on which a device pattern corresponding to a plurality of chip regions is formed by photolithography.

7. When a "shade region", a "shade film", and a "shade pattern" are mentioned, a shade region, a shade film, and a shade pattern each have optical characteristics that not higher then 40% of exposure light irradiated on the region are transmitted. In general, a region, a film, or a pattern each having optical characteristics that several % to not higher than 30% is used. On the other hand, when "transparent", a "transparent film", a "light-transmitting region", and a "light-transmitting pattern" are mentioned, transparent, a transparent film, a light-transmitting region, and a light-transmitting pattern each have optical characteristics that 60% or more of exposure light irradiated on the region are transmitted. In general, a film, a region, or a pattern each having optical characteristics that 90% or more of exposure light irradiated on the region is transmitted is used.

8. A hole pattern: indicates a micropattern such as a contact hole or a through hole having a two-dimensional size which is almost equal to or larger than an exposure wavelength on a wafer. In general, on a mask, a hole pattern has a square shape, a rectangular shape which is similar to a square shape, or an octagonal shape. However, on a wafer, a circular hole pattern is often used.

9. A line pattern: indicates a belt-like pattern which forms wires or the like on a wafer.

If necessary for the sake of convenience, the following embodiments will be described such that the embodiments are divided into a plurality of sections or embodiments. Unless there is a special notice, these sections and embodiments are not unrelated to each other and have the following relationship. That is, one embodiment constitutes a modification, details, supplement, or the like of a part or whole of the other embodiment.

In the following embodiments, when the number of elements and the like (including the number of elements, numeral values, quantities, ranges, and the like) are mentioned, unless there is a special notice, or unless the numbers are apparently limited to specific numbers, the numbers are not limited to specific numbers, and the numbers may be equal to or larger than the specific numbers.

In addition, in the following embodiments, the constituent elements (including element steps and the like) are not necessary as a matter of course unless there is a special notice and unless it is considered that constituent elements are apparently necessary.

Similarly, in the following embodiments, when the shapes, positional relationship, and the like of constituent elements and the like are mentioned, unless there is a special notice and unless it is considered that the following description is apparently wrong in principle, the shapes of the constituent elements substantially include shapes which are approximate to or similar to the shapes of the constituent elements. This condition is also satisfied with respect to the numeral values and ranges.

In all the drawings for explaining the embodiments, the same reference numerals denote parts having the same functions, and repetitive descriptions will be omitted.

In the drawings used in the embodiments, in order to make it easy to see the drawings, although the drawings are plan views, a shade portion (a shade film, a shade pattern, a shade region, or the like) and a resist film are hatched.

In the embodiments, a MIS-FET (Metal Insulator Semiconductor Field Effect Transistor) representing a field effect transistor is abbreviated as a MIS, a p-channel type MIS-FET is abbreviated as a pMIS, and an n-channel type MIS-FET is abbreviated as an nMIS.

Embodiments of the present invention will be described below with reference to the accompanying drawings.

First Embodiment

Figure 1B:
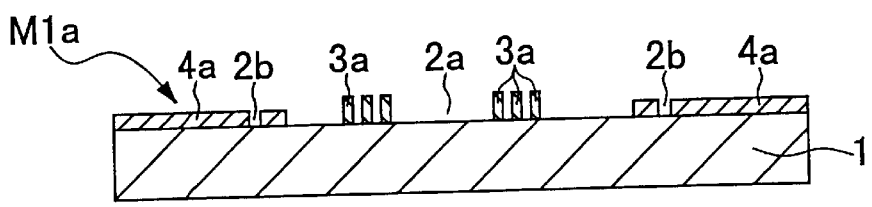
FIG. 1B is a sectional view along an A—A line in FIG. 1A.
Figure 1C:
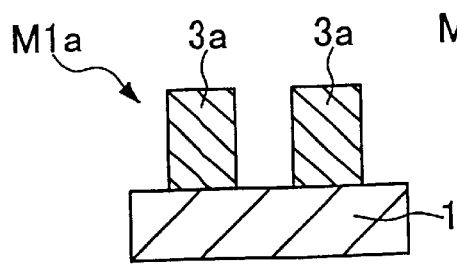
FIG. 1C is an enlarged sectional view of a main part of FIG. 1B.
Figure 1D:
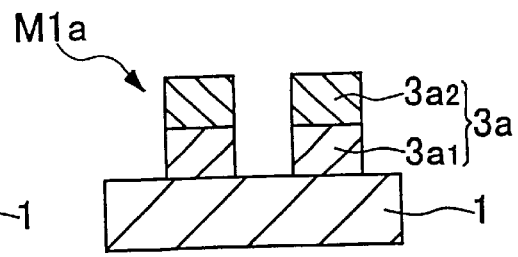
FIG. 1D is an enlarged sectional view of a main part of FIG. 1B.
Figure 2A:
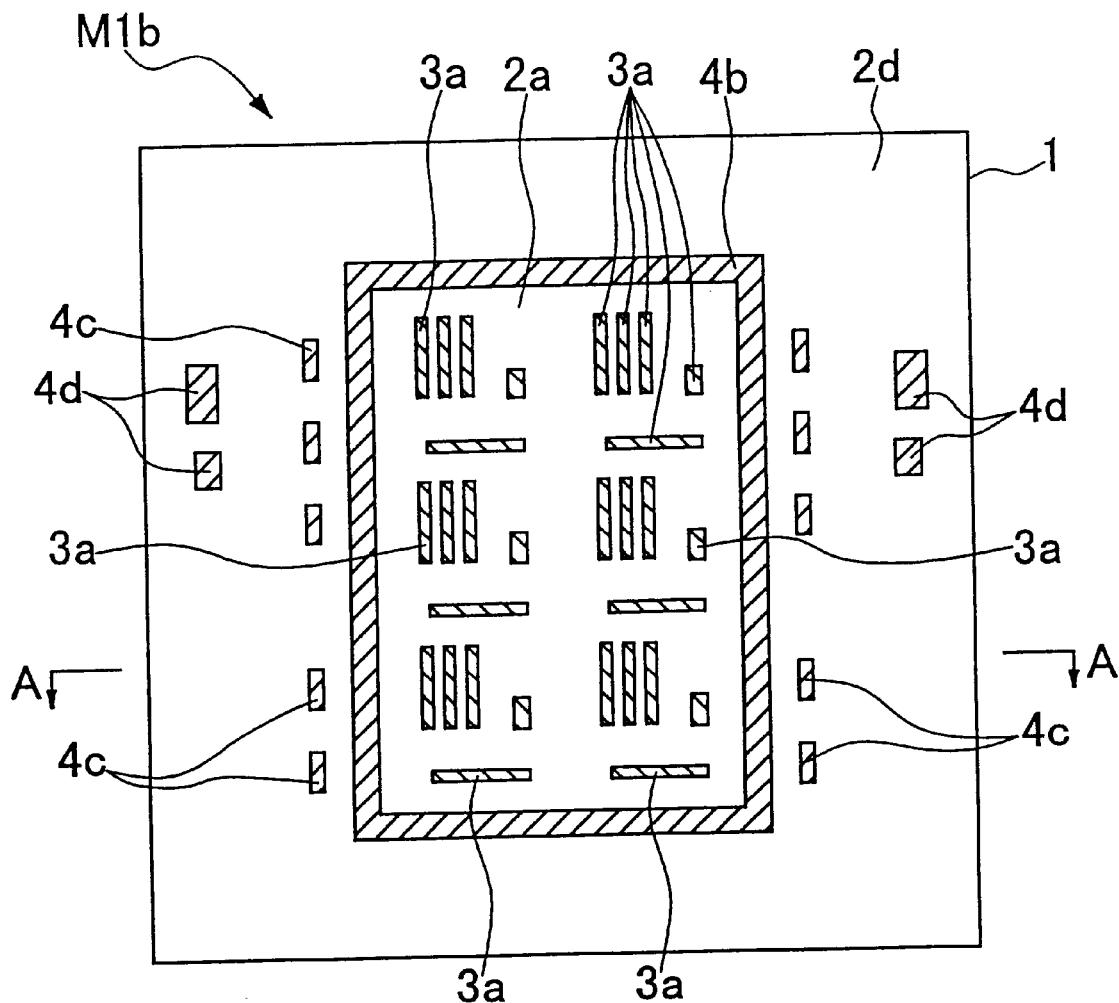
FIG. 2A is a plan view of a photomask according to an embodiment of the present invention.
Figure 2B:
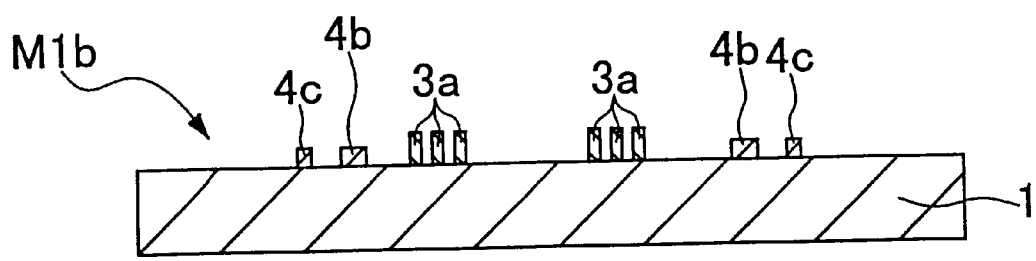
FIG. 2B is a sectional view along an A—A line in FIG. 2A.
Figure 3A:
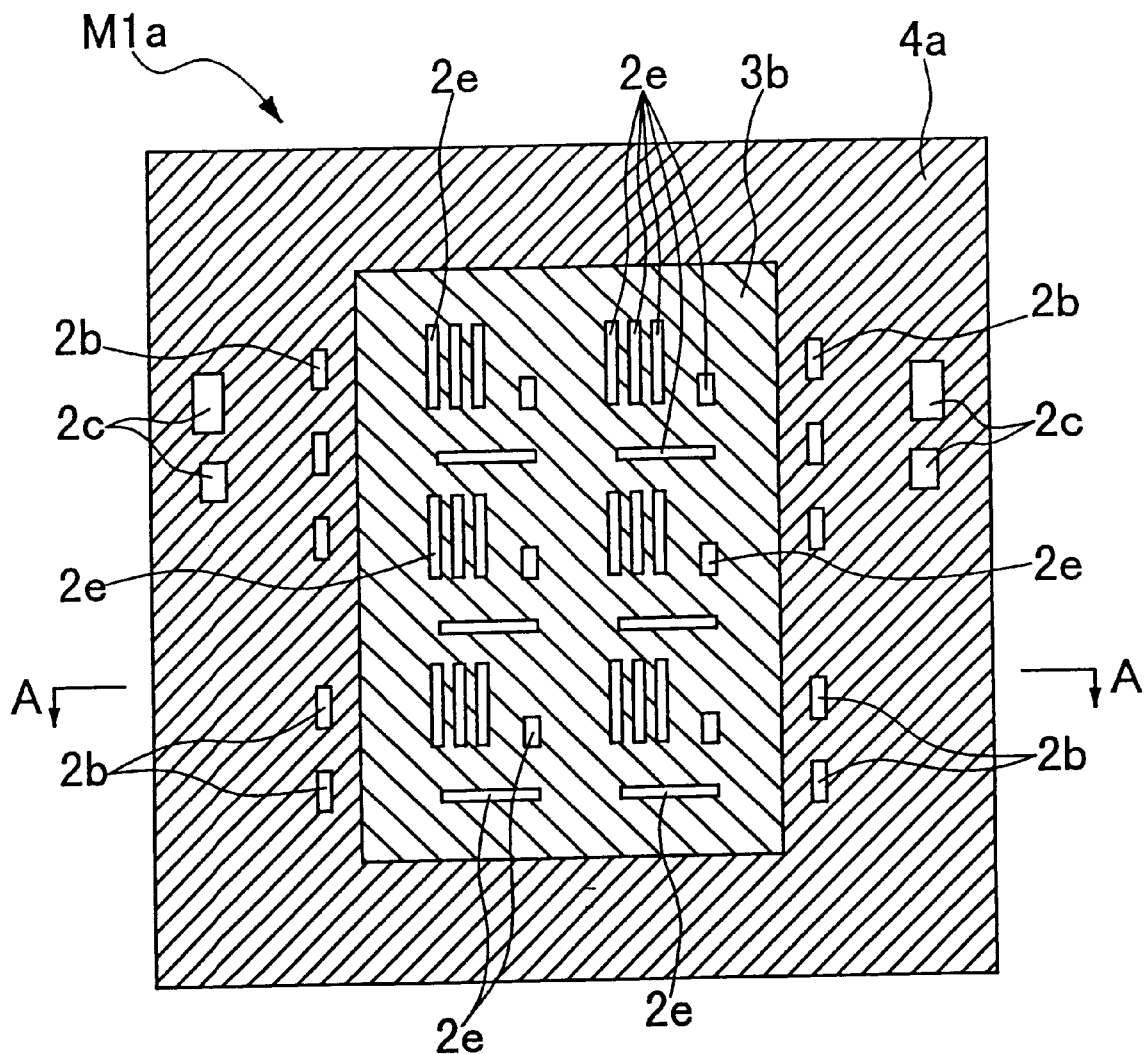
FIG. 3A is a plan view of a photomask according to an embodiment of the present invention.
Figure 3B:
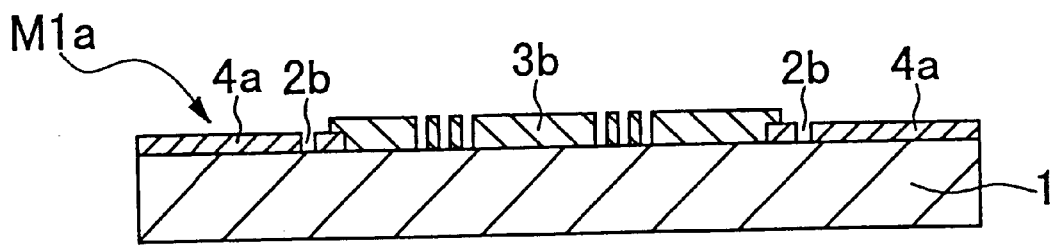
FIG. 3B is a sectional view along an A—A line in FIG. 3A.

In this embodiment, a mask having a metal frame formed on the periphery of an integrated circuit pattern region of the mask will be described below. An example, a mask according to this embodiment is shown in FIGS. 1A to 1D to FIGS. 3A and 3B. FIGS. 1A, 2A, and 3A are plan views of the masks, FIGS. 1B, 2B, and 3B are sectional views along A—A lines in FIGS. 1A, 2A, and 3A, respectively. FIGS. 1C and 1D are enlarged sectional views of main parts of the masks.

These masks M1a, M1b, and M1c indicate reticles for transferring original images of integrated circuit patterns having sizes which are about 1 to 10 times actual sizes onto wafers through reduction projection optics or the like. In this case, although a mask used to transfer a line pattern onto a wafer is illustrated, the spirit and scope of the present invention can be applied to not only the mask, but also a case in which, for example, a hole pattern or the like is transferred. When the masks M1a and M1b are used, a positive type resist film is used on the wafer. When the mask M1c is used, a negative type resist film is used on the wafer. Mask blanks 1 for the masks M1a, M1b, and M1c are constituted by transparent synthetic quartz glass substrates or the like each having a square shape and a thickness of about 6 mm. Although is not specified, the thickness of the mask blanks 1 are preferably, e.g., about 4 mm or more from a viewpoint of processability and assuring mechanical strength. However, in consideration of an influence of a mask weight on scanning accuracy, a thickness of, e.g., about 20 mm or less is preferably used.

The mask M1a in FIG. 1 illustrates a mask in which the periphery of a semiconductor chip serves as a shade region. In the integrated circuit pattern region at the center on a major surface of the mask blanks 1 on the mask M1a, a light-transmitting region 2a having a flat rectangular shape is formed, and the major surface of the mask blanks 1 is partially exposed. On the first major surface of the mask blanks 1 in the integrated circuit pattern region, a shade pattern 3a for transferring an integrated circuit pattern onto the wafer is arranged. In this case, it is illustrated that only the shade pattern 3a constituted by a resist film is arranged in the integrated circuit pattern region, and the shade pattern 3a is transferred as a line pattern (integrated circuit pattern) on the wafer.

In this embodiment, the shade pattern 3a is formed by a resist film. For this reason, as will be described later, the shade pattern 3a can be relatively easily removed. A new shade pattern 3a can easily formed within short time. The resist film forming the shade pattern 3a absorbs exposure light such as a KrF excimer laser beam (wavelength of 248 mn), an ArF excimer laser beam (wavelength of 193 nm), or an $F^2$ laser beam (wavelength of 157 nm). The resist pattern has a shade function which is almost the same as that of a shade pattern made of a metal.

The shade pattern 3a may be constituted by a single resist film as shown in FIG. 1C, or may be constituted such that a photosensitive organic film 3a2 is stacked on a photoabsorptive organic film 3a1. When a laminate structure constituted by the photoabsorptive organic film 3a1 and the photosensitive organic film 3a2 is employed, sufficient attenuation can be obtained with respect to exposure light such as an i-line (wavelength of 365 nm) or a KrF excimer laser having a wavelength of 200 nm or more. The materials or the like of the resist film will be described later. A technique for forming a shade pattern by a resist film is described in Japanese Patent Application No. 11-185221 (filed on Jun. 30, 1999) filed by the present inventors.

The periphery (the peripheral region) of an integrated circuit pattern region on the first major surface of the mask blanks 1 in FIG. 1 is covered with a shade pattern 4a (frame: a second shield portion made of a metal) from the periphery of the integrated circuit pattern region to the periphery of the mask blanks 1. The shade pattern 4a is formed by depositing, e.g., chromium (Cr) or chromium oxide on chromium. However, the material of the shade pattern 4a is not limited to chromium or chromium oxide, and can be variously changed. For example, a refractory metal such as tungsten (W), molybdenum (Mo), tantalum (Ta), or titanium (Ti), a refractory metal nitride such as tungsten nitride (WN), a refractory metal silicide (compound) such as tungsten silicide (Wsix) or molybdenum silicide (MoSix), or a laminate film made of these materials may be used. When the mask according to this embodiment is used, after the shade pattern 3a constituted by a resist film is removed, and the mask is cleansed and used again. For this reason, as the material of the shade pattern 4a, a material having good resistance to stripping and good resistance to abrasion is preferably used. A refractory metal such as tungsten has good resistance to oxidation, good resistance to abrasion, and good resistance of stripping. Therefore, the refractory metal is preferably used as the material of the shade pattern 4a. This shade pattern 4a portion serves as a region with which a setting portion of an exposure device is brought into contact when the mask M1a is set on the mask M1a. When the shade pattern 4a is arranged, the mask M1a is set on the exposure device without generating particles.

In the peripheral region of the mask blanks 1 in FIG. 1, a light-transmitting pattern 2b for forming a mark for detecting information of the mask M1a is formed. This light-transmitting pattern 2b is a pattern for directly detecting positional information of the mask M1a from the mask M1a itself when a predetermined pattern is delineated on the mask M1a by using, e.g., an electronic delineation device or the like. In the peripheral region of the mask M1a, a light-transmitting pattern 2c for forming a mark for detecting information of the mask M1a is also formed on the further outside of the light-transmitting pattern 2b. The light-transmitting pattern 2c is used as, e.g., an alignment mark or a correction mark or the like used to manufacture a mask. When the mask M1a is set on a predetermined device such as a detection device or an exposure device, the alignment mark is used to align the mask M1a, the detection device, the exposure device, and the like by detecting the position of the mask M1a. The correction mark is used when pattern offset, the state of the shape of a pattern, or pattern transfer accuracy is measured and when focus drift of the exposure device is automatically corrected. The light-transmitting patterns 2b and 2c are not transferred onto a wafer.

The mask M1b in FIG. 2 illustrates a mask which is designed such that the peripheral contour of a semiconductor chip serves as a shade region. Since the integrated circuit pattern region of the mask M1b is the same as that of the mask M1a, a description thereof will be omitted. On the first major surface of the mask blanks 1, the periphery of the integrated circuit pattern region is surrounded by a belt-like shade pattern (shade portion made of a metal) 4b. Most of the outside of the peripheral region of the mask M1b serves as a light-transmitting region 2d by removing a shade from. In the light-transmitting region 2d, a shade pattern 4c for forming a mark for detecting information of the mask M1b is formed. This shade pattern 4c is a mark having the same function as that of the light-transmitting pattern 2b of the mask M1a. In the peripheral region of the mask M1b, a shade pattern 4d having the same function as that of the light-transmitting pattern 2c of the mask M1a is formed on a further outside of the shade pattern 4c. The shade patterns 4c and 4d are not transferred onto the wafer. The belt-like shade patterns 4b to 4d are formed by the same material is processed in the same pattern processing. The structures (the materials, the laminate structures, and the like) of the belt-like shade patterns 4b to 4d are formed of the same metal of the shade pattern 4a. The shade patterns 4c and 4d for marks may be constituted by resist films. Detection of a mark may use a normal halogen lamp or the like. In this case, a shade pattern for a mark constituted by the resist film may have the laminate structure comprising the photoabsorptive organic materials and photosensitive organic materials described above.

The mask M1c in FIG. 3 illustrates an inverted pattern of each of the masks M1a and M1b. The basic structure (structure of the blanks) of the mask M1c is the same as that of the mask M1a. An integrated circuit pattern region (i.e., the light-transmitting region 2a) on the first major surface of the mask blanks 1 is covered with a shade film 3b. The structures (the material, the laminate structure, and the like) of the shade film 3b are the same as those of the shade pattern 3a. The peripheral portion of the shade film 3b is stacked on a part of the shade pattern 4a. The shade film 3b in the integrated circuit pattern region is partially removed to form a light-transmitting pattern 2e. By the light-transmitting pattern 2e, a line pattern or the like is transferred onto the wafer. The structure of the mask pattern constituted by the shade film 3b and the light-transmitting pattern 2e can also be applied to the mask M1b in FIG. 2.

Figure 4:
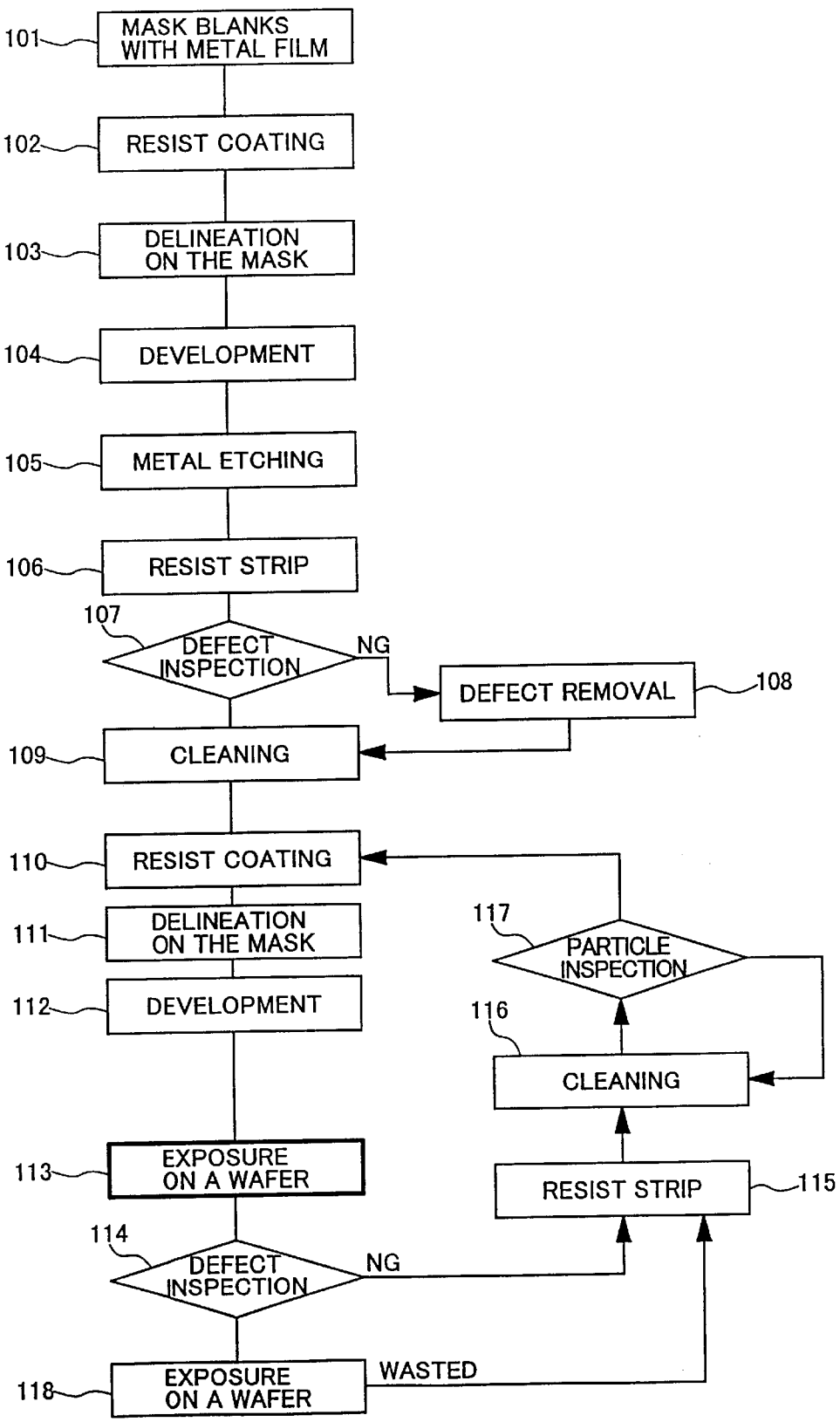
FIG. 4 is a flow chart of a technique for manufacturing a photomask according to an embodiment of the present invention.

A method of manufacturing the masks M1a, M1b, and M1c, a method of using the masks, and a method of reclaiming (reusing) the masks will be described below with reference to FIGS. 5A and 5B to FIGS. 17A and 17B along the flow chart in FIG. 4. FIGS. 5B to 17B are sectional views along A—A lines in FIGS. 5A to 17A, respectively.

Figure 5A:
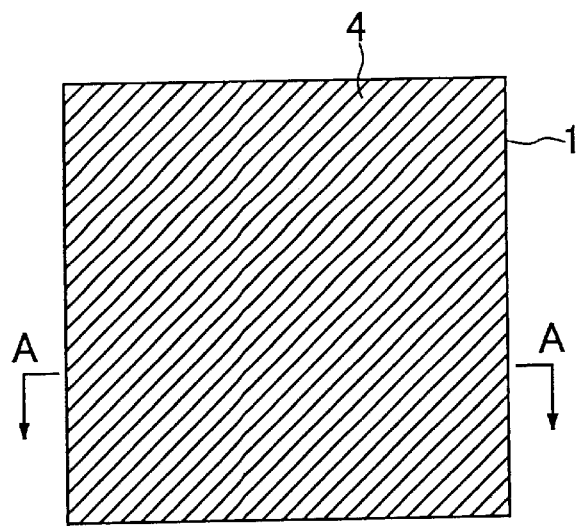
FIG. 5A is a plan view in a step in manufacturing a photomask according to an embodiment of the present invention.
Figure 5B:
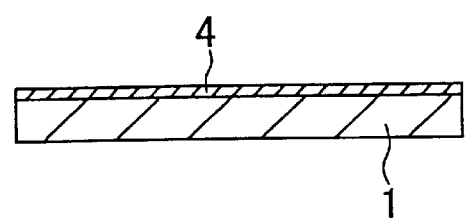

As shown in FIGS. 5A and 5B, blanks obtained by adhering a shade film 4 made of a metal to the entire surface of the first major surface of the mask blanks 1 were prepared (step 101). The structures (the material, the laminate structure, and the like) of the shade film 4 are the same as those of the shade pattern 4a. When oxygen plasma ashing is used to strip the shade pattern 3a and the shade film 3b constituted by the resist films, it is preferable to select a metal such as tungsten having resistance to oxidation because good resistance to stripping and good resistance to abrasion are obtained. When the masks M1a and M1c are used, since the shade films 4 are removed from the integrated circuit pattern regions at the centers of the major surfaces, the shade films 4 corresponding to the portions may have defects such as pin holes without any trouble. In addition, when the mask M1b is used, since the shade film 4 at the center of the major surface and on the periphery is removed, the shade film 4 corresponding to both the portions may have the defects without any trouble.

Figure 6A:
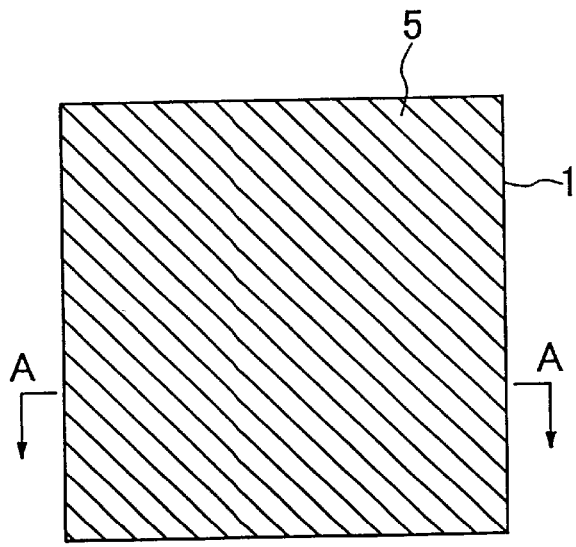
FIG. 6A is a plan view in a step in manufacturing a photomask subsequent to the step in FIG. 5A.
Figure 6B:
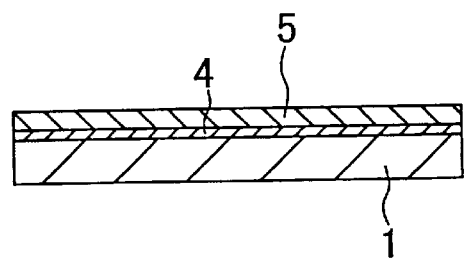
FIG. 6B is a sectional view along an A—A line in FIG. 6A.
Figure 7A:
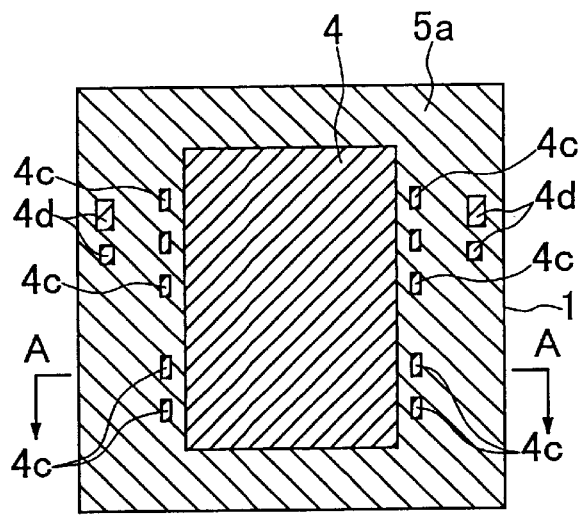
FIG. 7A is a plan view in a step in manufacturing a photomask in FIGS. 1A to 1C subsequent to the step in FIG. 6A.
Figure 7B:
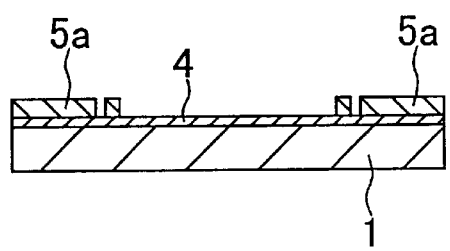
FIG. 7B is a sectional view along an A—A line in FIG. 7A.
Figure 8A:
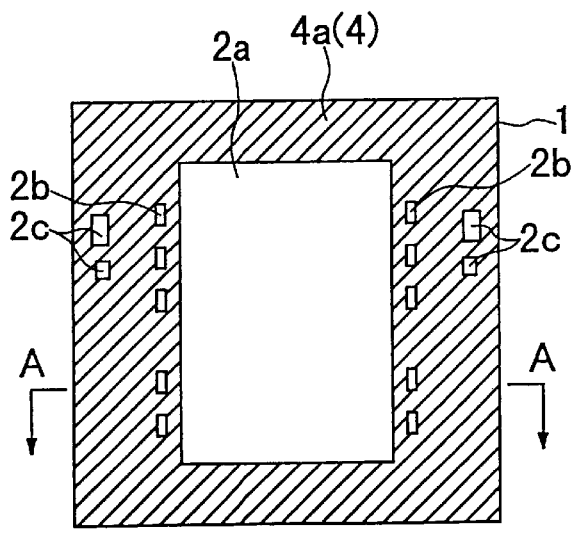
FIG. 8A is a plan view in a step in manufacturing a photomask in FIGS. 1A to 1C subsequent to the step in FIG. 7A.
Figure 8B:
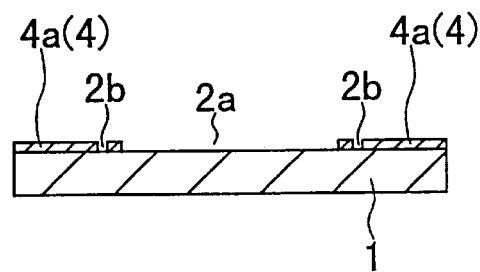
FIG. 8B is a sectional view along an A—A line in FIG. 8A.
Figure 9A:
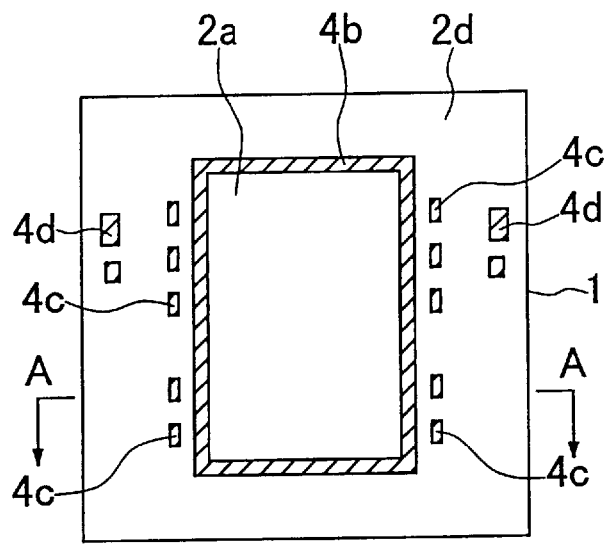
FIG. 9A is a plan view in a step in manufacturing a photomask in FIG. 2A.
Figure 9B:
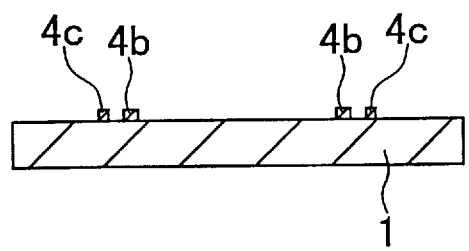
FIG. 9B is a sectional view along an A—A line in FIG. 9A.

Subsequently, as shown in FIGS. 6A and 6B, after a resist film 5 is coated on the shade film 4 made of a metal (step 102), pattern delineation and development are performed to form a resist pattern 5a as shown in FIGS. 7A and 7B (steps 103 and 104). After the shade film 4 made of a metal is etched by using the resist pattern 5a as a mask (step 105), the resist pattern 5a is stripped (step 106) to form a metal shade pattern 4a (frame) as shown in FIGS. 8A and 8B. The formed metal shade pattern 4a is a pattern which covers the periphery of the integrated circuit pattern region, and light-transmitting patterns 2b and 2c for forming a reticle alignment mark, a base line adjustment mark, a wafer alignment mark of the exposure device, and the like are formed in the region of the shade pattern 4a. The masks shown in FIGS. 5A and 5B, FIGS. 6A and 6B, and FIGS. 8A and 8B correspond to the blanks described above.

Figure 10A:
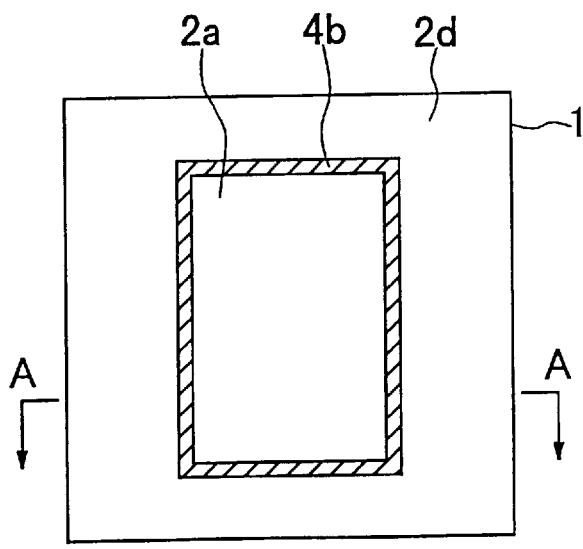
FIG. 10A is a plan view in a step in manufacturing a photomask in FIG. 2A.
Figure 10B:
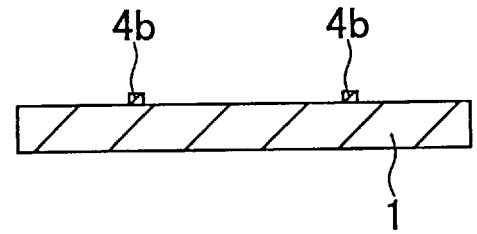
FIG. 10B is a sectional view along an A—A line in FIG. 10A.

The blanks shown in FIG. 8 can be used to manufacture both the masks M1a and M1c. FIGS. 9A and 9B and FIGS. 10A and 10B illustrate blanks obtained through the step 101 to the step 106 when the mask M1b is used. On the first major surface of the mask blanks 1 in FIGS. 9A and 9B, the shade pattern 4b which comprises of a metal (shade film 4) and the shade patterns 4c and 4d for marks are formed. On the first major surface of the mask blanks 1 in FIGS. 10A and 10B, only the shade pattern 4b is formed. The blanks in FIGS. 10A and 10B illustrate blanks obtained when the shade pattern for a mark is formed by the shade pattern constituted by the resist film.

Thereafter, defect inspection is performed (step 107). If a defect is detected, defect correction is performed (step 108). If no defect is detected, the cleaning process is performed (step 109).

As shown in FIGS. 11A and 11B, a resist film (photosensitive organic film) 3 having a thickness of about 150 nm is coated on the first major surface of the mask blanks 1 (blanks) shown in FIGS. 8A and 8B and the like (step 110), and mask pattern delineation and development are performed to form the shade pattern 3a or the shade film 3b constituted by the resist films shown in FIGS. 1A to 1D to FIGS. 3A and 3B, thereby manufacturing the masks M1a, M1b, and M1c (steps 111 and 112).

As this resist film 3, for example, a material containing, as a main component, e.g., poly(-methylstyrene-co-chloroacrylic acid), a novolac resin and quinone diazide, a novolac resin and poly(2-methylpentene-co-sulfone), chloromethylated polystyrene, or the like was used. A so-called chemical amplification resist or the like obtained by mixing an acid generator with a phenol resin or a novolac resin such as a polyvinyl phenol resin can be used. As the material of the resist film 3 used in this case, a material having shade characteristics for the light source of the projection aligner and characteristics that sensitivity to a light source of a pattern delineation device, e.g., an electron beam or light having a wavelength of 230 nm or more must be used. The material of the resist film 3 is not limited to the materials described above, can be variably changed. The thickness is not limited to 150 nm, and the thickness which satisfies the conditions may be used.

When a polyphenol-based or novolac-based resin is formed as a film having a thickness of about 100 nm, a transmittance is almost 0 at a wavelength of, e.g., about 150 nm to 230 nm, and the film has a sufficient mask effect with respect to, e.g., an ArF excimer laser beam having a wavelength of 193 nm, an $F^2$laser beam having a wavelength of 157 nm, or the like. In this case, although vacuum ultraviolet light having a wavelength of 200 nm or less is used, light to be used is not limited to the ultraviolet light. As a mask material for a krF excimer laser beam having a wavelength of 248 nm, another material must be used, a photoabsorptive material or a shade material must be added to the resist film, or a laminate film constituted by a photoabsorptive organic film and a photosensitive organic film is used as the resist film as described above. After the shade pattern 3a and the shade film 3b constituted by the resist film are formed, addition of a heat treatment step to improve resistance to exposure light irradiation or execution of a so-called hardening process of the resist film for strongly irradiating ultraviolet light in advance is effective.

The masks M1a, M1b, and M1c were set in an exposure device, and test exposure is performed on the wafers (step 113). The wafers are subjected to a development process to perform defect inspection of transfer patterns formed on the wafers (step 114). A defect occurrence mode between a plurality of shots was examined to extract a mask defect, and the presence/absence of fatal defect is decided. More specifically, defects detected at the same position in one shot of a plurality of shots was regarded as a mask defect. The case in which test exposure is performed on a wafer to perform defect inspection has been described. However, the present invention is not limited to this case. A method of inspecting defects of the masks M1a, M1b, and M1c without performing exposure may be employed (the method is similarly employed in defect inspection of a resist mask).

On the masks M1a, M1b, and M1c which does not pass the defect inspection, the shade pattern 3a or the shade film 3b constituted by the resist film were stripped (step 115), cleansing was performed (step 116), and particle check for checking the presence/absence or the like of particles or scratches was performed (step 117). When the number of checked particles is a predetermined number or small, the masks were reclaimed as reclamation blanks (states of the blanks shown in FIGS. 8A and 8B to FIGS. 10A and 10B or the like). More specifically, coating of the resist film for forming a shade portion was started again to produce the masks M1a, M1b, and M1c (reclamation process). An integrated circuit pattern (the shade pattern 3a, the light-transmitting pattern 2e, or the like) formed on the mask after the mask is reclaimed may be the same as the pattern before the reclamation or may be different from the pattern before the reclamation.

Figure 12A:
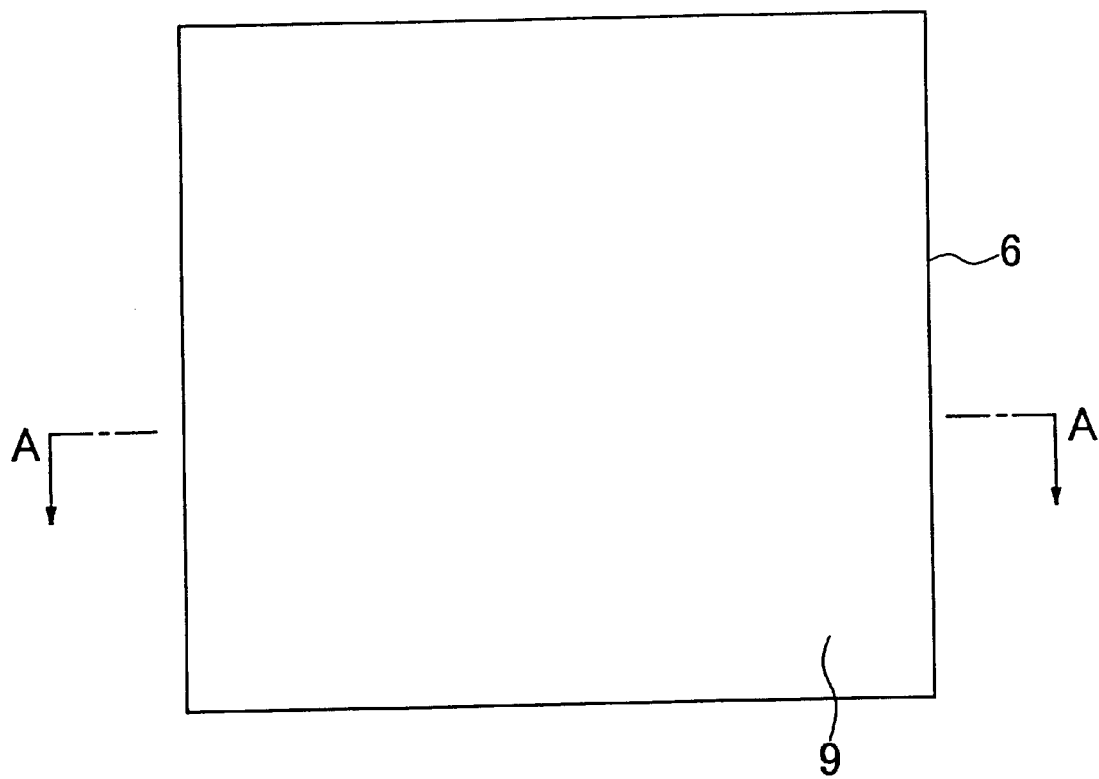
FIG. 12A is a plan view of a main part of a semiconductor wafer in the step of forming a pattern.
Figure 12B:
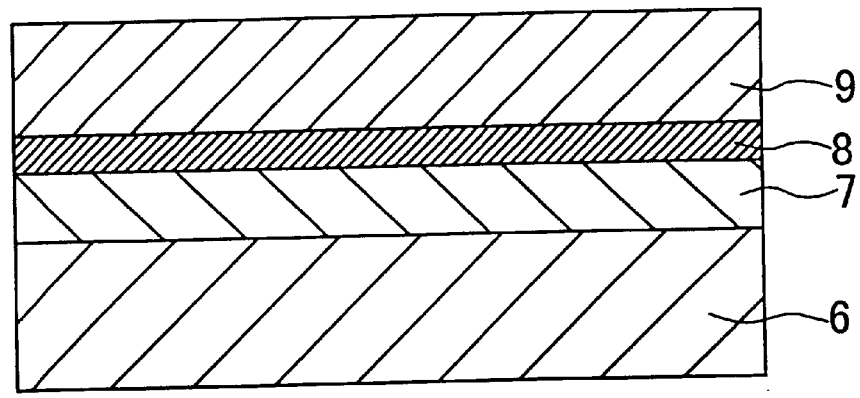
FIG. 12B is a sectional view along an A—A line in FIG. 12A.
Figure 13A:
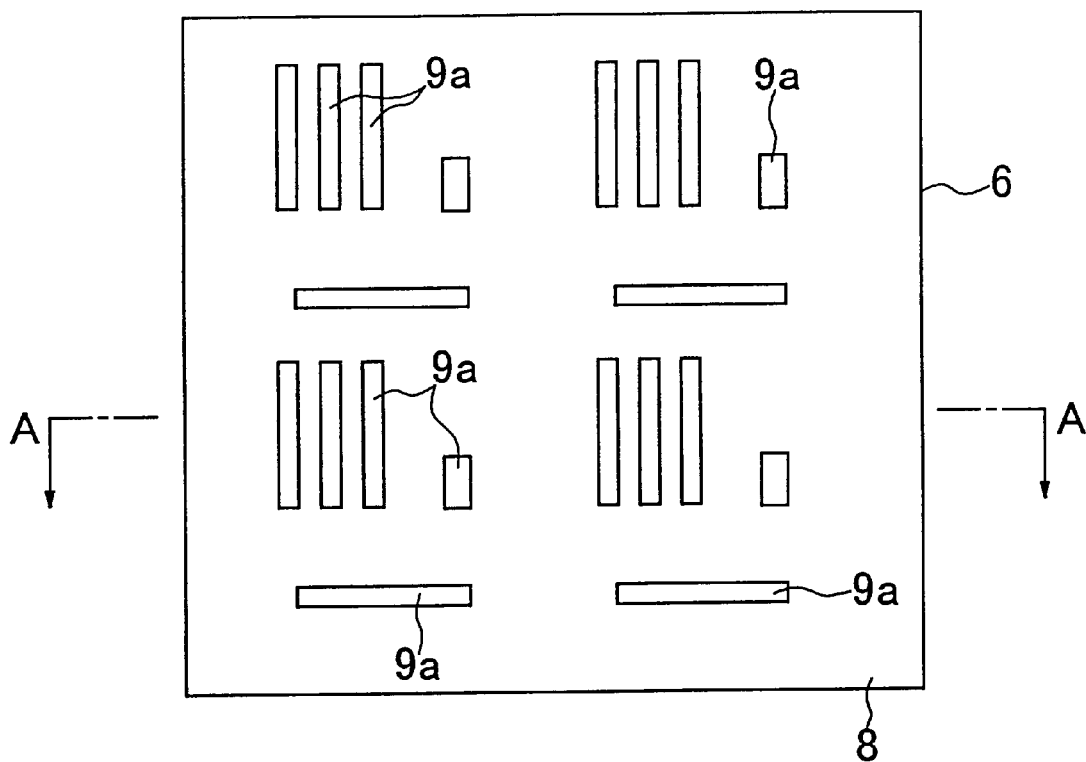
FIG. 13A is a plan view of a main part of a semiconductor wafer in the step of forming a pattern subsequent to FIG. 12.
Figure 13B:
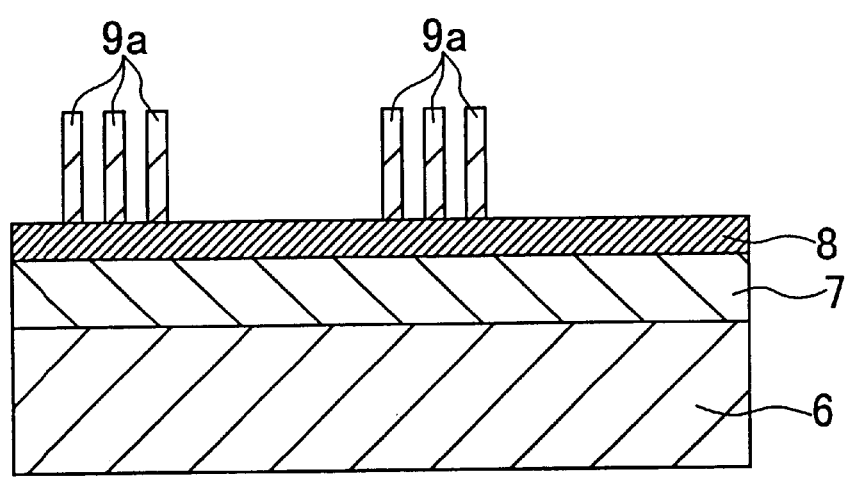
FIG. 13B is a sectional view along an A—A line in FIG. 13A.

The masks M1a, M1b, and M1c which pass the wafer defect inspection are used in exposure of wafers (step 118). An example of the exposure process will be described below. FIG. 12A is a plan view of a main part of a wafer 6 obtained before the exposure process is performed, and FIG. 12B is a sectional view along an A—A line in FIG. 12A. The wafer 6 serving as a substrate to be projected comprises, e.g., silicon monocrystal. An insulating film 7 is deposited on a major surface of the wafer 6. A conductive film 8 is deposited on the entire surface of the insulating film 7. A normal resist film 9 is deposited to have a thickness of, e.g., about 300 nm. When the masks M1a and M1b are used, for example, a positive type resist film is used as the resist film 9. When the mask M1c is used, a negative type resist film is used as the resist film 9.

As projection light of a reduction projection exposure device, e.g., an ArF excimer laser having a wavelength of 193 nm was used. As a numeral aperture NA of a projection lens, e.g., 0.68 was used. As the coherency of the light source, e.g., 0.7 was used. Alignment between the used masks M1a, M1b, and M1c and the reduction projection exposure device was performed by detecting the light-transmitting patterns 2c or the shade patterns 4d of the masks M1a, M1b, and M1c.

Figure 14A:
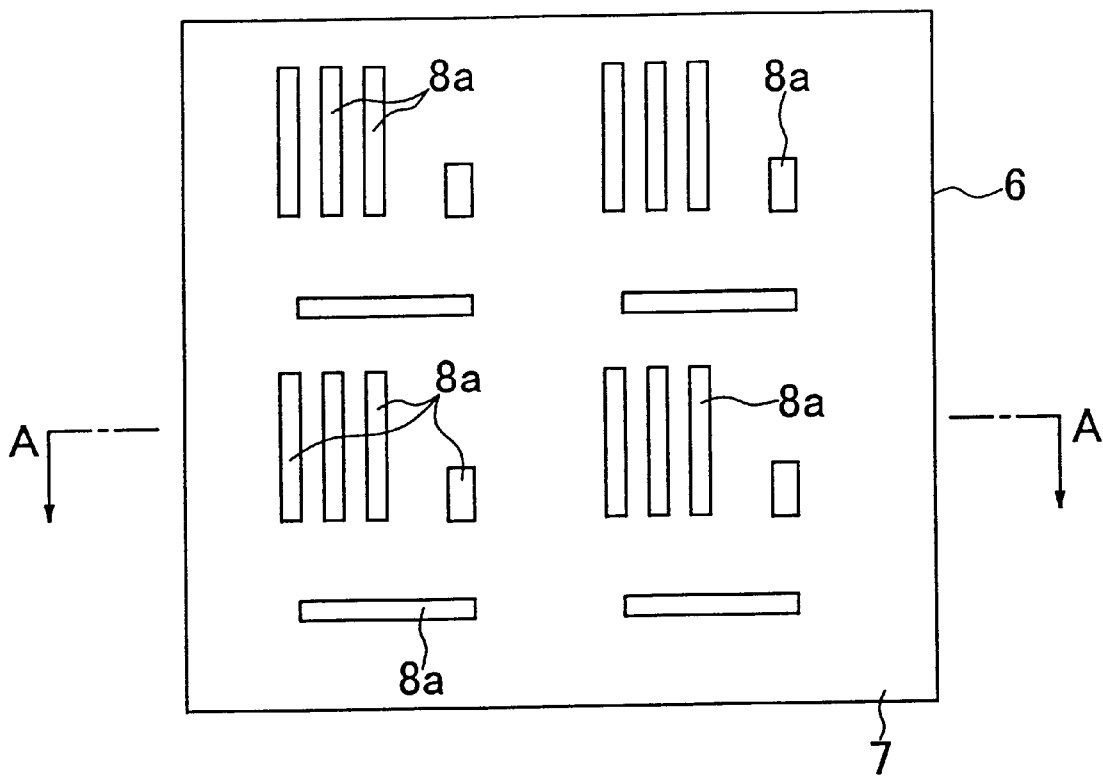
FIG. 14A is a plan view of a main part of a semiconductor wafer in the step of forming a pattern subsequent to the step in FIG. 13A.
Figure 14B:
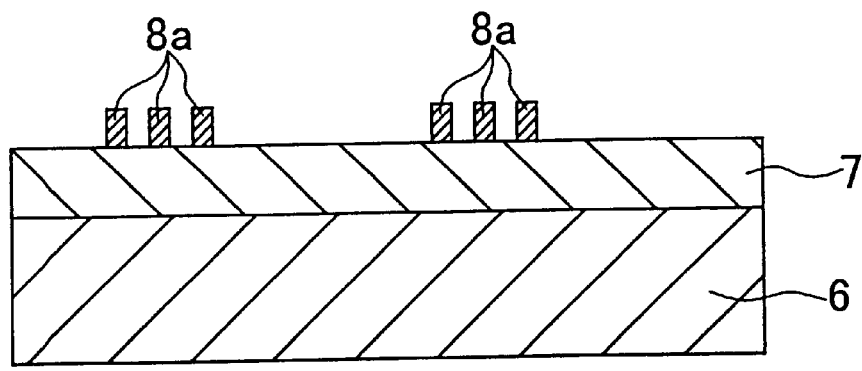
FIG. 14B is a sectional view along an A—A line in FIG. 14A.

Thereafter, the integrated circuit patterns on the masks M1a, M1b, and M1c were projected on the major surface of the wafer 6. The resultant structure was subjected to normal heat treatment and a normal development step to form a resist pattern 9a shown in FIGS. 8A and 8B. Thereafter, an etching process was performed to the conductive film 8 by using the resist pattern 9a as an etching mask to form a conductive film pattern 8a as shown in FIGS. 14A and 14B. As a result, pattern transfer characteristics which were the same as those in the exposure using the normal mask could be obtained. For example, a line-and-space of 0.19 $\mu$m could be formed at a focal depth of 0.4 $\mu$m.

After the exposure process described above was performed, the resist films (the shade pattern 3a and the shade film 3b) on the masks M1a, M1b, and M1c were stripped after the masks were wasted. The masks M1a, M1b, and M1c were cleaned, and particle check was performed (steps 115, 116, and 117). A mask which did not pass the particle check was cleaned again and subjected to particle check (steps 116 and 117). A mask which passed the particle check was reclaimed as reclamation blanks (blanks shown in FIG. 8 to or the like). As described above, in this embodiment, the masks can be reclaimed. For this reason, the cost of materials, the cost of steps, and the cost of fuel in manufacturing masks can be reduced. Therefore, the cost of the mask can be considerably reduced. A period of time required for manufacturing a mask can be considerably shortened. In addition, the invention is also effective to saving of resources or a countermeasure against destruction of the environment.

The steps in reclaiming a mask according to this procedure will be described below with reference to FIGS. 15A and 15B to FIGS. 17A and 17B. Although the mask M1a will be mainly illustrated, the same processes as those performed to the mask M1a are performed to the other masks M1b and M1c.

Figure 15A:
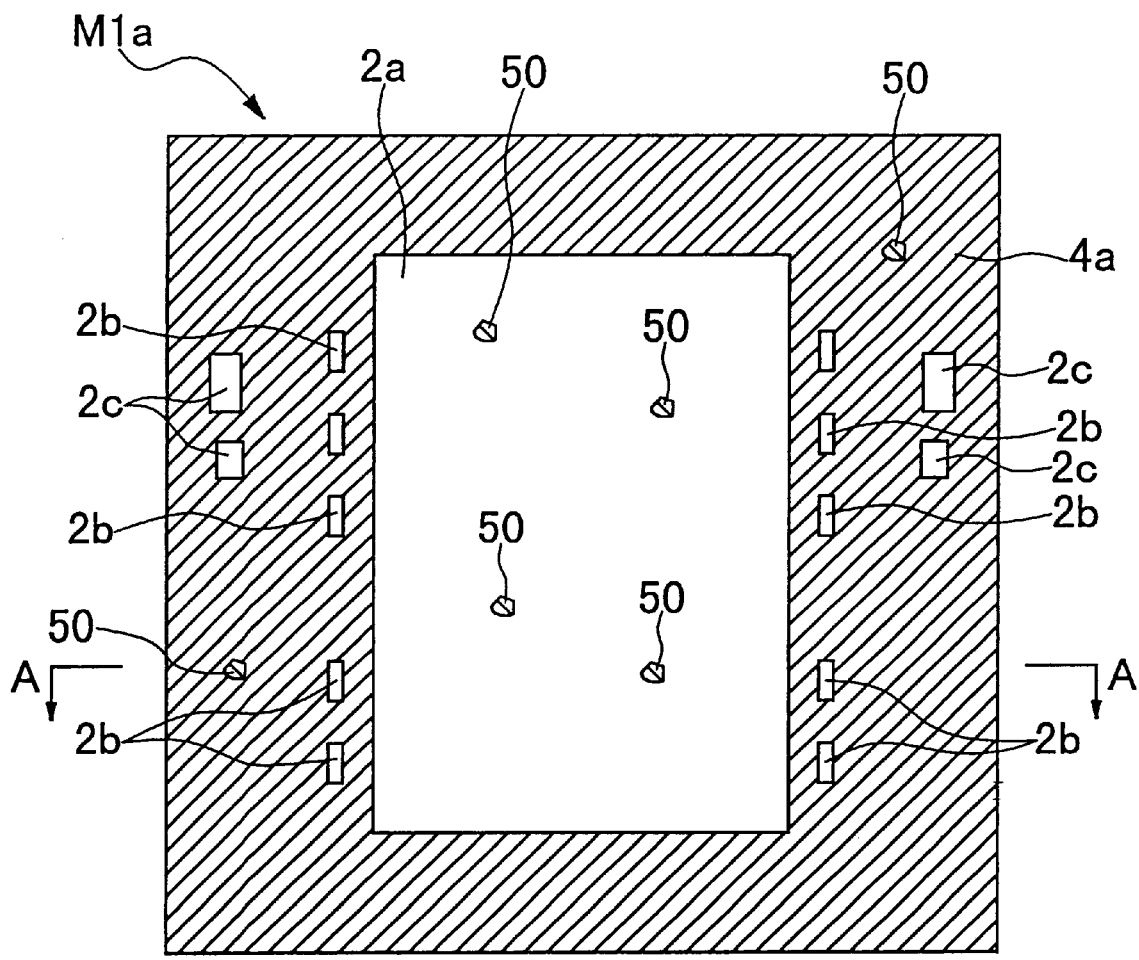
FIG. 15A is a plan view in the step of reclaiming a photomask in FIG. 1A according to an embodiment of the present invention.
Figure 15B:
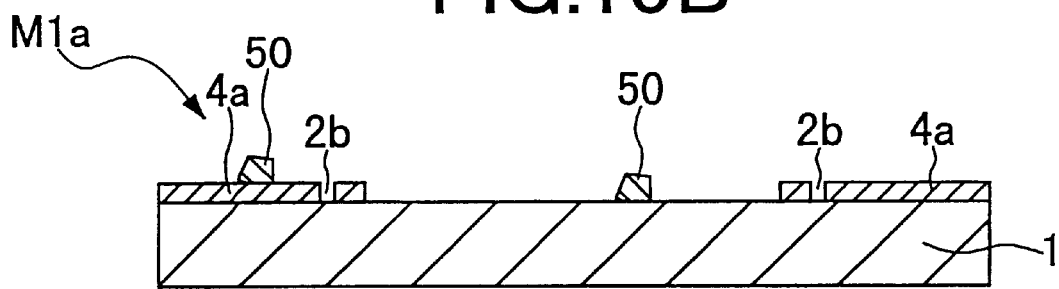
FIG. 15B is a sectional view along an A—A line in FIG. 15A.

The shade pattern 3a (the shade film 3b in the mask M1c) constituted by a resist film was stripped from the exposed mask M1a by, as shown in FIGS. 15A and 15B, for example, n-methyl-2-pyrolidone organic solvent. The shade pattern 3a or the shade film 3b may also be stripped by a heated amine-based organic solvent or acetone. The shade pattern 3a or the shade film 3b may also be removed by a tetra methyl ammonium hydroxide (TMAH) aqueous solution, ozone sulfuric acid, or a mixture of a hydrogen peroxide solution and concentrated sulfuric acid. When the TMAH aqueous solution was used, if the concentration of the TMAH aqueous solution was set to be about 5%, the resist film (the shade pattern 3a or the shade film 3b) could be preferably stripped without corroding the metal (the shade patterns 4a and 4B or the like).

As another method of removing a resist film (the shade pattern 3a, the shade film 3b, or the like), an oxygen plasma ashing method can also be used. The oxygen plasma ashing has the maximum capability of stripping. This method is especially effective when a hardening process of the resist film is performed to the shade pattern 3a (the shade film 3b of the mask M1c) constituted by the resist film on the mask M1c. Since the resist film (the shade pattern 3a, the shade film 3b, or the like) subjected to the hardening process is hardened, the resist film may be completely removed by the above chemical removing method.

The resist film (the shade pattern 3a, the shade film 3b, or the like) may be mechanically stripped by peeling. More specifically, an adhesive tape is adhered to a surface on which the shade pattern 3a (the shade film 3b of the mask M1c) constituted by the resist film of the mask M1a is formed, and the adhesive tape is stripped to strop the resist film (the shade pattern 3a or the shade film 3b). In this case, since a vacuum state is not necessarily made, the resist film (the shade pattern 3a or the shade film 3b) can be relatively easily stripped within a short period of time.

After the step of removing a resist film (the shade pattern 3a or the shade film 3b), the mask M1a is subjected to a cleaning process to remove particles 50 on the surface of the mask M1a. In this manner, the mask is reclaimed to have the state of the mask blanks shown in FIGS. 8A and 8B to FIGS. 10A and 10B. In cleaning performed in this case, for example, a combination of cleaning using an ozone sulfuric acid and brush scrubber is used. However, this method can be variably changed into any method which has high capability of removing particles and which does not corrode the metal (the shade patterns 4a to 4d).

Figure 16A:
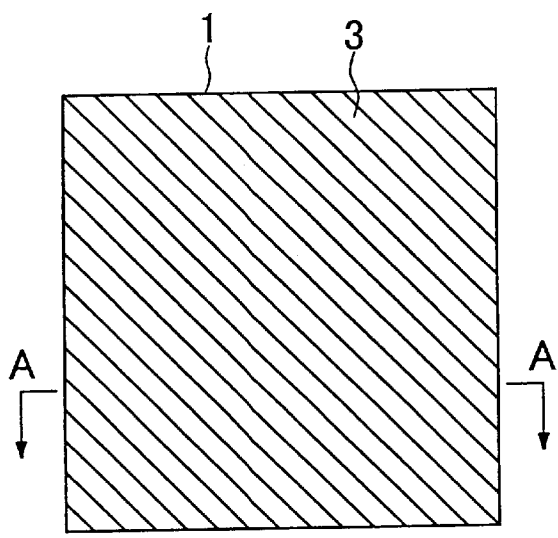
FIG. 16A is a plan view of a photomask in the step of reclaiming a photomask in FIG. 1A subsequent to FIG. 15A.
Figure 16B:
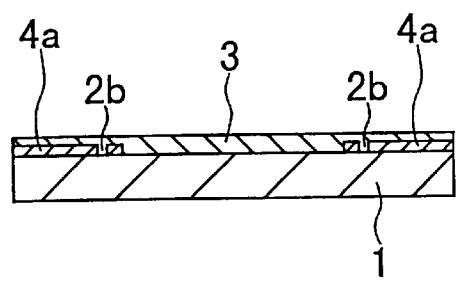
FIG. 16B is a sectional view along an A—A line in FIG. 16A.
Figure 17A:
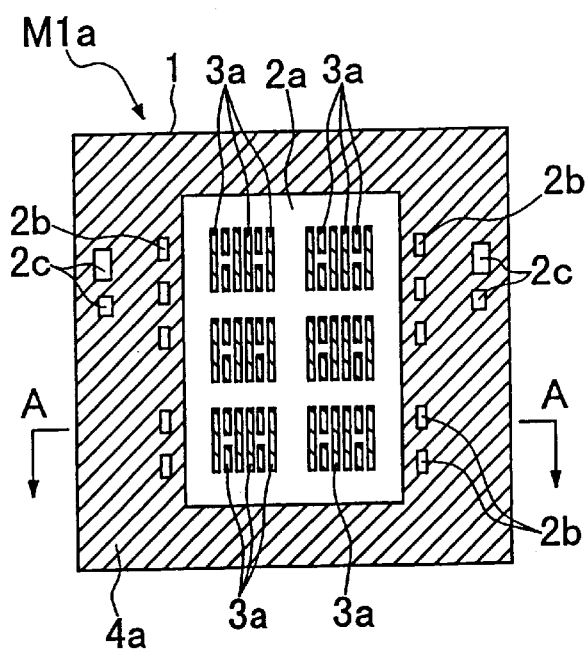
FIG. 17A is a plan view of an example in the step of reclaiming a photomask in FIG. 1 subsequent to the step in FIG. 16A.
Figure 17B:
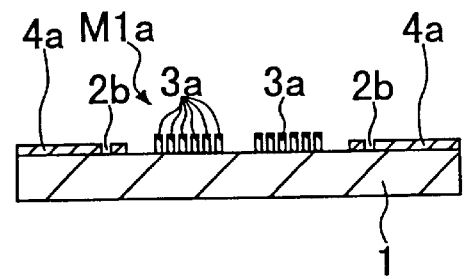
FIG. 17B is a sectional view along an A—A line in FIG. 17A.

As shown in FIGS. 16A and 16B, like the above description, the resist film 3 is coated on the mask blanks 1 (blanks) shown in FIGS. 8A and 8B to FIGS. 10A and 10B, and mask pattern delineation and development are performed to form the shade pattern 3a (the shade film 3b in the mask M1c) constituted by the resist film as shown in FIGS. 17A and 17B, so that the mask M1a is manufactured. A case in which a shade pattern 3a which is different from the shade pattern 3a shown in FIGS. 1A to 1D in shape and arrangement is formed is illustrated. As a matter of course, the same pattern which is the same as the shade pattern 3a in FIG. 1 may be formed. In a description of methods of manufacturing and reclaiming a mask, a case in which a shade pattern or a shade film is formed on a single resist film is explained. However, this method can also be similarly applied to a case in which the shade portion is constituted by a laminate layer constituted by a photosensitive organic film and a photoabsorptive organic film.

According to this embodiment, the following merits can be obtained. (1) The number of steps is small because removal and polishing of a metal are not required. (2) The mask blanks 1 are not thinned every reclamation because polishing is not required, and the mask can be repeatedly reclaimed. (3) The mask can be reused in a state in which a metal frame (shade pattern 4a) on which a pattern required not to reclaim the mask into the mask blanks 1 but to set the mask on an exposure device is formed, and the steps in manufacturing a mask can be considerably reduced. (4) Since the inspection step for the mask blanks 1 (blanks) can be eliminated, or since inspection accuracy can be considerably moderated in comparison with a case in which conventional reuse of a mask is supposed, the number of steps in manufacturing a mask can be reduced. (5) Since particles having fine particles as cores are generated because a metal layer is formed by sputtering when metal such as chromium is used as the material of a shade portion, a yield of reclamation of masks is small, in this embodiment, since a shade portion (attenuation film) used in reusing is a resist film formed by coating, a small number of particles of the shade portion are generated, i.e., a large yield can be achieved.

Second Embodiment

Figure 18A:
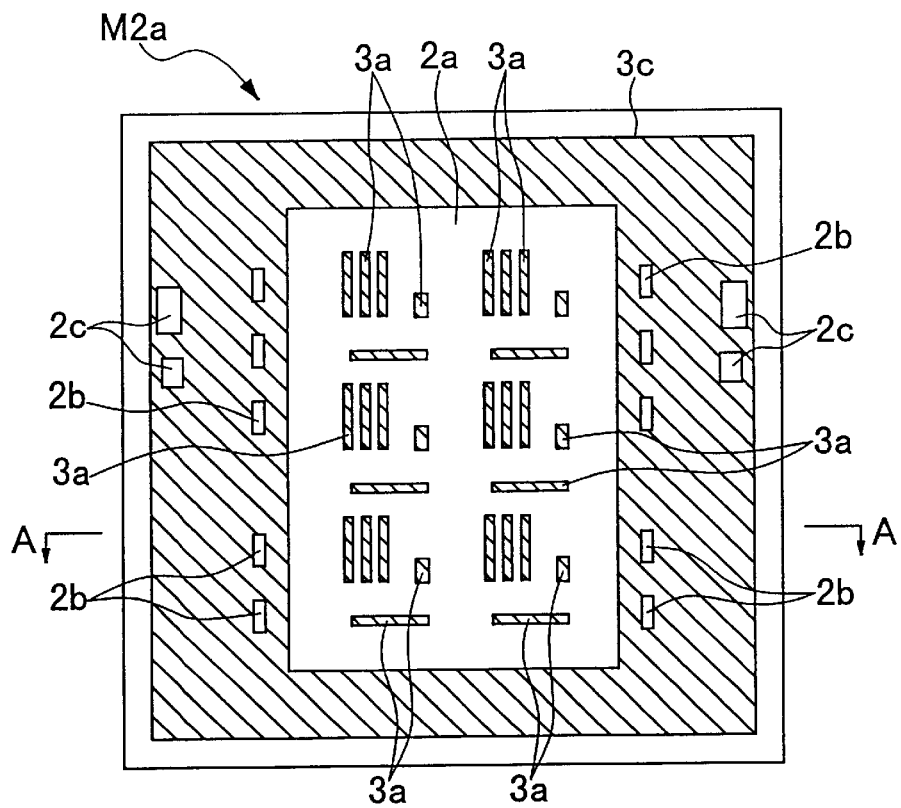
FIG. 18A is a plan view of a photomask according to another embodiment of the present invention.
Figure 18B:
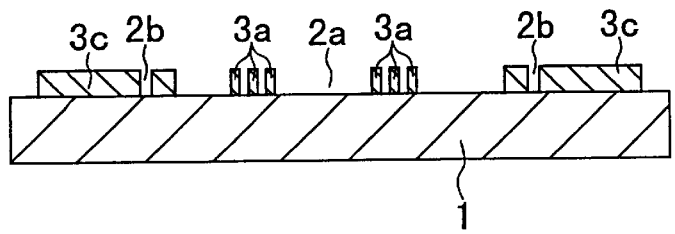
FIG. 18B is a sectional view along an A—A line in FIG. 18A.
Figure 19A:
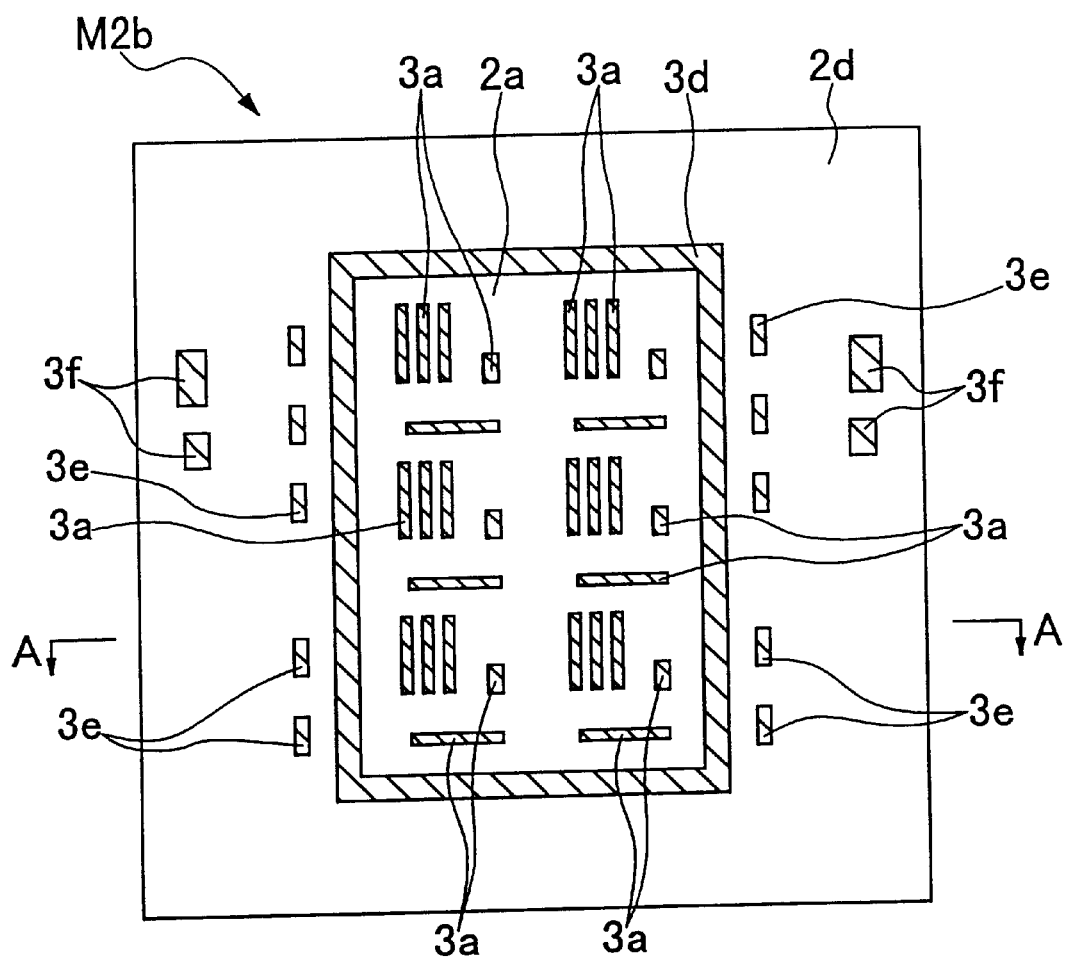
FIG. 19A is a plan view of a photomask according to another embodiment of the present invention.
Figure 19B:
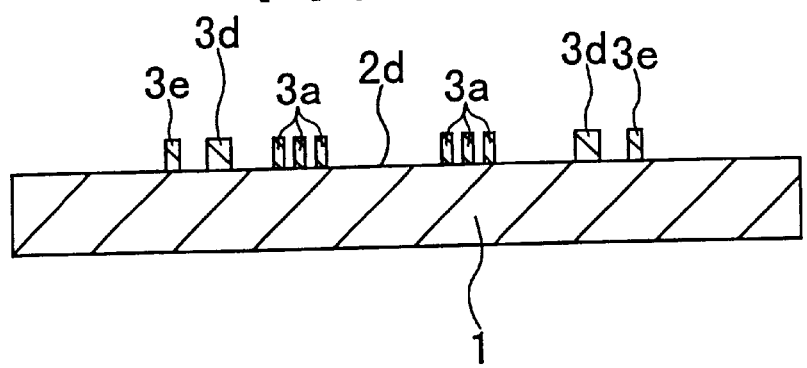
FIG. 19B is a sectional view along an A—A line in FIG. 19A.
Figure 20A:
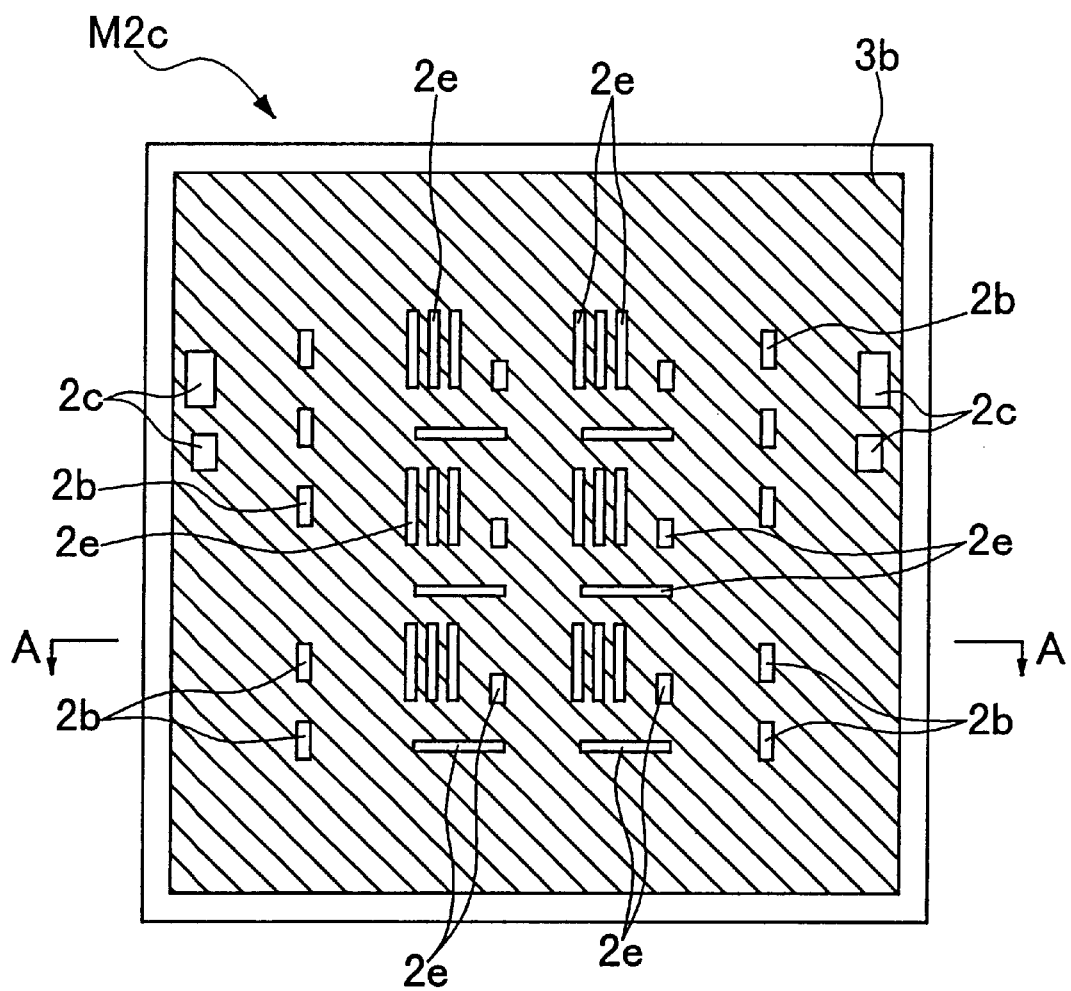
FIG. 20A is a plan view of a photomask according to another embodiment of the present invention.
Figure 20B:
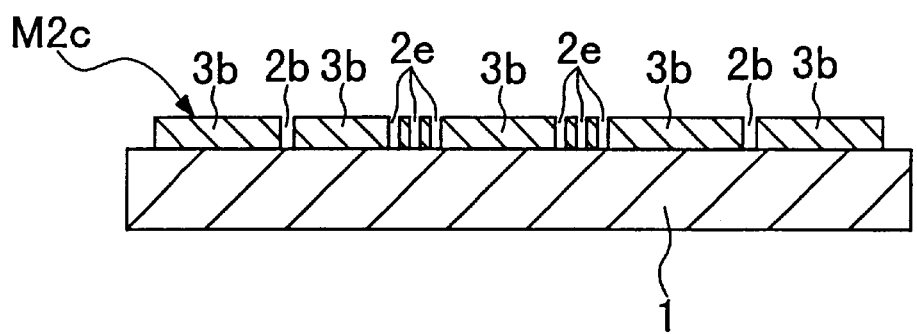
FIG. 20B is a sectional view along an A—A line in FIG. 20A.

In this embodiment, a mask in which only a shade pattern constituted by a resist film is formed in an integrated circuit pattern of the mask will be described below. An example of the mask according to this embodiment is shown in FIGS. 18A and 18D to 20A and 20B. FIGS. 18A, 19A, and 20A are plan views of masks, and FIGS. 18B, 19B, and 20B are sectional views along A—A lines in FIGS. 18A, 19A, and 20A, respectively. FIGS. 1C and 1D are enlarged sectional views of main parts of a mask.

In a mask M2a in FIGS. 18A to 18D, the shade pattern 4a (metal frame) of the mask M1a is formed by a shade pattern 3c constituted by a resist film. The shade pattern 3c is formed such that a resist material which is the same as that of the shade pattern 3a is processed in pattern processing of the shade pattern 3a of the resist film. The other configuration of the mask M2a is the same as that of the mask M1a according to the first embodiment. However, in the shade pattern 3c, a portion with which the stage of an exposure device or the like is brought into mechanical contact is removed to expose the mask blanks 1. In this manner, generation of particles in setting a mask can be suppressed or prevented.

In a mask M2b shown in FIGS. 19A and 19B, the shade patterns 4b to 4d of the mask M1b in FIGS. 2A and 2B are formed by shade patterns 3d to 3f constituted by resist films, respectively. The shade patterns 3d to 3f are formed by processing the same resist material as that of the shade pattern 3a in pattern processing of the shade pattern 3a of the resist film. The other configuration of the mask M2b is the same as that of the mask M1b according to the first embodiment.

In a mask M2c in FIGS. 20A and 20B, the shade pattern 4a of the mask M1c in FIGS. 3A and 3B is also formed by a shade film 3b constituted by a resist film. More specifically, the shade film 3b constituted by the resist film is deposited on the entire surface of the first major surface of mask blanks 1, and the shade film 3b is partially removed to form a light-transmitting pattern 2e for transferring an integrated circuit pattern and light-transmitting patterns 2b and 2c for a mark. The resist film on a portion with which the stage of an exposure device is brought into mechanical contact is also removed. The other configuration of the mask M2c is the same as that of the mask M1c according to the first embodiment.

Figure 18C:
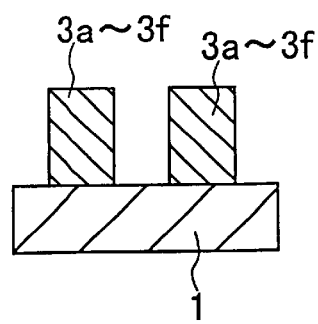
FIG. 18C is an enlarged sectional view of main parts and FIG. 18D is an enlarged sectional view of main parts.
Figure 18D:
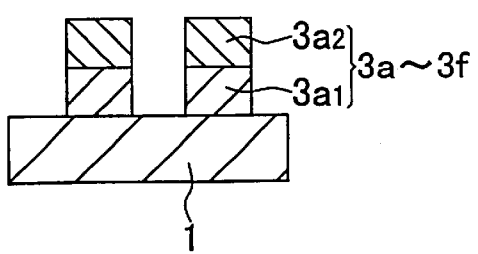

When the masks M2a, M2b, and M2c are used, the shade patterns 3a and 3c to 3f and the shade film 3b may be constituted by single films constituted by resist films as shown in FIG. 18C. As shown in FIG. 18D, a configuration in which a photosensitive organic film 3a2 is stacked on a photoabsorptive organic film 3a1 may be employed.

Methods of manufacturing, using, and reclaiming (reusing) the masks M2a, M2b, and M2c will be described below with reference to FIGS. 21A and 21B to FIGS. 25A and 25B. FIGS. 21B, 22B, 23B, 24B, and 25B are sectional views along A—A lines in FIGS. 21A, 22A 23A, 24A, and 25A, respectively.

Figures 21A, 21B:
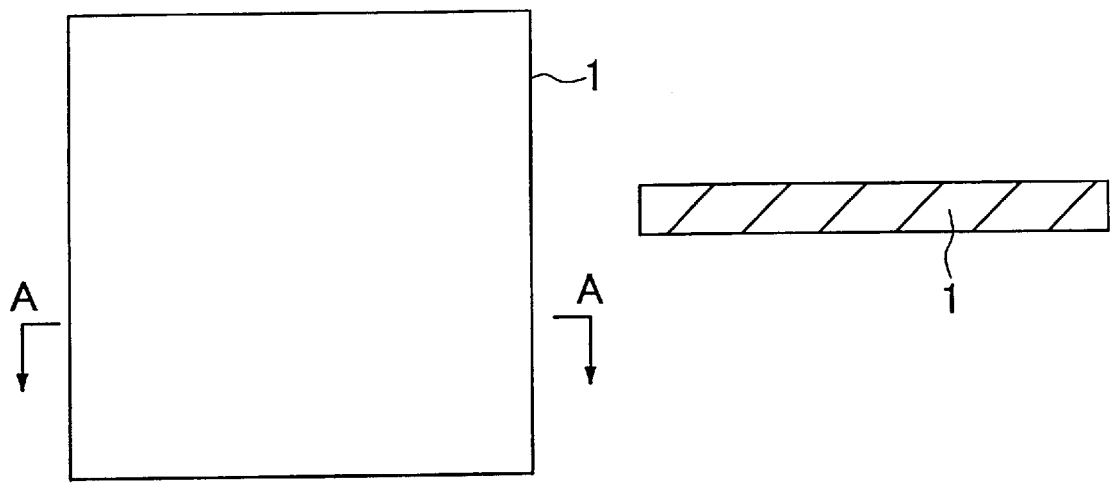
FIG. 21A is a plan view in a step in manufacturing a photomask according to another embodiment of the present invention.
FIG. 21B is a sectional view along an A—A line in FIG. 21A.
Figures 22A, 22B:
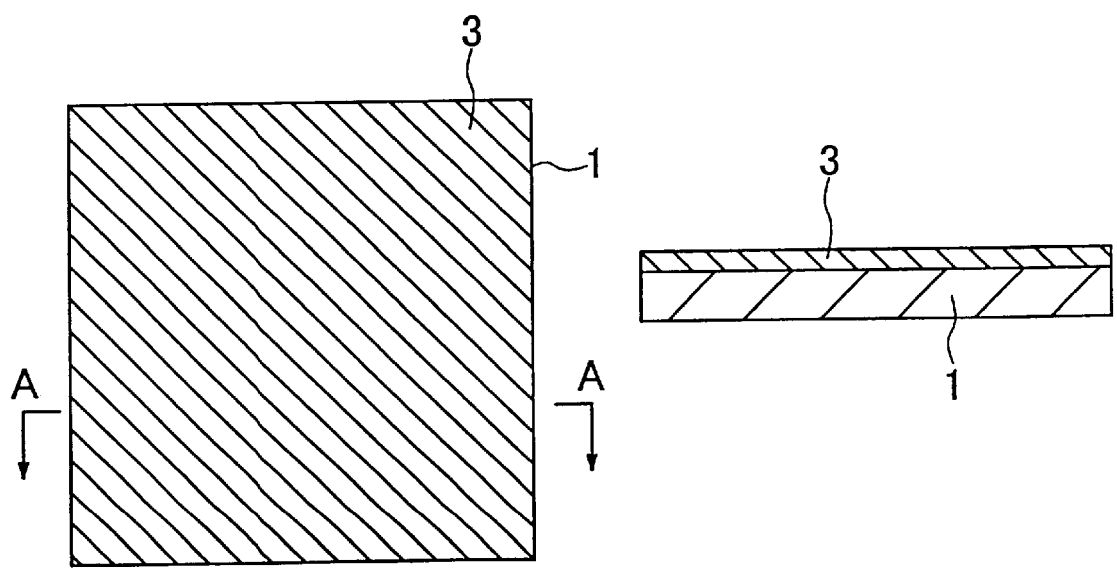
FIG. 22A is a plan view in a step in manufacturing a photomask according to another embodiment of the present invention subsequent to the step in FIG. 21A.
FIG. 22B is an enlarged sectional view of a main part along an A—A line in FIG. 22A.

As shown in FIGS. 21A and 21B, blanks formed by the mask blanks 1 are prepared, and a resist film (photosensitive organic film) 3 is coated on the first major surface of the mask blanks 1 to have a thickness of about 150 nm as shown in FIGS. 22A and 22B. Subsequently, mask pattern delineation and development are performed to the resist film 3 to form the shade patterns 3a and 3c to 3f or the pattern of the shade film 3b constituted by the resist films shown in FIGS. 18A to 18D to FIGS. 20A and 20B, so that the masks M2a, M2b, and M2c (resist masks) are manufactured. Thereafter, the masks M2a, M2b, and M2c were set on an exposure device to perform test exposure on the wafers, and defect inspection for the transfer patterns was performed by the same manner as that in the first embodiment. Not only the method of performing detect inspection by test exposure, but also a method of inspecting defects of the masks M2a, M2b, and M2c without exposure may be employed.

On the masks M2a, M2b, and M2c which did not pass the defect inspection, the shade patterns 3a and 3c to 3f or the shade film 3b constituted by the resist films were stripped. After the masks M2a, M2b, and M2c were cleaned, particle check was performed. When the number of checked particles each having a predetermined size or larger was smaller than a predetermined number, the blanks are reused as reclamation blanks (blanks in FIGS. 21A and 21B. An integrated circuit pattern (the shade pattern 3a, the light-transmitting pattern 2e, or the like) formed on the reclaimed mask may have a pattern which is the same as the pattern obtained before the reclamation or a pattern which is different from the pattern obtained before the reclamation. The masks M2a, M2b, and M2c which pass the wafer defect inspection are used in exposure for the wafers as in the first embodiment.

Figure 23A:
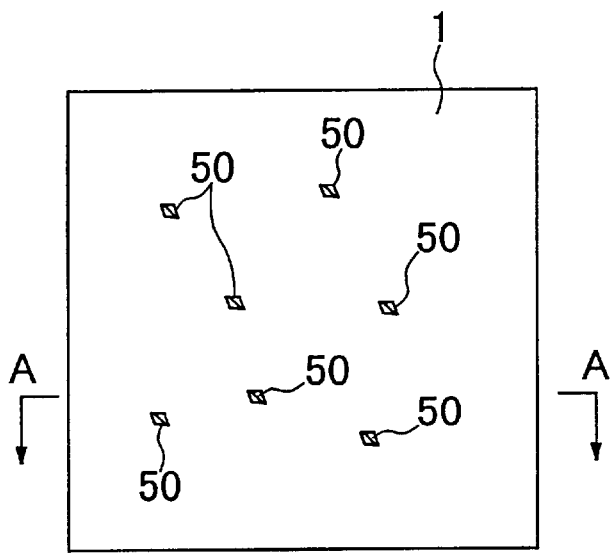
FIG. 23A is a plan view in the step of reclaiming a photomask according to another embodiment of the present invention.
Figure 23B:
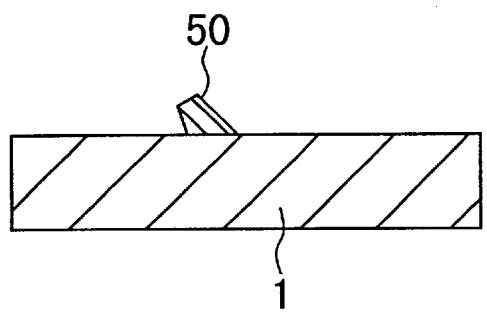
FIG. 23B is an enlarged sectional view of a main part along an A—A line in FIG. 23A.
Figure 24A:
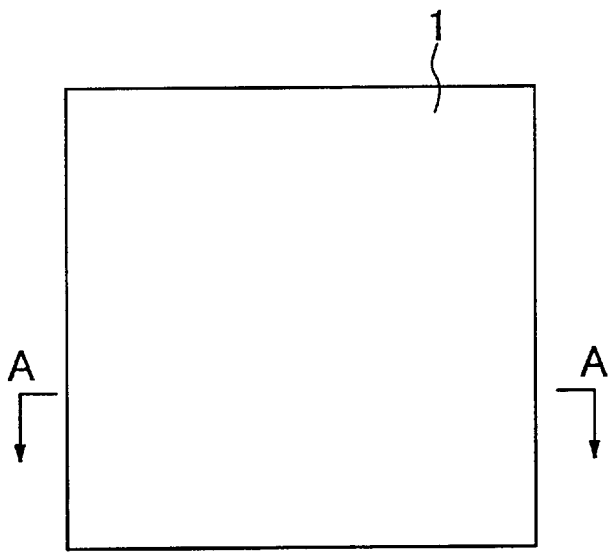
FIG. 24A is a plan view in the step of reclaiming a photomask according to another embodiment of the present invention.
Figure 24B:
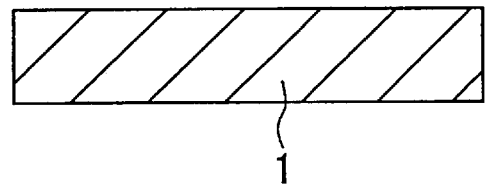
FIG. 24B is an enlarged sectional view of a main part along an A—A line in FIG. 24A.

The resist films (the shade patterns 3a and 3c to 3f or the shade film 3b) of the exposed masks M2a, M2b, and M2c were stripped by the same manner as that of the first embodiment as shown in FIGS. 23A and 23B, particles 50 were removed by cleaning, and as shown in FIGS. 24A and 24B, blanks constituted by the mask blanks 1 were reclaimed. In this cleaning process, cleaning using a 1-wt % hydrofluoric acid aqueous solution, cleaning using an ozone sulfuric acid, and brush scrubber were used. The concentration of 1 wt % of the hydrofluoric acid aqueous solution is only an example, and the concentration is not limited to 1 wt %. The concentration is set in consideration of the following case. That is, the concentration is so low that cleaning effect is deteriorated, and the concentration is so high that a glass surface (surface of the mask blanks 1) is coarsened to deteriorate the transmittance. When an amount of etching of the mask blanks 1 obtained by hydrofluoric acid cleaning is not specified, any problem is not posed. It is important that the mask blanks 1 obtained after the hydrofluoric acid cleaning process are baked at a temperature of, e.g., 200° C. or higher to evaporate fluorine adhered to the surface for the following reason. That is, when hydrofluoric acid remains on the surface of the mask blanks 1, the hydrofluoric acid reacts with a chemical-amplification-type photosensitive composition (resist film) when the mask is reused to deteriorate the resist shape, and delineation sensitivity is changed. This baking may be performed after the final cleaning is performed. When ozone sulfuric acid cleaning is performed, the substrate is advantageously cleaned with a mixture of ammonia and a hydrogen peroxide solution in advance because the substrate is not cloudy when the substrate is left.

Figure 25A:
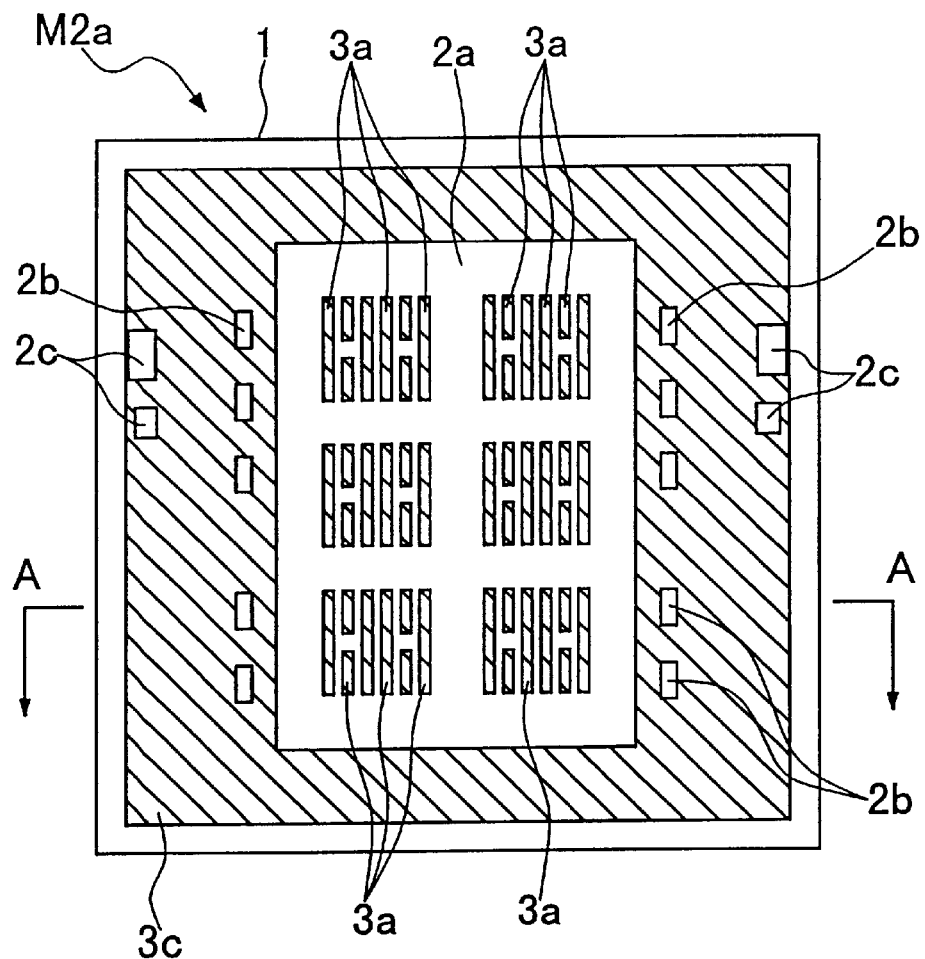
FIG. 25A is a plan view in the step of reclaiming a photomask according to another embodiment of the present invention.
Figure 25B:
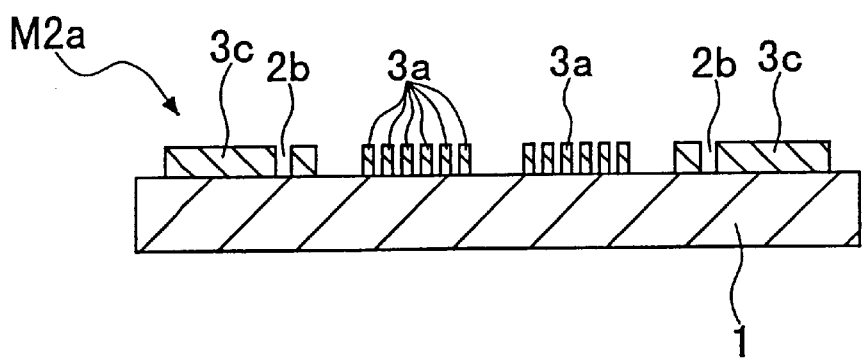
FIG. 25B is an enlarged sectional view of a main part along an A—A line in FIG. 25A.

As in the above description, the resist film 3 is coated on the mask blanks 1 shown in FIGS. 24A and 24B, and, as shown in FIGS. 25A and 25B, the shade patterns 3a and 3c (or the shade patterns 3d to 3f or the shade film 3b) constituted by the resist films are formed by performing mask pattern delineation and development to manufacture the mask M2a. In this case, such a case is illustrated that a shade pattern 3a having a shape or an arrangement which is different from that of the shade pattern 3a shown in FIGS. 18A to 18D is formed. As a matter of course, the same pattern as the shade pattern 3a shown in FIGS. 18A to 18D may be formed. In the description of the method of manufacturing and reclaiming (reusing) a mask, a case in which a shade pattern or a shade film is formed by a single resist film is explained. The methods can also be applied to a case in which the shade portion is constituted by a laminate film constituted by a photosensitive organic film and a photoabsorptive organic film.

According to this embodiment, the same effects as the effects (for example, the effects (1), (2), (4), and (5)) of the first embodiment can be obtained.

Third Embodiment

Figure 26A:
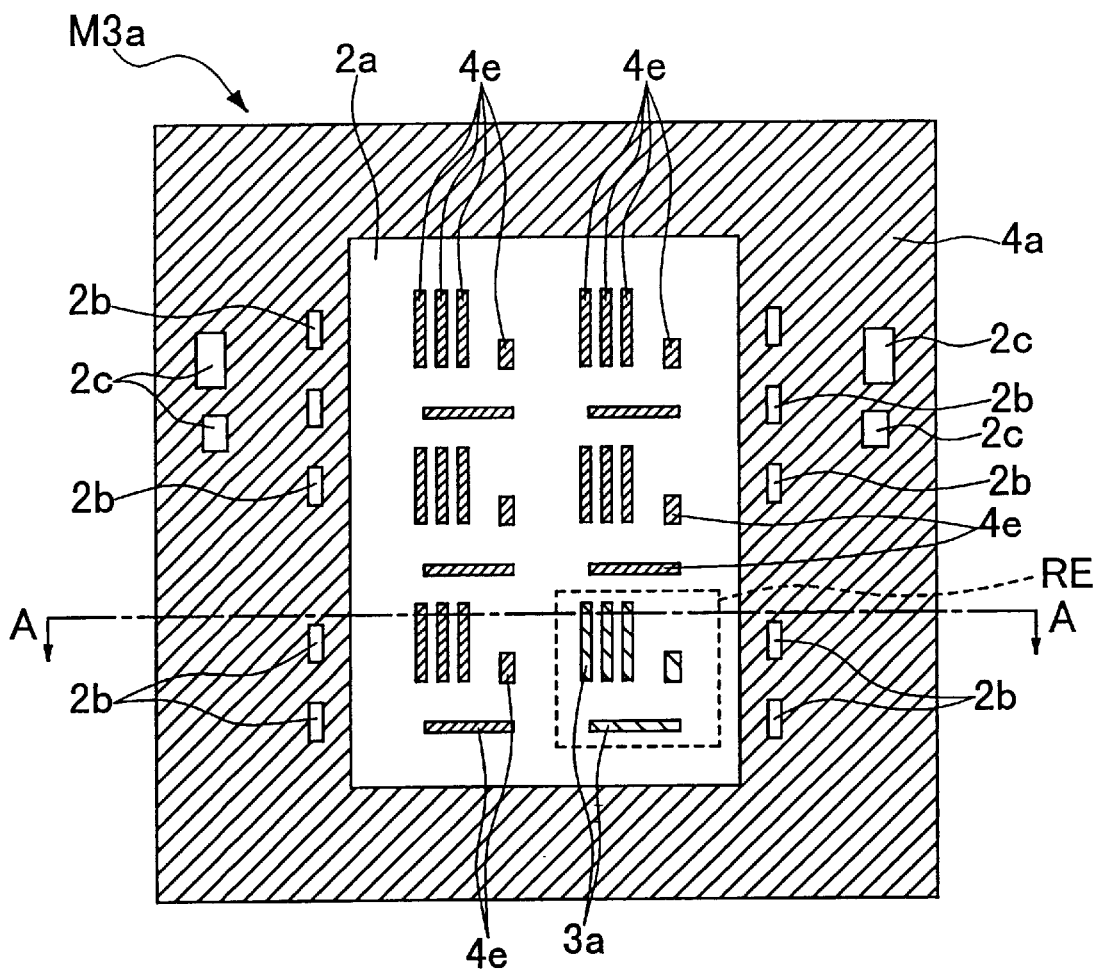
FIG. 26A is a plan view of a photomask according to still another embodiment of the present invention.

In this embodiment, a mask in which a shade pattern constituted by a resist film and a shade pattern made of a metal are formed in an integrated circuit pattern region of the mask will be described below. An example of the mask according to this embodiment will be described below with reference to FIGS. 26A and 26B to 28A to 28B. FIGS. 26A, 27A, and 28A are plan views of masks, and FIGS. 26B, 27B, and 28B show sectional views along A—A lines in FIGS. 26A, 27A, and 28A, respectively.

Figure 26B:
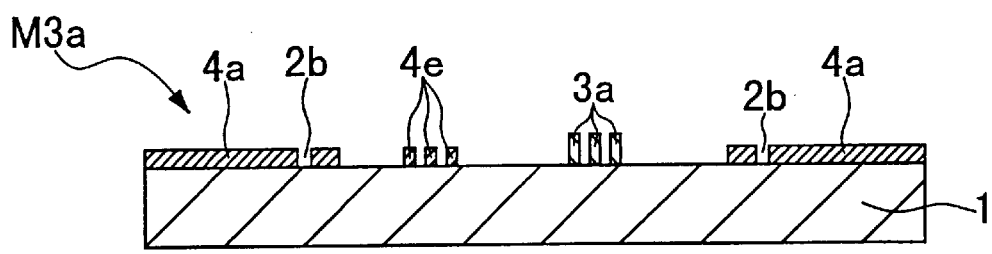
FIG. 26B is a sectional view along an A—A line in FIG. 26A.
Figure 27A:
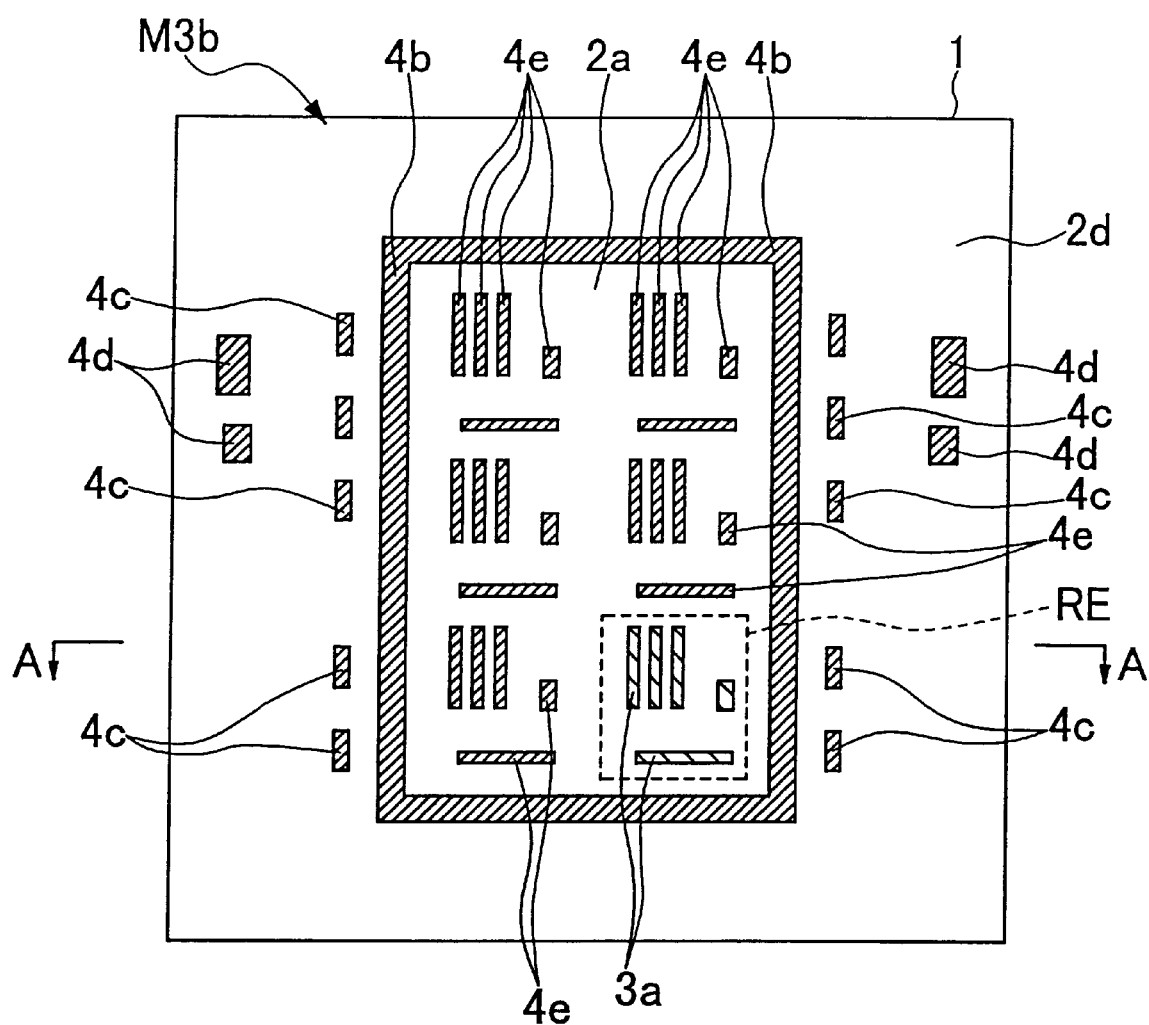
FIG. 27A is a plan view of a photomask according to still another embodiment of the present invention.

On a mask M3a shown in FIGS. 26A and 26B, both a shade pattern (first shade portion made of a metal) 4e made of a metal and a shade pattern 3a constituted by a resist film are formed in an integrated circuit pattern region of the first major surface of the mask blanks 1. In this case, the shade pattern 3a constituted by the resist film is partially (in only a region RE). The shade pattern 4e is formed such that a metal material is processed in pattern processing of the shade pattern 4a. In this case, a line pattern or the like is transferred on a wafer by the shade patterns 4e and 3a. In particular, the shade pattern 4e made of the metal is made into an IP in a pattern which is slightly corrected in design or process, a system LSL (Large Scale Integrated circuit), or the like, and is used as a pattern for transferring a generally used circuit portion. The shade pattern 3a constituted by the resist film is a pattern for transferring a circuit portion which can be easily changed and corrected. The other configuration of the mask M3a is the same as that of the mask M1a according to the first embodiment.

Figure 27B:
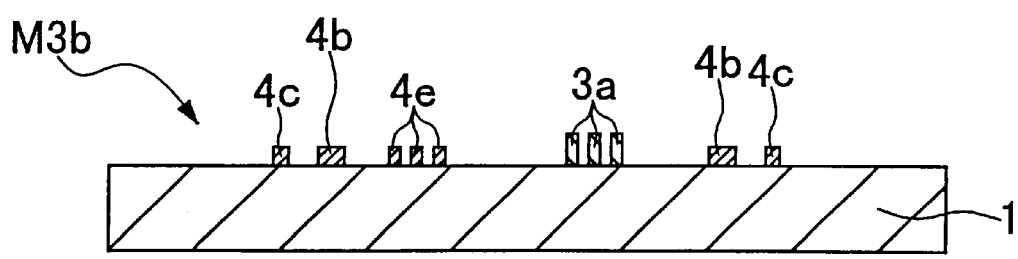
FIG. 27B is a sectional view along an A—A line in FIG. 27A.
Figure 28A:
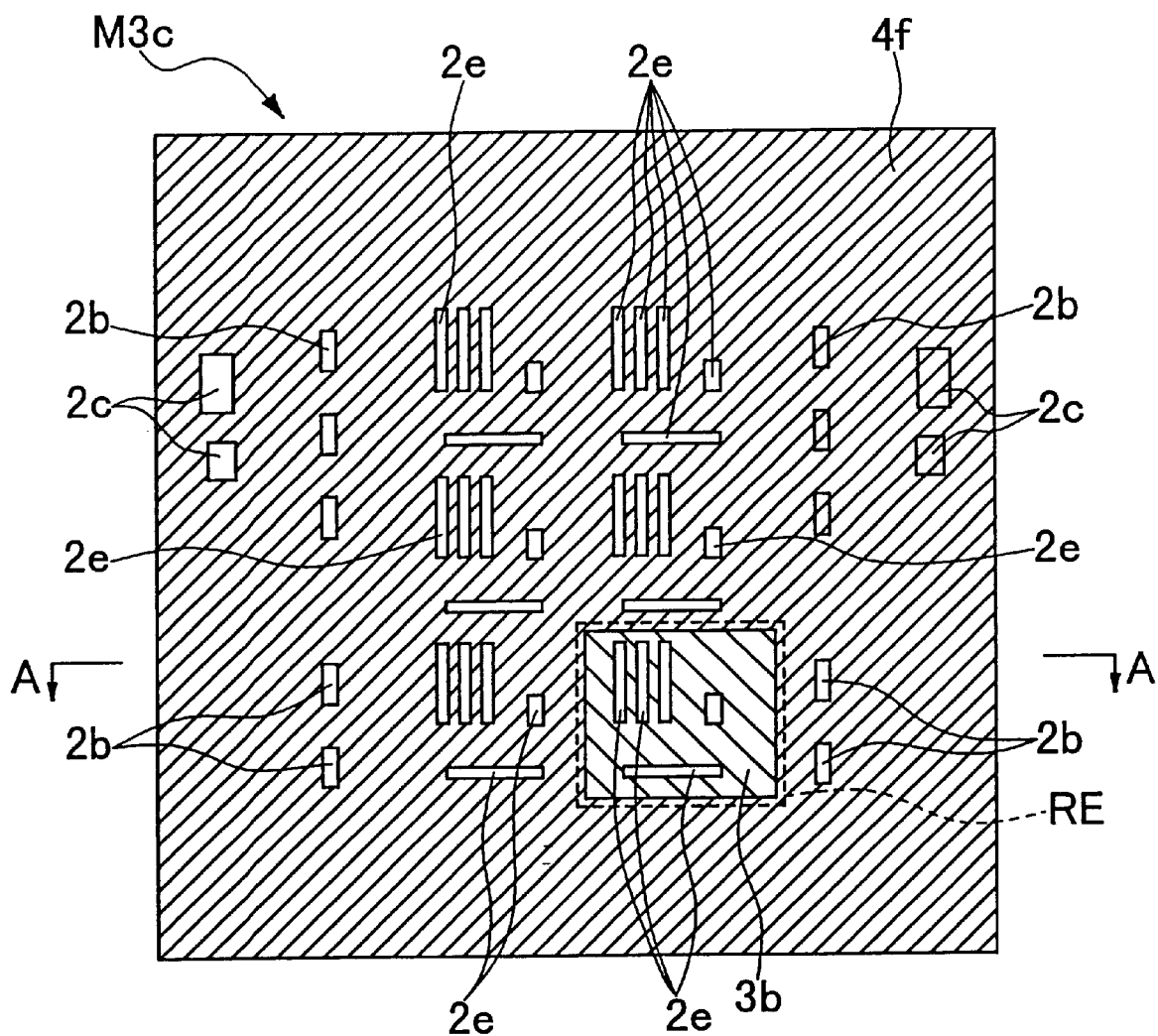
FIG. 28A is a plan view of a photomask according to still another embodiment of the present invention.
Figure 28B:
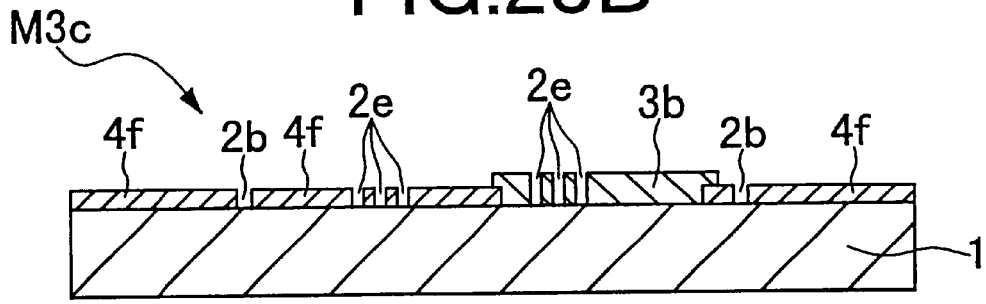
FIG. 28B is a sectional view along an A—A line in FIG. 28A.

Also in a mask M3b shown in FIGS. 27A and 27B, both a shade pattern 4e made of a metal and a shade pattern 3a constituted by a resist film are formed in an integrated circuit pattern region of the first major surface of the mask blanks 1. The shade pattern 4e is formed such that a metal material is processed in pattern processing of the shade patterns 4b to 4d. The other configuration of the mask M3b is the same as that of the mask M1b according to the first embodiment.

In addition, almost entire area of the first major surface, including the integrated circuit pattern region, of the mask blanks 1 on a mask M3c shown in FIGS. 28A and 28 is coated with a shade film 4f made of a metal. The shade film 4f comprises the same material as that of the shade pattern 4a. A part of the shade film 4f in the integrated circuit pattern region is removed to form a light-transmitting pattern 2e for transferring an integrated circuit pattern and a square light-transmitting region. The square light-transmitting region is coated with a shade film 3b. The shade film 3b is partially removed to form the light-transmitting pattern 2e onto which the integrated circuit pattern is transferred. The other configuration of the mask M3c is the same as that of the mask M1c of the first embodiment.

On these masks M3a, M3b, and M3c, the shade pattern 3a and the shade film 3b may be constituted by a single resist film as shown in FIG. 18C, and the shade pattern 3a and the shade film 3b may be constituted by a film obtained by stacking a photosensitive organic film 3a2 on a photoabsorptive organic film 3a1.

Figure 29:
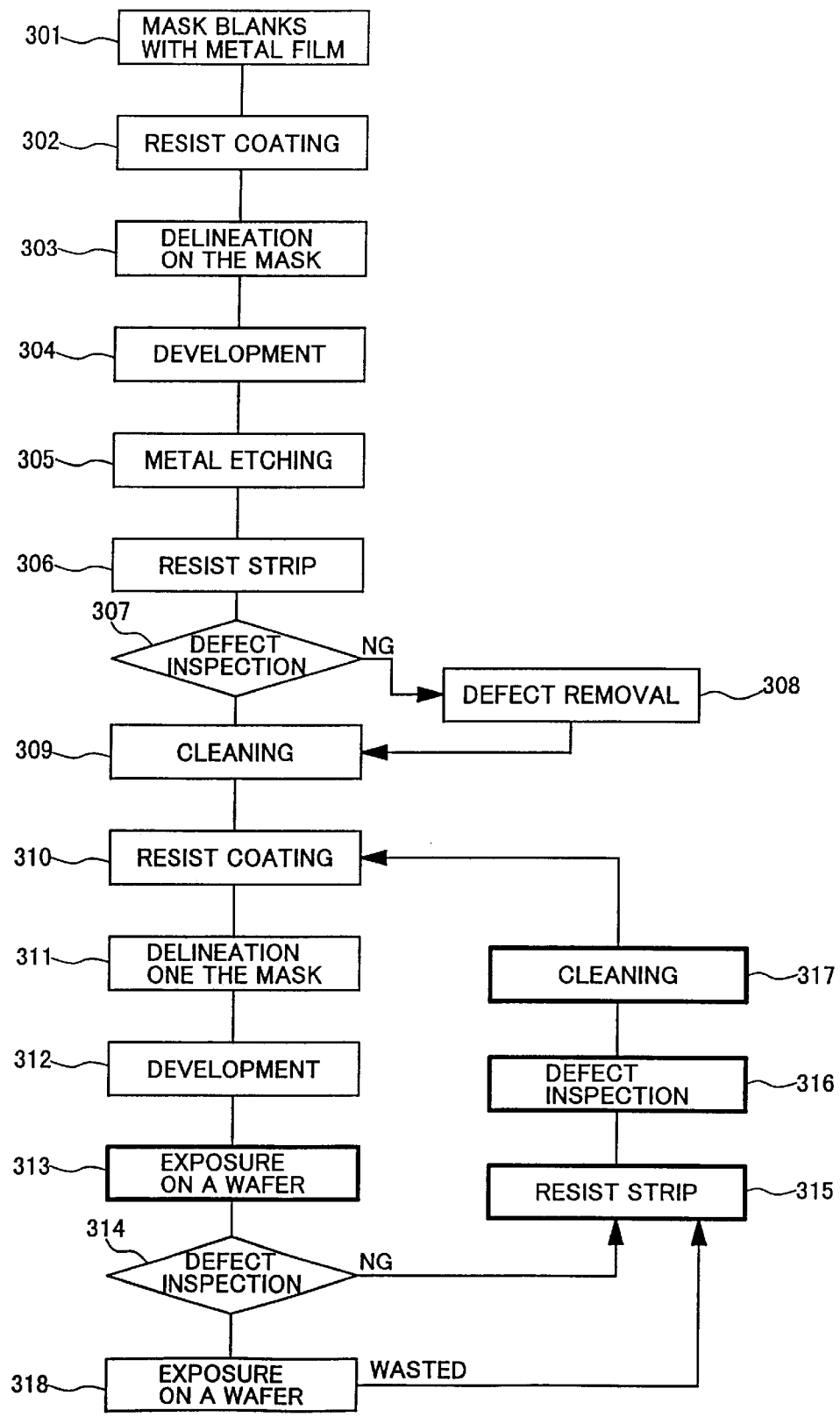
FIG. 29 is a flow chart of a technique for manufacturing a photomask according to still another embodiment of the present invention.

A method of manufacturing the masks M3a, M3b, and M3c, a method of using the masks, and a method of reclaiming (reusing) the masks will be described below along the flow chart in FIG. 29. FIGS. 30B to 37B are sectional views along A—A lines in FIGS. 30A to 37A, respectively.

Figure 30A:
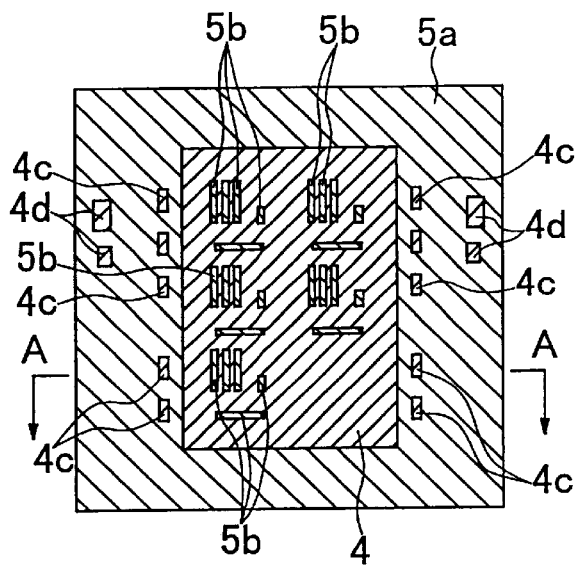
FIG. 30A is a plan view in a step in manufacturing a photomask according to still another embodiment of the present invention in FIG. 26.
Figure 30B:
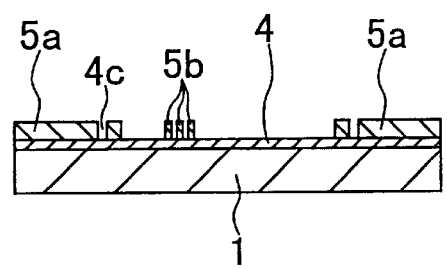
FIG. 30B is a sectional view along an A—A line in FIG. 30A.
Figure 31A:
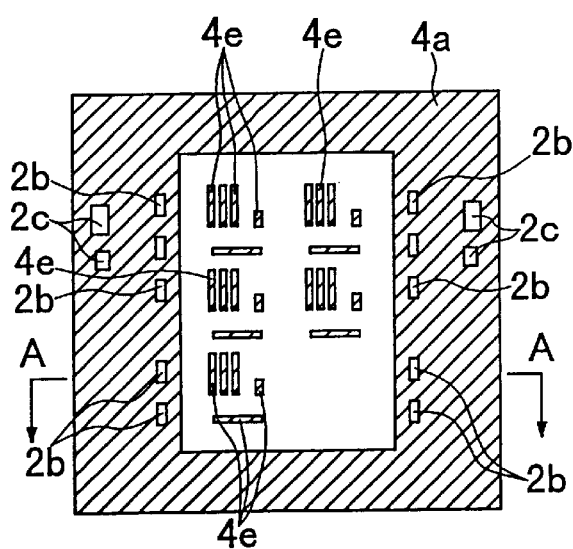
FIG. 31A is a plan view in a step in manufacturing a photomask according to still another embodiment of the present invention subsequent to the step in FIG. 30A.
Figure 31B:
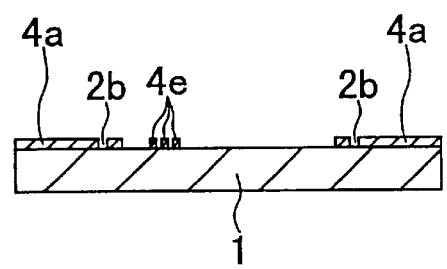
FIG. 31B is a sectional view along an A—A line in FIG. 31A.
Figure 32A:
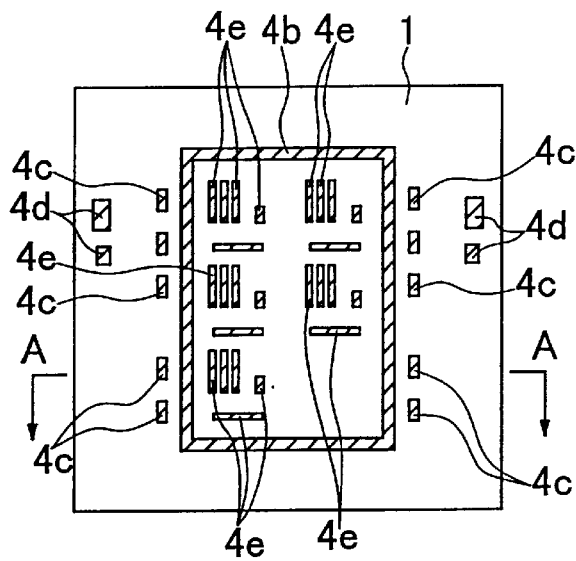
FIG. 32A is a plan view in a step in manufacturing a photomask according to still another embodiment of the present invention in FIGS. 27A.
Figure 32B:
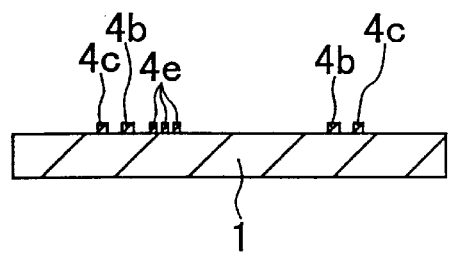
FIG. 32B is a sectional view along an A—A line in FIG. 32A.

As in the first embodiment described above, as shown in FIGS. 5A and 5B, blanks obtained by adhering a shade film 4 made of a metal to the entire surface of the first major surface of the mask blanks 1 are prepared (step 301). As shown in FIGS. 6A and 6B, after a resist film 5 is coated on the shade film 4 (step 302), pattern delineation and development are performed to form resist patterns 5a and 5b as shown in FIGS. 30A and 30B (steps 303 and 304). The resist pattern 5a is a mask pattern for forming the shade pattern 4a, and the resist pattern 5b is a mask pattern for forming the shade pattern 4e. Subsequently, after the shade film 4 made of a metal is etched by using the resist patterns 5a and 5b as masks (step 305), the resist patterns 5a and 5b are stripped (step 306) to form metal shade patterns 4a and 4e as shown in FIGS. 31A and 31B. This stage is the stage of a metal mask. The metal shade pattern 4a formed at this time is a pattern which covers the periphery of the integrated circuit pattern region, and light-transmitting patterns 2b and 2c for forming a reticle alignment mark, a base line adjustment mark, a wafer alignment mark, and the like are formed in the region of the shade pattern 4a. The metal shade pattern 4e formed in the integrated circuit pattern region is a pattern for transferring the integrated circuit pattern onto the wafer.

Figure 33A:
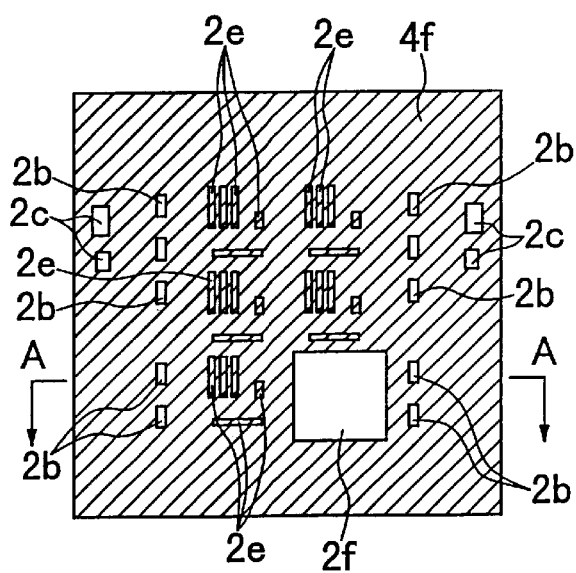
FIG. 33A is a plan view in a step in manufacturing a photomask according to still another embodiment of the present invention in FIGS. 28A.
Figure 33B:
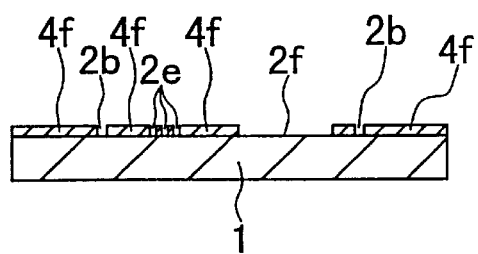
FIG. 33B is a sectional view along an A—A line in FIG. 33A.

FIGS. 32A and 32B and FIGS. 33A and 33B illustrate metal masks obtained through steps 301 to 306 by using the masks M3b and M3c, respectively. On the first major surface of the mask blanks 1 shown in FIGS. 32A and 32B, the shade pattern 4b made of a metal (shade film 4) and the shade patterns 4b to 4d for mask are formed in a peripheral region, and the shade pattern 4e made of a metal (shade film 4) is formed in the integrated circuit pattern region. The first major surface of the mask blanks 1 shown in FIGS. 33A and 33B is almost entirely coated with the shade film 4f. The shade film 4f is partially removed to form the light-transmitting pattern 2e for transferring an integrated circuit pattern, light-transmitting patterns 2b and 2c for marks, and a square light-transmitting pattern 2f.

Thereafter, as in the first embodiment, defect inspection is performed (step 307). If a defect is detected, defect correction is performed (step 308). If no defect is detected, the cleaning process is performed (step 309).

Figure 34A:
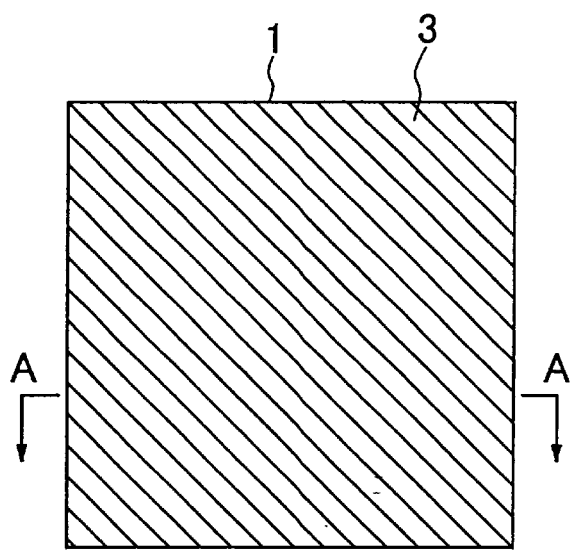
FIG. 34A is a plan view in a step in manufacturing a photomask according to still another embodiment of the present invention subsequent to the step in FIG. 31A.
Figure 34B:
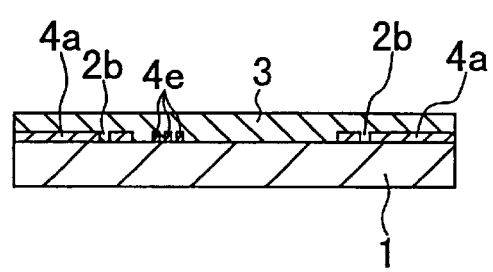
FIG. 34B is a sectional view along an A—A line in FIG. 34A.

Subsequently, as shown in FIGS. 34A and 34B, a resist film (photosensitive organic film) 3 having a thickness of about 150 nm is coated on the first major surface of the mask blanks 1 (metal mask) shown in FIGS. 31A and 31B (step 310). When the mask M3b is reclaimed, the resist film 3 is coated on a metal mask shown in FIGS. 32A and 32B. When the mask M2c is reclaimed, the resist film 3 is coated on a metal mask shown in FIGS. 33A and 33B. Mask pattern delineation and development are performed to form the shade pattern 3a or the shade film 3b constituted by the resist films shown in FIGS. 26A to 26D to FIGS. 28A and 28B, thereby manufacturing the masks M3a, M3b, and M3c (steps 311 and 312).

Thereafter, the patterns of the masks M3a, M3b and M3c are transferred onto wafers by using an exposure device (step 313), as in the first embodiment, and then the patterns on the wafers are subjected to defect inspection to check the presence/absence of mask defects (step 314). The defect inspection for the resist mask is not limited to test exposure as in the first embodiment. A method of inspecting defects of the masks M3a, M3b, and M3c without performing exposure may be employed (the method can be employed in defect inspection for resist masks (to be described later). If a fatal defect was detected, the resist film (the shade pattern 3a or the shade film 3b) was stripped (step 315), mask defect inspection was performed (step 316), and cleaning was performed (step 317). The shade pattern 3a, the shade film 3b, or the like constituted by the resist film was delineated again, and development was performed to manufacture the masks M3a, M3b, and M3c again. Thereafter, wafer exposure was performed to perform defect inspection (steps 313 and 314). The masks M3a, M3b, and M3c which had passed the defect inspection were used as masks for wafer exposure as in the first embodiment (step 318). When the masks are wasted, resist strip (step 315), defect inspection (step 316), and cleaning (step 317) were performed to returns the states of the mask to the states of the metal masks shown in FIGS. 31A and 31B to FIGS. 33A and 33B. Thereafter, by using the metal masks shown in FIGS. 31A and 31B to FIGS. 33A and 33B, masks each having another integrated circuit pattern obtained by correcting the design of the integrated circuit pattern or another integrated circuit pattern which is newly designed were produced through the resist coating step 310 to the defect inspection step 314 (through the resist strip step 310 to the defect inspection step 314 when correction was performed).

The reclaiming steps for returning the states of the resist masks (the masks M3a, M3b, and M3c) to the states of the metal masks will be described below with reference to FIGS. 35A and 35B to FIGS. 37A to 37B. Although the mask M3a will be mainly illustrated, the same processes as those performed to the mask M3a are performed to the other masks M3b and M3c.

Figure 35A:
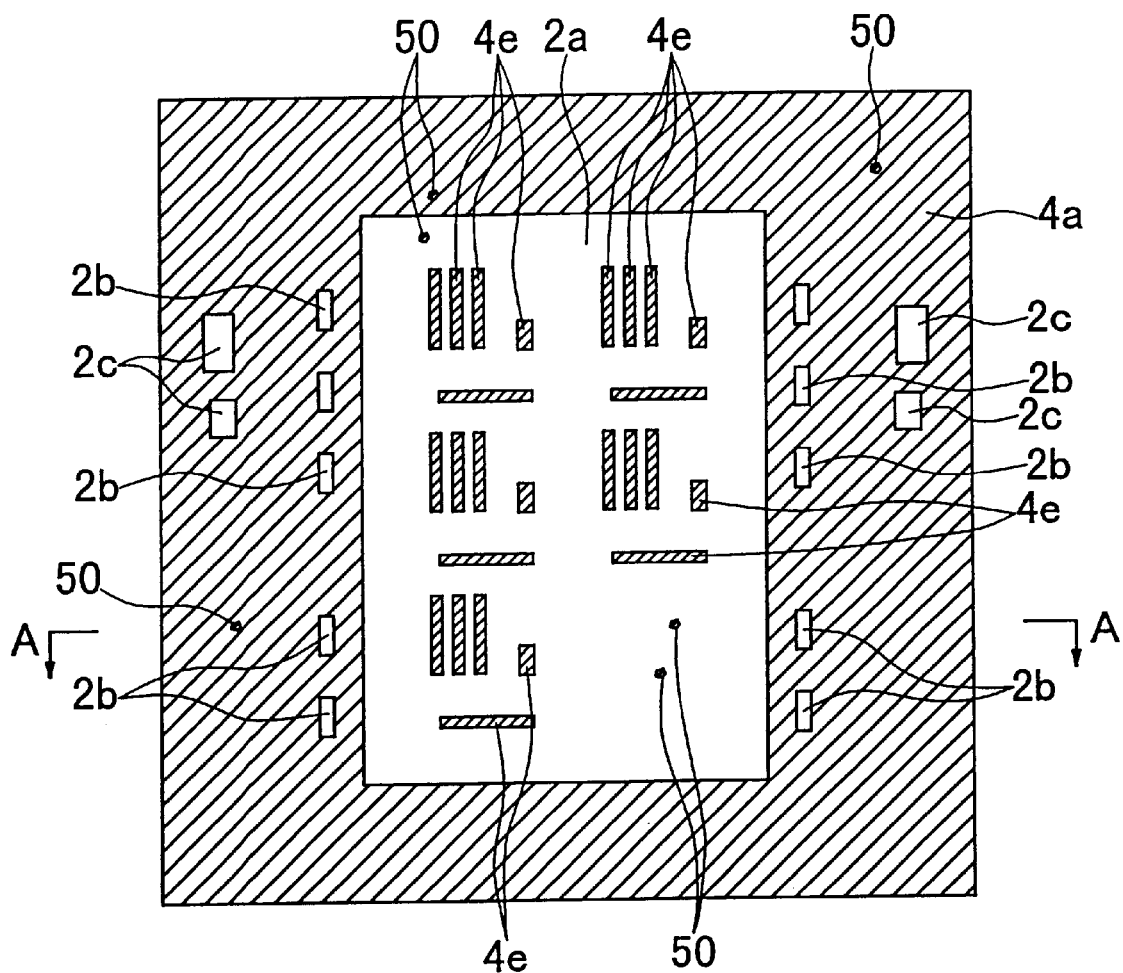
FIG. 35A is a plan view in the step of reclaiming a photomask according to still another embodiment of the present invention subsequent to the step in FIG. 31A.
Figure 35B:
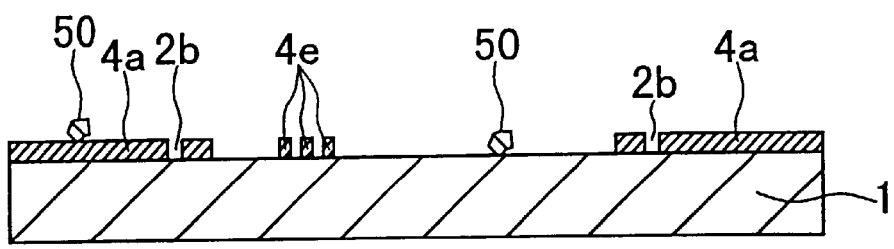
FIG. 35B is an enlarged sectional view of a main part along an A—A line in FIG. 35A.
Figure 36A:
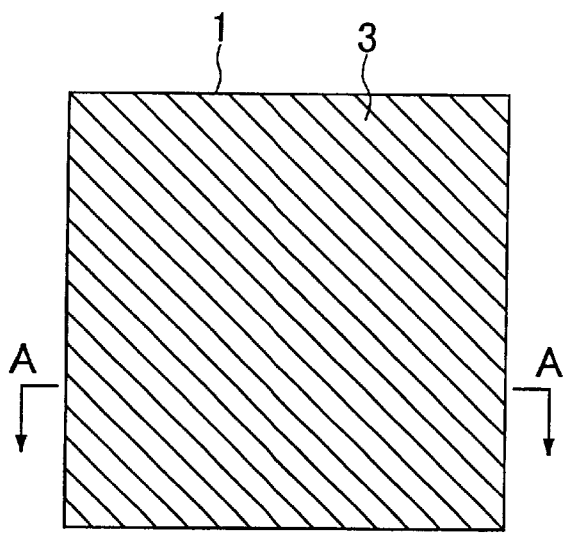
FIG. 36A is a plan view in the step of reclaiming a photomask according to still another embodiment of the present invention subsequent to the step in FIG. 35A.
Figure 36B:
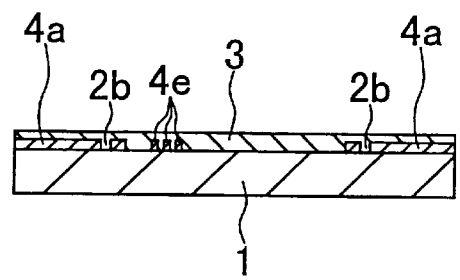
FIG. 36B is a sectional view along an A—A line in FIG. 36A.
Figure 37A:
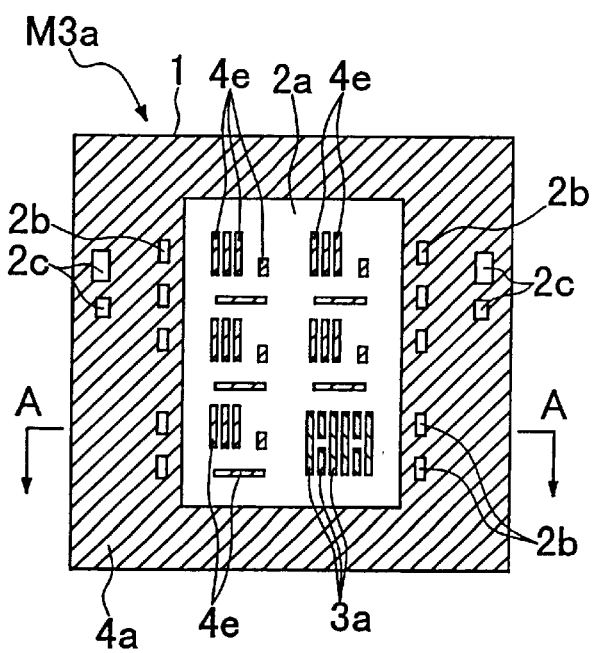
FIG. 37A is a plan view in the step of reclaiming a photomask according to still another embodiment of the present invention subsequent to the step in FIG. 35A.
Figure 37B:
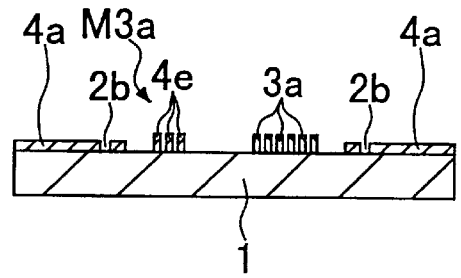
FIG. 37B is a sectional view along an A—A line in FIG. 37A.

The shade pattern 3a (the shade film 3b in the mask M3c) constituted by a resist film was stripped from the exposed mask M3a by the same manner as in the first embodiment as shown in FIGS. 35A and 35B. The metal shade pattern 4e is left in the integrated circuit pattern region of the mask M3a. Subsequently, a cleaning process is performed to remove particles 50 on the surface of the metal mask as in the first and second embodiments. In this manner, the mask is reclaimed in the state of the metal mask shown in FIGS. 31A and 31B. Thereafter, as shown in FIGS. 36A and 36B, as in the first embodiment, the resist film 3 is coated on the first major surface of the mask blanks 1 (metal mask) shown in FIGS. 31A and 31B to FIGS. 33A to 33B, mask pattern delineation and development are performed to form the shade pattern 3a (shade film 3b in the mask M3c) constituted by a resist film, thereby manufacturing the mask M3a. In this case, such a case is illustrated that a shade pattern 3a having a shape or an arrangement which is different from that of the shade pattern 3a shown in FIGS. 26A to 26B is formed. As a matter of course, the same pattern as the shade pattern 3a shown in FIGS. 26A and 26B may be formed. In the description of the method of manufacturing and reusing a mask, a case in which a shade pattern or a shade film is formed by a single resist film is explained. The methods can also be applied to a case in which the shade portion is constituted by a laminate film constituted by a photosensitive organic film and a photoabsorptive organic film.

According to this embodiment, in addition to the effects (for example, the effects (1), (2), (3), and (5)) of the first embodiment, the following effect can be obtained.

More specifically, only a part of the mask pattern is reclaimed, pattern delineation which occupies the most of the mask cost can be considerably reduced. A small number of masks of many types are frequently used in a system LSI. On the other hand, the system LSI includes a large number of circuit patterns made into IPs, this effect is specially great.

When a wiring layer is partially changed, the effect is specially advantageous.

Fourth Embodiment

The fourth embodiment describes a modification of the third embodiment. The third embodiment illustrates a case in which all shade patterns in one region in an integrated circuit pattern region of a mask are formed by resist films.

However, the arrangement of a shade pattern of a resist film on a mask is not limited to the arrangement of the third embodiment. The shade pattern may be arranged like a shade pattern 3a of a resist film shown in FIG. 38A. This mask M4 has a structure in which a metal shade pattern 4e is connected to the shade pattern 3a of the resist film to make it possible to transfer an integrated circuit pattern onto a wafer. Such a mask M4 is effectively used when wiring paths are switched by a manner of arrangement of the shade pattern 3a of the resist film, for example, in a change of wiring paths depending on a modification or change of electric characteristic values in development of a semiconductor integrated circuit device, a change of wiring paths in a redundant circuit configuration.

Figure 38A:
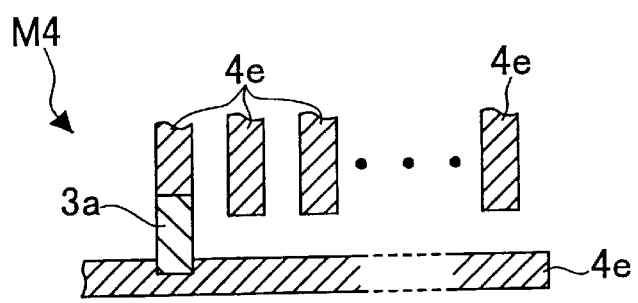
FIG. 38A is a plan view of a main part of a photomask according to a different embodiment of the present invention.
Figure 38B:
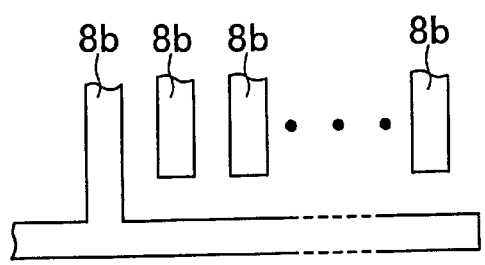
FIG. 38B is a plan view of a pattern transferred by the step in FIG. 38A.
Figure 38C:
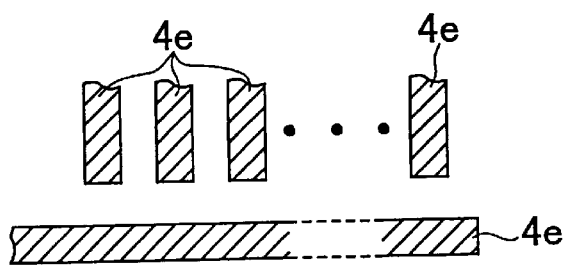
FIG. 38C is a plan view of a main part in the step of performing a reclaiming process of the photomask in FIG. 38A.
Figure 38D:
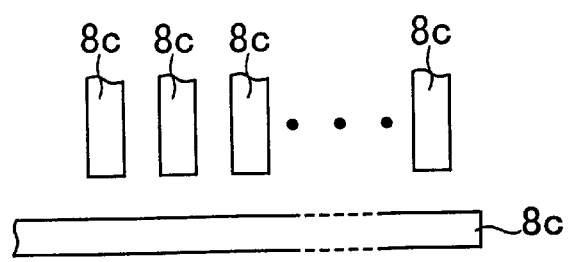
FIG. 38D is a plan view of a pattern transferred by the photomask in FIG. 38C.

FIG. 38B shows a conductive film pattern 8b (integrated circuit pattern) transferred onto a wafer by the mask M4 in FIG. 38A. FIG. 38C shows the state of a metal mask from which the shade pattern 3a in FIG. 38A is removed by performing the reclaiming process. FIG. 38D typically shows a conductive film pattern 8c obtained when a pattern is transferred on to a wafer by using the metal mask in FIG. 38C.

In the fourth embodiment, in addition to the effects obtained in the third embodiment, the following effects can also be obtained.

(1). By a mask reclaiming process, an extremely partial modification or change in an entire integrated circuit pattern can be easily performed within a short period of time. Therefore, a period of time required for manufacturing a mask can be considerably shortened.

(2). By performing a mask reclaiming process, the cost of materials, the cost of steps, and the cost of fuel can be made considerably smaller than those obtained when a mask is totally manufactured again from the start in extremely partial change or modification of the mask.

(3). By a mask reclaiming process, resources can be effectively utilized.

Fifth Embodiment

In this embodiment, a technique for coating metal shade patterns with protective films in the masks according to the first, third, and fourth embodiments will be described below.

In the present invention, since the mask is reused as described above, the metal shade pattern requires certain resistance. In this embodiment, the metal shade pattern is covered with a protective film. In this manner, since the metal can be protected in a strip process of a shade pattern of the resist film in the mask or a mask cleaning process, the resistance of the shad pattern made of the metal can be improved. For this reason, since the number of times of reusing of a mask can be increased, resources can be effectively utilized. In addition, the cost of a mask can be further reduced. Chromium which is generally used as the material of a shade film of a normal mask can also be used as the material of a shade film.

Figure 39A:
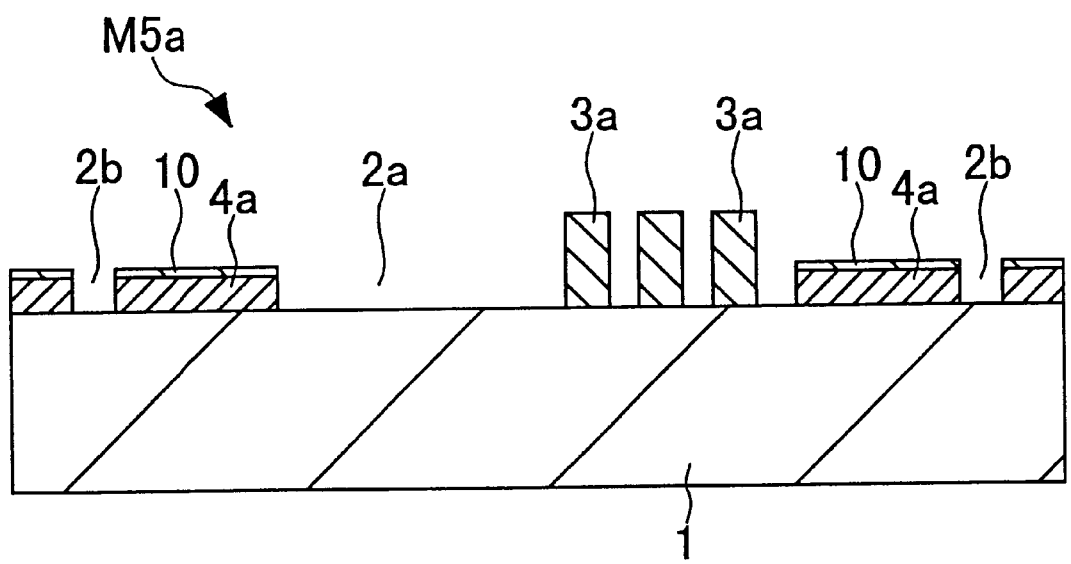
FIG. 39A is a sectional view of a photomask according to a further different embodiment of the present invention.
Figure 39B:
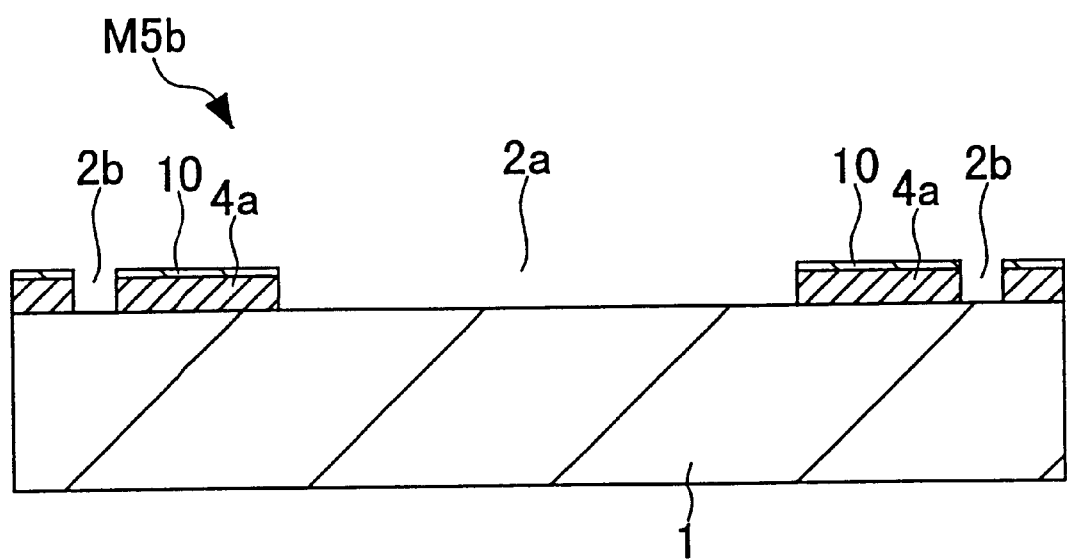
FIG. 39B is a sectional view in the step of performing a reclaiming process of the photomask in FIG. 39A.

FIG. 39A shows a concrete example of the section of the mask M5a. FIG. 39A illustrates a case in which a protective film 10 is adhered to only the upper surface of a shade pattern 4a. A metal frame (shade pattern 4a) or the like is preferably a metal frame of an upper protective type obtained by a sputtering method which generates a small number of defects. The protective film 10 is formed as follows. That is, a shade film is deposited on mask blanks 1 by a sputtering method, the protective film 10 is deposited on the shade film by a sputtering method or the like, and the protective film 10 and the shade film are patterned. FIG. 39B shows a state of a metal mask on a reclamation initial stage after a shade pattern 3a of a resist film is removed. In order to form a new shade pattern, as in the first embodiment, a resist film forming a shade pattern may be coated, a pattern may be delineated by using an electron beam, an ultraviolet ray, or the like, and a development process may be performed.

Figure 40A:
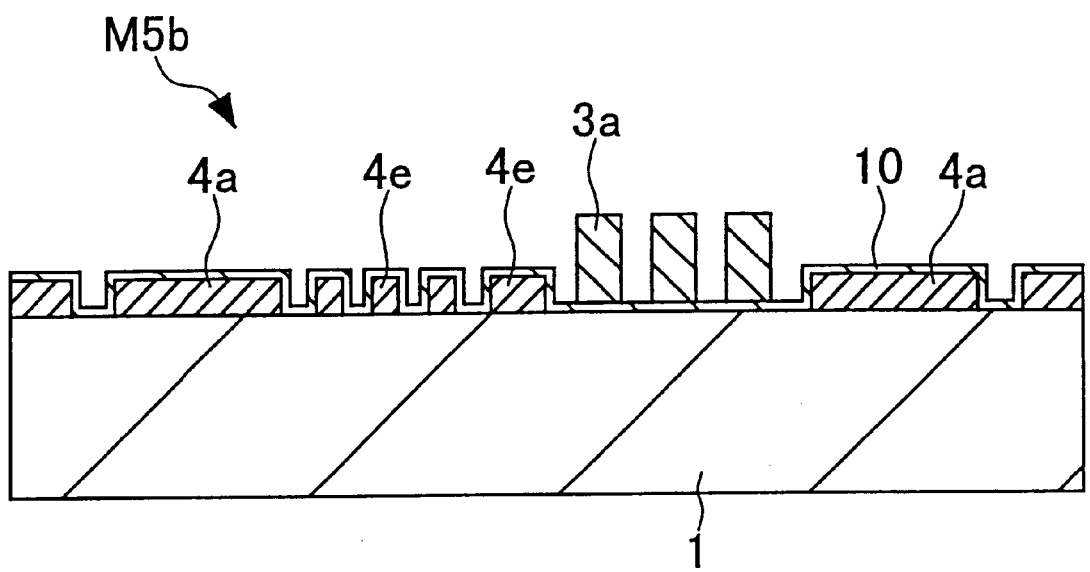
FIG. 40A is a sectional view of a photomask according to a further different embodiment of the present invention.
Figure 40B:
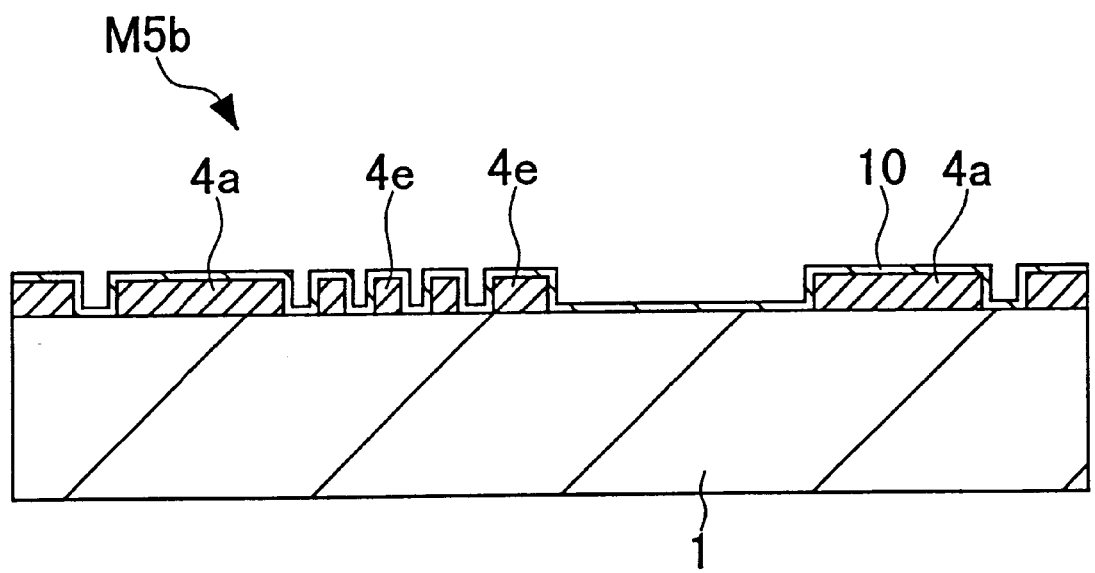
FIG. 40B is a sectional view in the step of performing a reclaiming process of the photomask in FIG. 40A.

FIG. 40A shows a concrete example of the section of another mask M5b. FIG. 40A illustrates a case in which a protective film 10 is adhered to the surfaces of shade patterns 4a and 4e (i.e., the upper surfaces and the side surfaces of the shade patterns 4a and 4e) and the first major surface of mask blanks 1. When the fine shade pattern 4e for transferring an integrated circuit pattern is protected, a protective film of an entire coating type is preferably used. The protective film 10 used in this case is formed by, e.g., a CVD method, a sputtering method, or the like after the shade patterns 4a and 4e are patterned. A shade pattern 3a of a resist film is patterned and formed on the protective film 10. FIG. 40B shows a state of a metal mask on a reclamation initial stage after the shade pattern 3a of the resist film of FIG. 40A is removed. A reclaiming method is the same as that described above.

As the protective film 10, for example, a titanium oxide film was used. In addition, an alumina film may be used. These films have good resistance to chemicals or oxygen ashing. When the protective film 10 was adhered, resistance to oxygen plasma ashing or resistance to ozone sulfuric acid could be remarkably improved, and the number of times of reclamation which could be performed could be increased. As the material of the protective film 10, a silicon oxide film can also be used. This structure can also be applied to any masks according to the first, third, and fourth embodiments.

Sixth Embodiment

Figure 41:
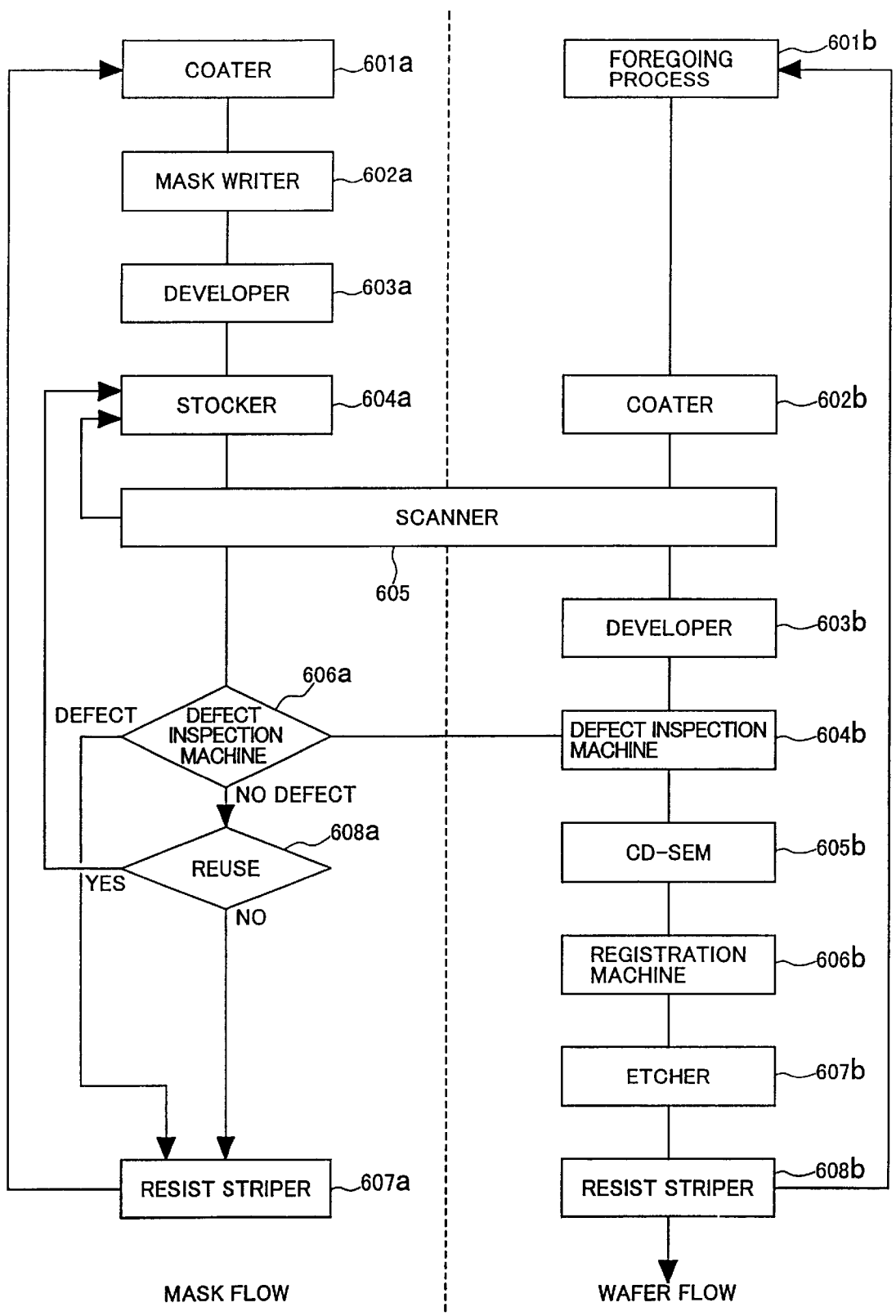
FIG. 41 is a flow chart for manufacturing a photomask and a semiconductor wafer according to another different embodiment of the present invention.

This embodiment describes a technique for sharing a configuration by steps in manufacturing a mask, steps in reusing a mask, and steps in manufacturing a semiconductor integrated circuit device. The embodiment illustrates a case in which a mask and a wafer are processed in the same clean room. This case will be described below with reference to FIG. 41.

The flow of a mask will be described below. A resist film for forming a shade pattern is coated on the blanks by a coater, and mask delineation is performed by delineation device (steps 601a and 602a). Subsequently, development is performed, and a produced masks (resist masks) is stored in a stocker (steps 603a and 604a). After the pattern of the mask is exposed on a wafer by a scanner (exposure device) (step 605), and the presence/absence of a mask defect is decided (step 606a). If a defect is detected, the shade pattern of the resist film is stripped (step 607a), and the flow returns to the resist coating step performed by the coater to form a shade pattern of a resist film (step 601a). When the mask used in wafer exposure is to be used later, the mask is returned to the stocker (step 608a). When the mast is not to be used later, the shade pattern of the resist film is stripped (step 607a), and the mask is utilized as reclaimed blanks.

On the other hand, after a process such as a process of forming a coating is performed in a foregoing process (wafer process) (step 601b), a resist film is coated by a coater (step 602b), and exposure is performed by the mask with a scanner (step 605). After a resist pattern is formed by performing development (step 603b), and defect inspection is performed on the wafer to separate a mask defect from a defect caused by a wafer process (step 604b). When a defect is detected, the information is supplied to the mask side. On the mask side, it is checked whether a defect exists on the mask or not. When the defect is detected, as described above, the shade pattern of the resist film on the mask is stripped, and a shade pattern of a resist film is formed (steps 606a and 607a and steps 601a to 604a). After the defect inspection (step 604b) on the wafer side, wafer inspection is performed by using length measuring SEM (Scanning Electron Microscope), registration machine, and the like (steps 605b and 606b). An etching using the resist pattern on the wafer as a mask or a process of implanting an impurity is performed, and the resist film is stripped to shift the control flow to the next step (steps 607b and 608b).

In this flow, the scanner is shared in the same clean room, and defect inspection information or the like is shared through an information transmission means such as cable, wireless, or optical communication or a storage medium. Another device is used to strip the resist film. This is because a wafer made of silicon and blanks having a main portion made of quartz glass are different from each other in weight and shape, because a carrier system cannot be easily applied to the wafer and the blanks, and because the wafer and the blanks have considerably different specific heats.

According to this embodiment, in addition to the effects obtained in the first to sixth embodiments, the following effects can be obtained.

(1). The configuration is shared by the steps in manufacturing a mask, the step in reusing a mask, and the steps in manufacturing a wafer, so that steps related to each other can be integrally managed.

(2). Pieces of information obtained in the respective steps can be effectively utilized in other steps by the above sharing.

(3). According to the item (2), defect correction or a change in design can be performed at, e.g., an early stage. For this reason, useless materials and useless steps can be reduced.

(4). According to the item (1), (2), or (3), manufacturing efficiency of a mask and a semiconductor integrated circuit device can be made higher than that obtained when the respective steps are independently managed.

(5). According to the items (1) to (4), a development period and a manufacturing period of a semiconductor integrated circuit device can be shortened.

(6). According to the items (3) and (4), the cost of a semiconductor integrated circuit device can be reduced.

Seventh Embodiment

In general, mask substrates (or blanks) comprise different materials depending on exposure wavelengths to be used, and the mask substrates are classified by ranks depending on the degrees of flatness of the surfaces of the mask substrates. For example, a glass for an i beam (wavelength of 365 nm) or a KrF excimer laser, a glass for an ArF excimer laser, and a glass for an $F_2$ excimer laser contain different contents of OH or different processes. The difference exhibits as a difference of irradiation resistances. The types and qualities of the glasses cannot be easily discriminated from each other by simple measurement of transmittances or the like, but can be discriminated by expensive analysis of material composition states or the like.

It is supposed that a normal mask is reclaimed, a pattern portion made of chromium is stripped, and glass polishing is performed to return the mask to a pure glass plate (mask substrate). For this reason, it is difficult to decide a wavelength to which the reclaimed mask substrate corresponds. This is because mask information for specifying a wavelength or the like is also erased. In addition, the degree of flatness of the mask substrate is important because transfer performance is dependent on the degree of flatness. However, since the glass polishing is performed, the state before the reclamation is different from the state after the reclamation, and the degree of flatness must be measured again. According to this, the degree of flatness is high before the reclamation, but the degree of flatness may be low. Classification of the degrees of flatness is performed by a selection method, and a rate of appearance of mask substrates (blanks) having high degrees of flatness is low. A method of reclaiming a mask has the above problem.

Figure 42:
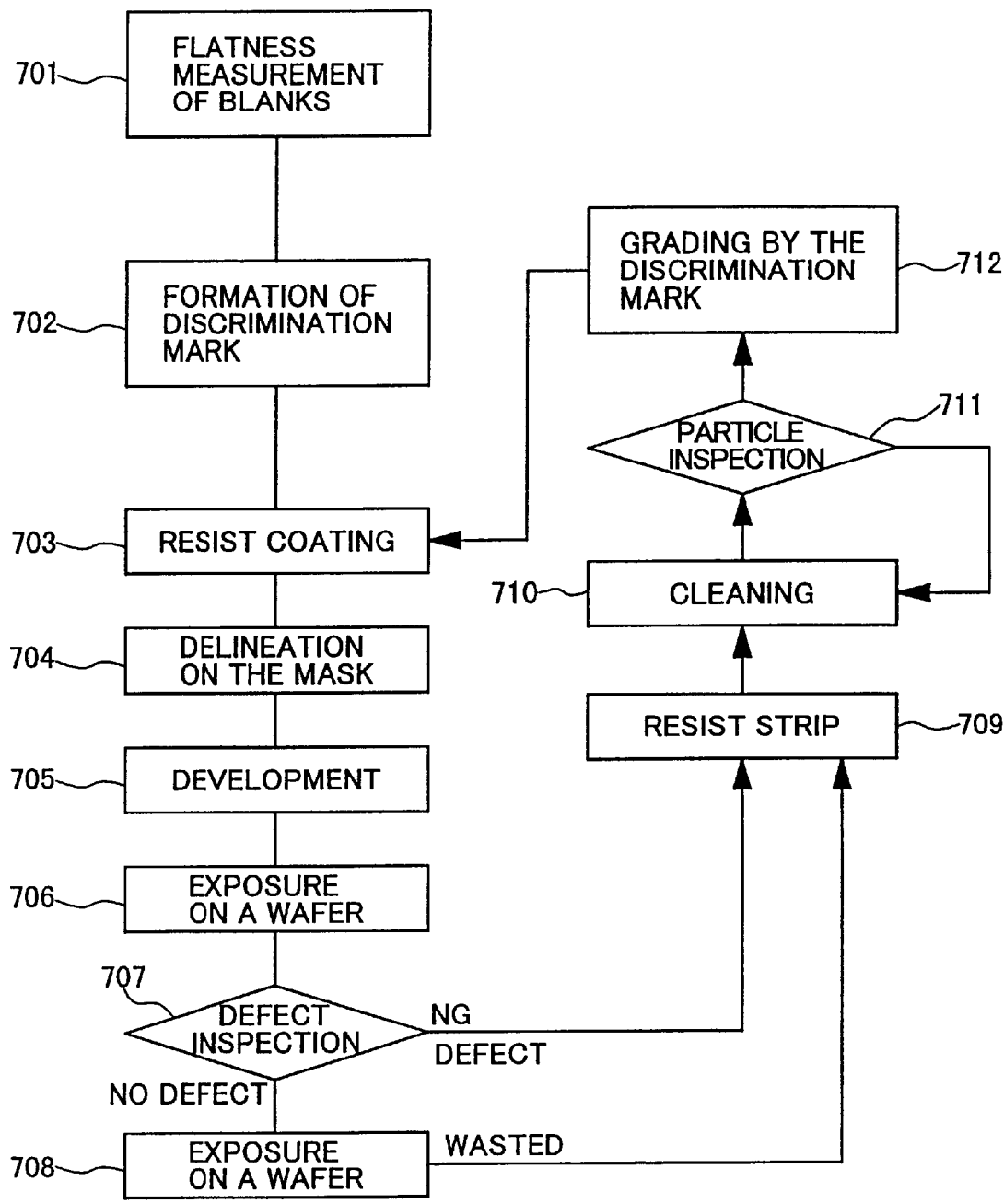
FIG. 42 is a flow chart for manufacturing a photomask and a semiconductor wafer according to still another different embodiment of the present invention.

In this embodiment, a method of solving the above problems is provided. The embodiment will be described below by using FIG. 42 showing a reusing procedure of a mask and FIGS. 43A and 43B and FIGS. 44A and 44B showing the structures of blanks.

The degree of flatness of glass blanks is measured (step 701). Subsequently, for example, pieces of information such as a management number, the degree of flatness, and a suitable exposure wavelength are written in a metal frame in place of marks such as a character, a sign, and a bar code (step 702).

Figure 43A:
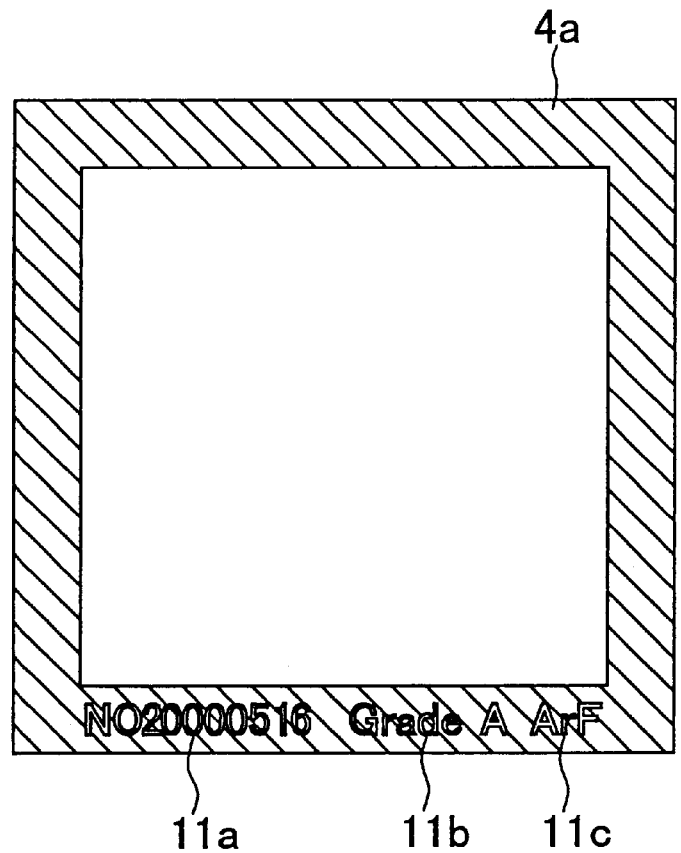
FIG. 43A is a plan view of a photomask according to still another different embodiment of the present invention.
Figure 43B:
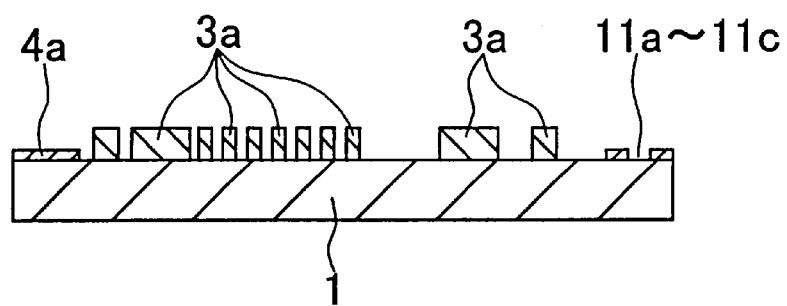
FIG. 43B is a sectional view of the photomask in FIG. 43A.

FIG. 43A is a plan view of blanks, and FIG. 43B is a sectional view of the blanks. FIGS. 43A and 43B illustrate a case in which a management information 11a, a quality information 11b such as the degree of flatness, and a mask information pattern (blanks information pattern) such as a suitable exposure wavelength information 11c are expressed with characters by partially removing the metal frame (shade pattern 4a). In this case, the case in which pieces of information are written in the metal frame (shade pattern 4a) is illustrated, and a metal pattern is formed in a light-transmitting region on the mask blanks 1, so that these pieces of information may be written.

Figure 44A:
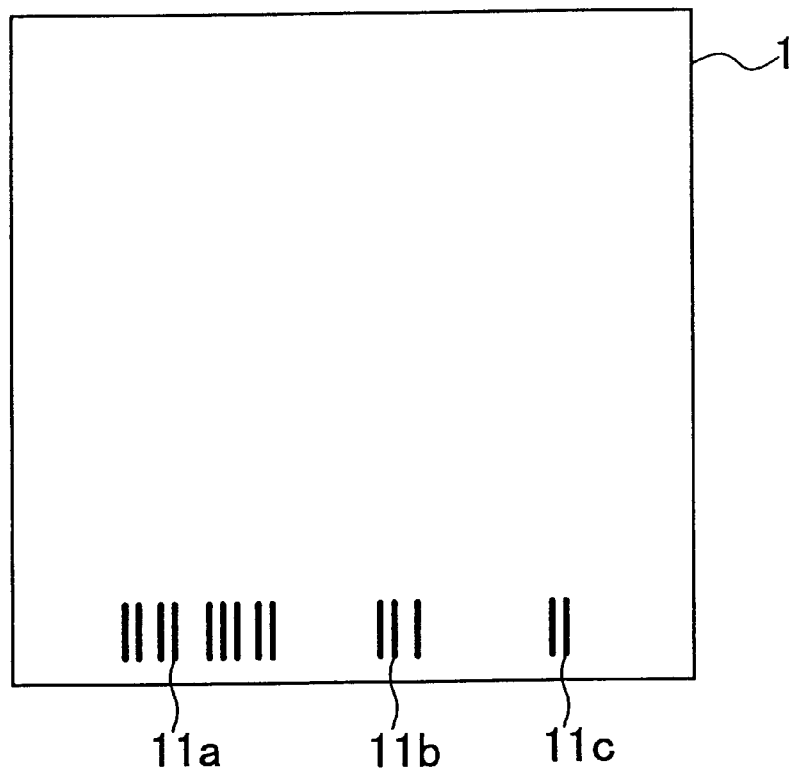
FIG. 44A is a plan view of another photomask according to still another different embodiment of the present invention.
Figure 44B:
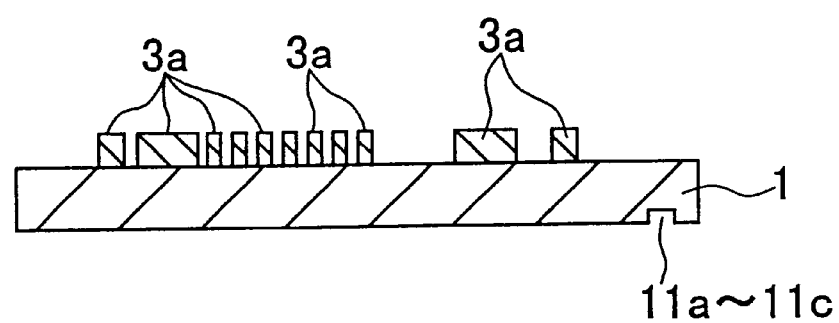
FIG. 44B is a sectional view of the photomask in FIG. 44A.

FIG. 44A is a plan view of other blanks, FIG. 44B is a sectional view of the blanks. FIGS. 44A and 44B illustrate blanks which do not use a metal and a case in which the management information 11a, the quality information 11b such as the degree of flatness, and the mask information pattern such as the suitable exposure wavelength information 11c are formed by partially forming a trench in a peripheral region of the second major surface of the mask blanks 1. As the mask information pattern, a bar code was used. When the trench is formed in the mask blanks 1, it is preferable that the trench is formed in the second major surface opposing the pattern surface (first major surface) because uneven coating or the like of a resist film for forming a shade pattern is not easily generated. However, the trench must not be formed in the absorptive surface of an exposure device. In FIGS. 44A and 44B, although both a trench expression and a metal print are used, one of them may be used.

After the step of forming a discrimination mark, a resist film for forming a shade pattern (step 703), and a mask pattern is delineated (step 704). Development is performed to form a shade pattern constituted by a resist film on the blanks (step 705), thereby manufacturing a mask (resist mask). Subsequently, as in the first embodiment, defect inspection is performed by wafer exposure using the mask (steps 706 and 707), and wafer exposure is performed (step 708). Shade patterns constituted by resist films are removed from mask which does not pass the defect inspection and a mask which is wasted in wafer exposure, the masks are subjected to cleaning and particle check (steps 709 to 711), classified by applications and grades on the basis of the mask information patterns described above, and stored and managed (step 712). Reclaimed blanks depending on an application or a necessary grade are out of the stocker, and a reclaimed mask (resist mask) is produced again from the step of coating a resist film (step 703) according to the procedure.

According to this embodiment, in addition to the effects obtained in the first to sixth embodiments, the following effects can be obtained.

More specifically, since a structure in which mask information is not removed in the reclaiming step is employed, reproduced blanks corresponding to an application and quality can be efficiently supplied. In this reclaiming step, polishing is not used, the degree of flatness of the blanks is not changed. The information of the degree of flatness in production can be used from a management number or the like, the degree of flatness may not be necessarily measured again. For this reason, blanks having high quality can be extremely easily provided within a short period of time. More specifically, the blanks can be repeatedly used without newly obtaining high-quality blanks having the high degree of flatness. When the mask information such as a management number or the like, a specific reclaimed blanks can be supplied to a specific company. When the mask information such as a management information, information inherent in blanks such as a reticle alignment arrangement accuracy or a flatness in-surface distribution can be preferably managed.

Eighth Embodiment

In the eighth embodiment, a case in which the spirit and scope of the present invention is applied to a method of manufacturing a semiconductor integrated circuit device having a CMIS (complementary MIS) circuit of, e.g., a twin well system will be described below.

Figure 45:
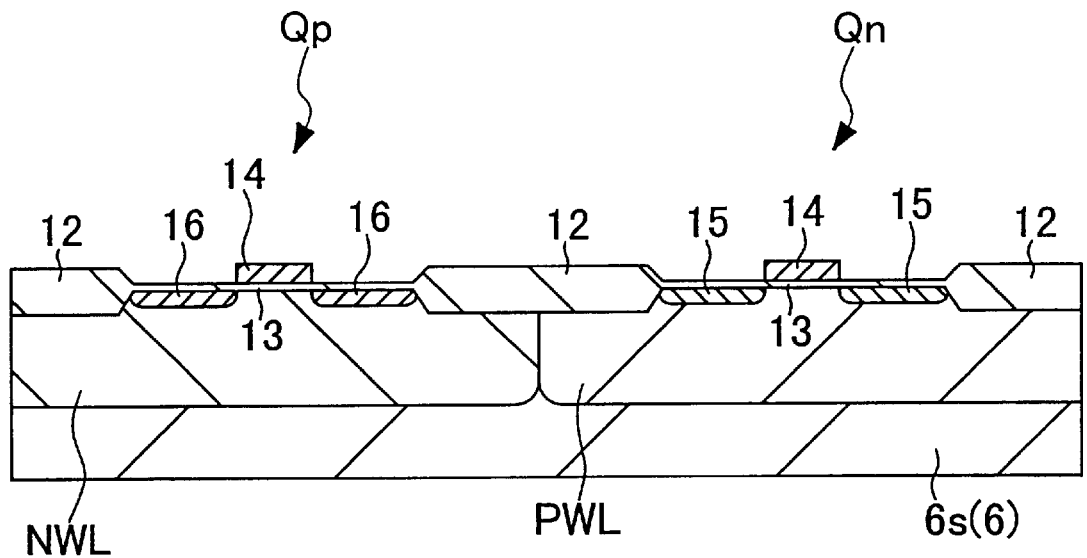
FIG. 45 is a sectional view of a main part in a step in manufacturing a semiconductor integrated circuit device using a photomask according to an embodiment of the present invention.

FIG. 45 is a sectional view of a main part of a wafer 6 in the steps in manufacturing the semiconductor integrated circuit device. The wafer 6 is constituted by a semiconductor thin plate having, e.g., a flat circular shape. A semiconductor substrate 6s constituting the wafer 6 comprises, e.g., an n⁻-type silicone (Si) monocrystal, and, for example, an n-type well NWL and a p-type well PWL are formed on the upper side of the semiconductor substrate 6s. For example, phosphorous or arsenic (As) are implanted in the n-type well NWL. For example, boron is implanted in the p-type well PWL.

On a major surface of the semiconductor substrate 6s, a field insulating film 12, constituted by, e.g., a silicon oxide film, for isolation is formed by a LOCOS (Local Oxidization of Silicon) method or the like. An isolation portion may be a trench. More specifically, an insulating film may be buried in a trench formed in the semiconductor substrate 6s in the direction of the thickness to form the isolation portion. In an activation region surrounded by the field insulating film 12, an pMIS Qn and a pMIS Qp are formed.

Gate insulating films 13 of the nMIS Qn and the pMIS Qp are constituted by, e.g., silicon oxide films and formed by a thermal oxidation method or the like. Gate electrodes 14 of the nMIS Qn and the pMIS Qp are formed such that, after a conductive film, made of, e.g., low-resistance polysilicon, for forming a gate is deposited on a major surface of the wafer 6 by a CVD method or the like, the film is patterned and processed by a photolithography technique and a normal etching technique using the mask. Although the gate length is not limited to a specific value, the gate length is, e.g., about 0.15 μm.

A semiconductor region 15 for forming a source or a drain of the nMIS Qn is formed to be self-aligned to the gate electrodes 14 such that, e.g., phosphorous or arsenic is implanted in the semiconductor substrate 6s by an ion injection method or the like by using the gate electrode 14 as a mask. In addition, a semiconductor region 16 for forming a source or a drain of the pMIS Qp is formed to be self-aligned to the gate electrodes 14 such that, e.g., boron is implanted in the semiconductor substrate 6s by an ion injection method or the like by using the gate electrode 14 as a mask.

The gate electrode 14 is not necessarily constituted by a single film made of low-resistance polysilicon, and can be variably changed. The gate electrode 14 may employ a so-called polyside structure in which a silicide layer made of a tungsten silicide or cobalt silicide is formed on, e.g., a low-resistance polysilicon layer or may employ a so-called poly-metal structure in which a metal film made of tungsten or the like is formed on, e.g., a low-resistance polysilicon film through a barrier conductive film made of titanium nitride or tungsten nitride.

Figure 46:
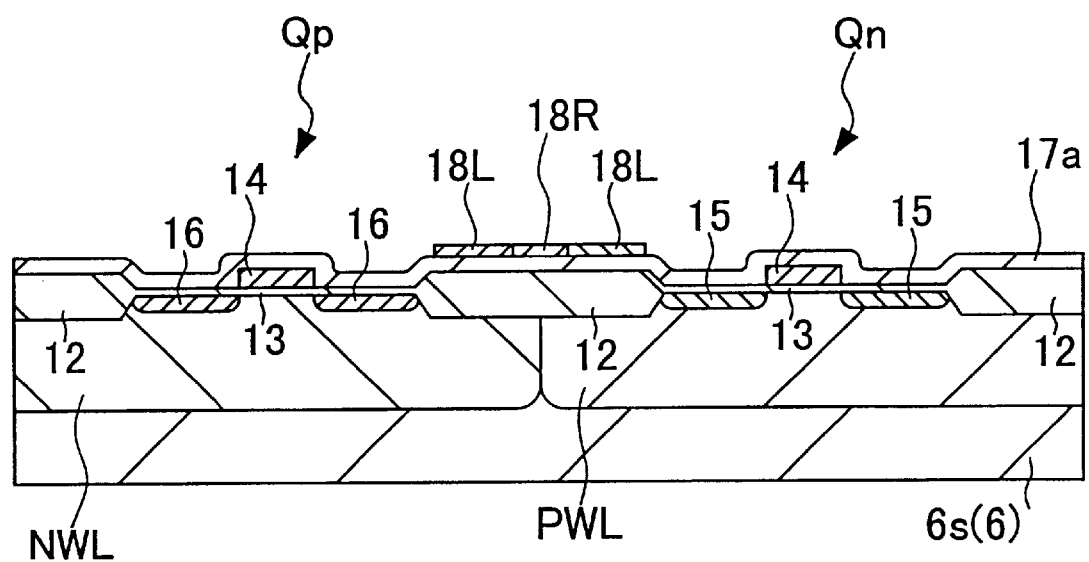
FIG. 46 is a sectional view of a main part in a step in manufacturing a semiconductor integrated circuit device subsequent to the step in FIG. 45.

On the semiconductor substrate 6s, as shown in FIG. 46, an insulating interlayer 17a constituted by, e.g., a silicon oxide film is deposited by a CVD method or the like, and a polysilicon film is deposited on the upper surface of the insulating interlayer 17a by a CVD method or the like. Subsequently, the polysilicon film is patterned by a photolithography technique and etching by using a mask, and an impurity is implanted in a predetermined region of the patterned polysilicon film, so that a wiring 18L and a resistor 18R constituted by a polysilicon film.

Figure 47:
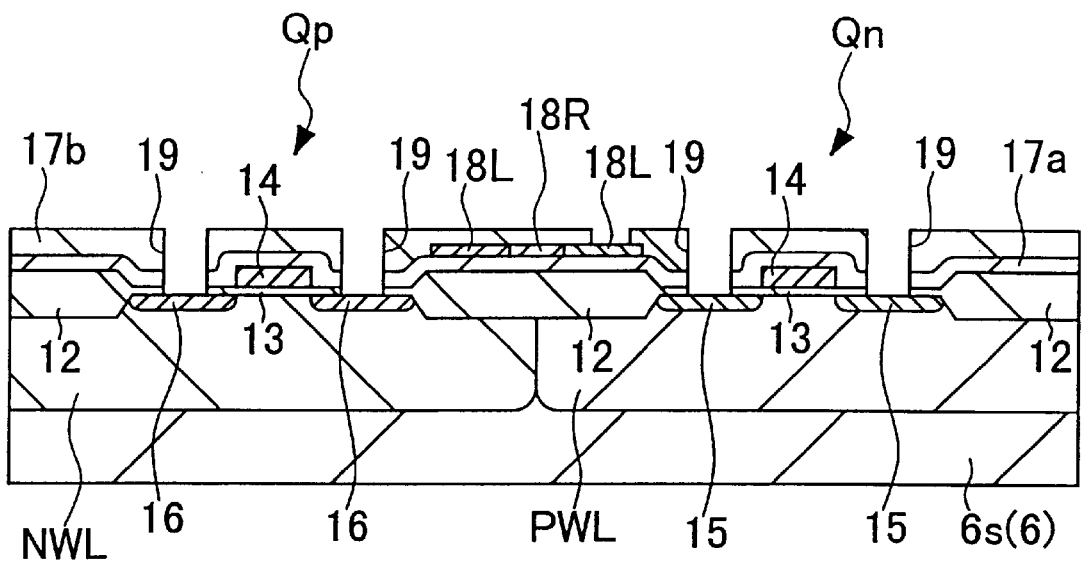
FIG. 47 is a sectional view of a main part in a step in manufacturing a semiconductor integrated circuit device subsequent to the step in FIG. 46.
Figure 48:
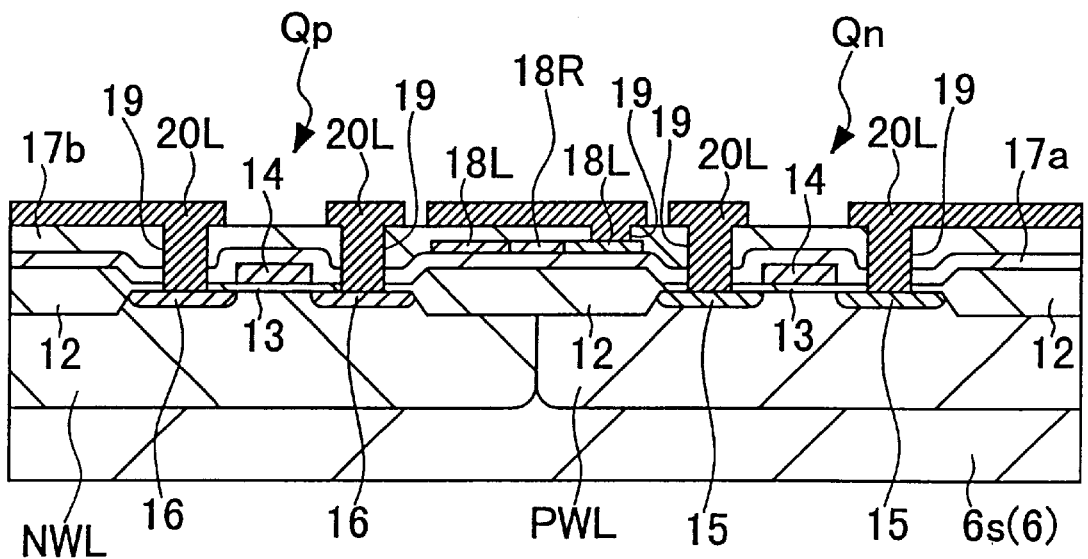
FIG. 48 is a sectional view of a main part in a step in manufacturing a semiconductor integrated circuit device subsequent to the step in FIG. 47.

Thereafter, as shown in FIG. 47, an HLD film 17b constituted by, e.g., a silicon oxide film is deposited on the semiconductor substrate 6s, a contact hole 19 for partially exposing semiconductor regions 15 and 16 and the wiring 18L is formed in the insulating interlayer 17a and the HLD film 17b by a photolithography technique and etching using the mask. In addition, metal films made of, e.g., titanium (Ti), titanium nitride (TiN), and tungsten (W) are sequentially deposited on the semiconductor substrate 6s by a sputtering method, a CVD method, and the like, and a resist pattern is formed on the metal films by photolithography using the mask. The resist pattern is etched to form a first wiring layer 20L as shown in FIG. 48. Thereafter, a second wiring layer and the subsequent wiring layers are formed like the first wiring layer 20L to manufacture a semiconductor integrated circuit device.

For example, in a custom LSI product, in particular, mask debug (including correction or change of a mask) is frequently performed about the first wiring layer. In the mask debug, the mask is wasted by only slightly performing wafer exposure, and the number of masks required to manufacture one product. For this reason, the spirit and scope of the present invention are applied to the step, the great effect of reducing the cost can be achieved.

Ninth Embodiment

Figure 49:
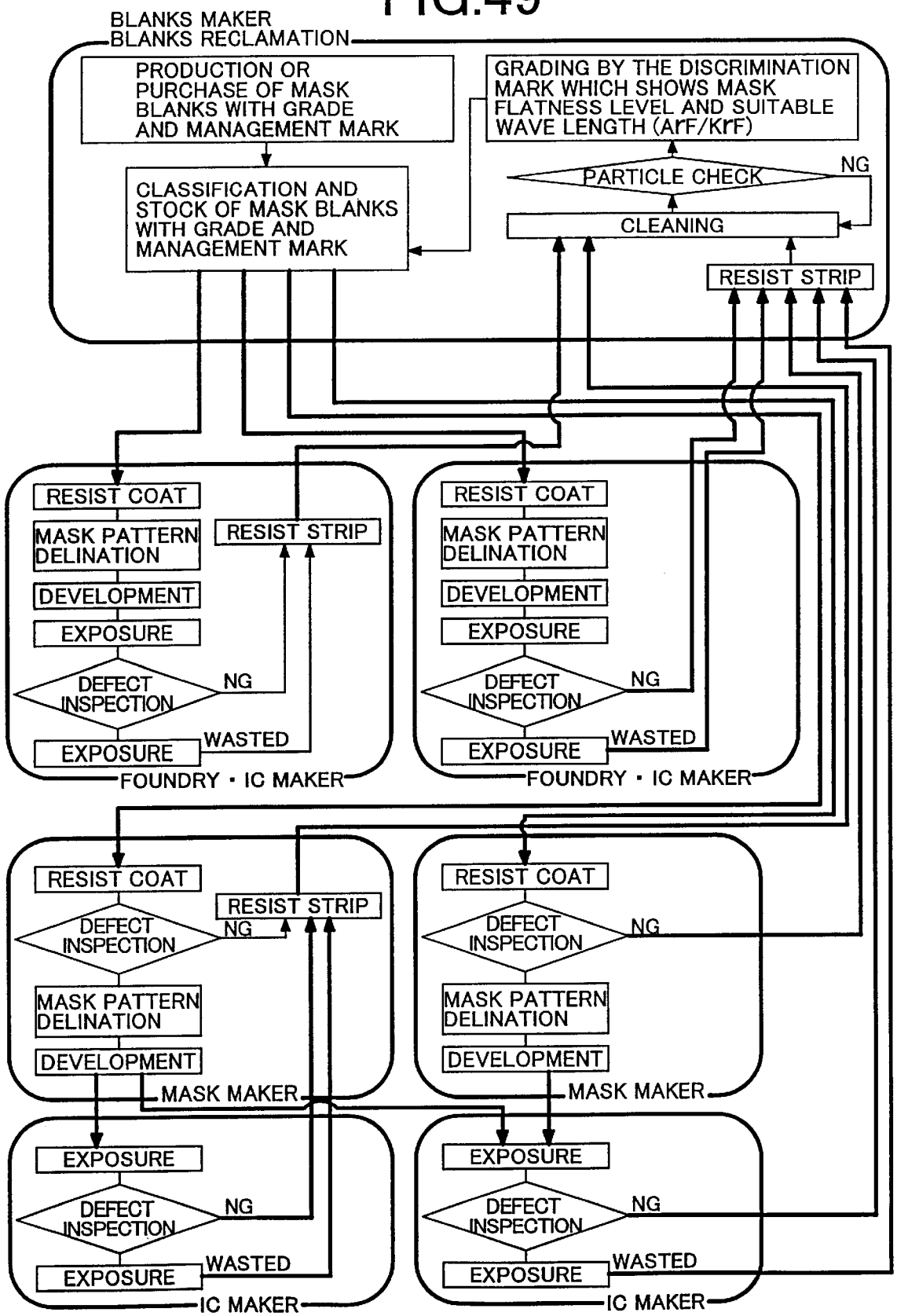
FIG. 49 is a flow chart for explaining manufacturing a photomask and a reusing route according to another embodiment of the present invention.

This invention relates to a flow of a mask between companies and a method of determining a fee. FIG. 49 shows an example of an outline of the flow of a mask according to this embodiment. The embodiment will be described below with reference to FIG. 49. As blanks used in the embodiment, the blanks shown in FIGS. 8A and 8B, FIGS. 9A and 9B, FIGS. 10A and 10B, and FIGS. 21A and 21B. A shade pattern and a shade film are abbreviated as shade portions.

Company A (blanks supplier) is a company for supplying blanks, and is a blanks maker or a blanks reclamation. Company A supplies blanks having quality according to a request of a user to a the user, and recovers blanks to be reclaimed. Company B and company C (mask user) are IC foundries or IC chip makers having mask shops in their factories. Company D and company E (mask user) are mask makers, and company F and company G (mask user) are IC chip makers which do not have mask shops in their factories. However, the flow of a mask is essential, and the respective companies are only examples. For example, the number of companies is not regulated to the number. The number of IC companies may be increased by adding company H and company I. Company F and company G may be IC foundries. Although a product used in this embodiment is expressed as an IC (Integrated Circuit), the IC is an example which represents not only a semiconductor IC using silicon or gallium arsenide (GaAs) as a substrate, but also various products such as a TFT panel and a liquid crystal panel.

Company A acquires blanks having a mark indicating a grade such as the degree of flatness and a management number which are formed by the method described in the seventh embodiment or produces the blanks in the company to store and manage the blanks. In this case, if a user has a request, the management number may be omitted. In order to immediately respond to immediate delivery required by the user, the blanks are preferably classified by grades to be stocked and managed.

A user (companies B to E in this case) orders company A to ship blanks. The blanks delivered to company B are subject to resist coating, mask delineation, development, wafer exposure, and defect inspection by the methods described in the first and second embodiments. When the mask does not pass the defect inspection, the shade portion constituted by the resist film on the mask is stripped in company B, and the mask is recovered by company A. When the blanks pass the defect inspection, the mask is used in wafer exposure. When the mask is wasted, the shade portion constituted by the resist film on the mask is stripped. When the shade portion constituted by the resist film on the mask is stripped in the company, secret items such as pattern data may not leak out of the company. In the foundry, since customer information must not leak, it is important that the customer information is prevented from leaking.

Also in company C, although a mask is produced in the same steps described above and used, a mask which does not pass defect inspection and a mask which is wasted in wafer exposure are recovered by company A without stripping the shade portions of the resist film from the masks.

Blanks delivered to company D are subjected to coating of a resist film, defect inspection, mask delineation, and development, and are shipped to the IC maker of company F or company G as a mask. When the blanks do not pass defect inspection, the shade portion constituted by the resist film is stripped, and the blanks are delivered to company A. Company F performs wafer exposure by using the mask, and defect inspection of the pattern on the wafer to decide the presence/absence of a mast defect. When the blanks pass the defect inspection, the blanks are used in wafer exposure. When the blanks do not pass defect inspection, and when the blanks are wasted, the blanks are returned to company D. In company D, the shade portion constituted by the resist film is stripped, the blanks are sent to company A. Also in company G, as in company F, wafer exposure is performed by using the mask, and the pattern on the wafer is subjected to defect inspection to decide the presence/absence of a mask defect. In company G, however, unlike in company F, when the blanks do not pass defect inspection and are wasted, the blanks are returned to company A.

On the mask which is returned to company A, when a shade portion constituted by a resist film is adhered, the resist film is stripped first, and cleaning is performed. When the resist film has been stripped, cleaning is performed. Thereafter, particle check is performed. The passing criterion of particle check is that the number of particles each having a reference size or larger is a reference number or larger. In this case, the particles include not only an adhesive particle and a nick defect such as a scratch. When a particle is left, cleaning and particle check are performed again. A mask which does not pass the particle check even though the mask is subjected to cleaning times the number of which is equal to or larger than a reference number is casted away. Masks which pass the particle check are classified by grades such as the degrees of flatness and suitable wavelengths on the basis of grade marks and management numbers. A transmittance to light of a suitable wavelength is measured as needed. The mask blanks are classified by the grades and stocked. According to a request of a user, blanks of a grade corresponding to the request are shipped as reclaimed blanks. The classification means that the blanks are classified into groups and managed. The blanks are not always stocked at one position. A request for blanks, a request to reclaim a mask, or the like can be performed such that a person in each company or each section accesses a homepage prepared by company A or the like or a communication area through a communication line such as an Internet line or a lease line. As a matter of course, the request can also be performed by a telephone line, another communication means, or the like. In this manner, manufacturing masks and circulation of reclamation can be efficiently performed. Company A can widely and immediately supply information related to reclamation of blanks and masks. The above example describes the case in which test exposure is performed in defect inspection of a resist mask. However, the defect inspection of the resist mask, as in the first embodiment, is not limited to defect inspection using test exposure. A method of inspecting a defect of a mask without performing exposure may also be employed.

In the above flow of a mask, a fee for the transaction between company A and company B is defined as follows, for example.

Company B changes the prices of the blanks which are delivered to company A depending on the number of blanks which are shipped from company A to company B, or the prices of blanks to be shipped are changed according to a ratio of the number of blanks delivered to company A by company B to the number of blanks shipped from company A to company B, i.e., a recovery. In addition, company A changes the price of recovery blanks according to the grade of the degree of flatness and a suitable wavelength. In this manner, the recovery of the blanks increases. Therefore, since a recycling rate also increases, the cost of the blanks decreases. This effect is specially great in blanks having a high grade. Company A can obtain profits through a blanks reclamation business and a blanks management business. Company B can advantageously reduce costs by utilizing wasted blanks. This relationship is similarly satisfied between company A and company C and between company A and company D. In addition, since this recycle system advances saving of resources, the invention is effective in social environment.

Company A also receives blanks having a grade display from a company such as company G to which company A does not directly ship blanks at prices depending on the grade (degree of flatness and suitable wavelength). Company A can easily obtain profits because the procurement cost is reasonable. In addition, company A receives blanks having a management number of company A at a price which is higher than the price of blanks having a management number of another company for the following reasons. That is, blanks which are not own must be subjected to the step of adding a serial number or the like to increase the cost. In addition, a company prevents blanks of the company from being delivered to another blanks reclamation to prevent a recovery from decreasing. When the recovery decreases, a rate of new blanks becomes high, and company A must pay high costs.

According to this embodiment, manufacturing of masks, reclamation of the masks, and manufacturing of products using the masks can be efficiently associated with each other. Resources can be effectively utilized. Therefore, improvement in economy and industry can be advanced.

The invention made by the present inventor has been described above on the basis of the embodiments. The present invention is not limited to the embodiments described above, and various changes and modifications of the invention can be effected without departing from the spirit and scope of the invention.

For example, in the ninth embodiment, company A can supply blanks on which a resist film for forming a shade portion is coated to respective companies. In this case, each of the companies may manufacture or reclaim a mask from the step subsequent to the step of coating a resist film.

In the ninth embodiment, after company F or company G removes a shade pattern constituted by a resist film from a mask, the company may return the resultant blanks to company D or company A.

In the above description, the invention made by the present inventor is applied to a method of manufacturing a semiconductor integrated circuit device having a CMIS circuit in an application field serving as the background of the invention. The present invention is not only the semiconductor integrated circuit device, but also a semiconductor integrated circuit device having a memory circuit such as a DRAM (Dynamic Random Access Memory), an SRAM (Static Random Access Memory), or a flush memory (EEPROM: Electric Erasable Programmable Read Only Memory), a semiconductor integrated circuit device having a logical circuit such as a microprocessor, and an embedded semiconductor integrated circuit device in which the memory circuit and the logical circuit are formed on the same semiconductor substrate. In addition, the present invention can effectively applied to a photolithography technique used in manufacturing, e.g., a semiconductor device, a super-conductive device, a micromachine, a magnetic head, an electronic device, a liquid crystal panel, and the like.

Effects obtained by a typical invention disclosed by the present application will be described below.

(1). According to the present invention, after a shade pattern constituted by a resist film formed on a mask is stripped, and a new shade pattern constituted by a resist film is formed on the mask to reclaim the mask, so that the mask can be reused.

(2). According to the item (1), the cost of a mask can be reduced.

(3). According to the item (1), the present invention is effective in saving of resources and a countermeasure against destruction of the environment.

What is claimed is:

1. A method of manufacturing photomask blanks comprising the steps of:

(a) patterning and forming a first shade portion comprised of a resist film with an integrated circuit pattern on a mask substrate to manufacture a photomask;
   wherein said photomask is subject to defect inspection;

(b) performing an exposure process on said photomask that passed said defect inspection to transfer a desired pattern onto a substrate to be processed, and (c) stripping the first shade portion comprised of the resist film with an integrated circuit pattern on the photomask to reclaim photomask blanks comprised of the mask substrate.

2. A method of manufacturing photomask blanks according to claim 1, further comprising the step of:

forming a mask information pattern on the mask substrate.

3. A method of manufacturing photomask blanks according to claim 2, wherein the mask information pattern is formed by one or both of a trench formed in the mask substrate and a shade pattern comprised of a metal formed on the mask substrate.

4. A method of manufacturing a photomask comprising the steps of:

(a) preparing a mask substrate having a shade portion comprised of a metal in a peripheral region around an integrating circuit pattern region;

(b) patterning and forming a first shade portion comprised of a resist film with an integrated circuit pattern in the integrating circuit pattern region to manufacture a photomask on a mask substrate having the shade portion comprised of the metal;
   wherein said photomask is subject to defect inspection;

(c) performing an exposure process on said photomask that passed said defect inspection to transfer a desired pattern onto a substrate to be processed, and (d) stripping the first shade portion comprised of the resist film with an integrated circuit pattern on the photomask to remanufacture photomask blanks comprised of the mask substrate having the metal shade portion.

5. A method of manufacturing photomask blanks according to claim 4, wherein in the previous step of stripping the first shade portion comprised of the resist film with an integrated circuit pattern, a protective film is formed on the shade portion comprised of the metal.

6. A method of manufacturing photomask blanks according to claim 4, wherein the shade film comprised of the metal comprises a refractory metal, a nitride of a refractory metal, a silicide of a refractory metal, or a laminate film comprising thereof.

7. A method of manufacturing photomask blanks according to claim 4, further comprising the step of:

forming a mask information pattern on the mask substrate.

8. A method of manufacturing photomask blanks according to claim 7, wherein the mask information pattern is formed by one or both of a trench formed in the mask substrate and a light-transmitting pattern formed by partially removing the second shade portion comprised of the metal.

* * * * *